(12) United States Patent
Donofrio et al.

(10) Patent No.: US 9,673,363 B2
(45) Date of Patent: Jun. 6, 2017

(54) REFLECTIVE MOUNTING SUBSTRATES FOR FLIP-CHIP MOUNTED HORIZONTAL LEDS

(75) Inventors: Matthew Donofrio, Raleigh, NC (US); John Adam Edmond, Durham, NC (US); Peter Scott Andrews, Durham, NC (US); David Der Chi Chang, Raleigh, NC (US)

(73) Assignee: Cree, Inc., Durham, NC (US)

( * ) Notice: Subject to any disclaimer, the term of this patent is extended or adjusted under 35 U.S.C. 154(b) by 1418 days.

(21) Appl. No.: 13/178,791

(22) Filed: Jul. 8, 2011

(65) Prior Publication Data

US 2012/0193662 A1 Aug. 2, 2012

Related U.S. Application Data

(63) Continuation-in-part of application No. 13/112,502, filed on May 20, 2011, which is a continuation-in-part
(Continued)

(51) Int. Cl.
*H01L 33/50* (2010.01)
*H01L 33/60* (2010.01)
(Continued)

(52) U.S. Cl.
CPC .......... *H01L 33/60* (2013.01); *H01L 25/0753* (2013.01); *H01L 33/20* (2013.01);
(Continued)

(58) Field of Classification Search
CPC ..... H01L 33/60; H01L 25/0753; H01L 33/20; H01L 33/486
(Continued)

(56) References Cited

U.S. PATENT DOCUMENTS

| 4,916,464 A | 4/1990 | Ito et al. |
| 4,918,497 A | 4/1990 | Edmond |

(Continued)

FOREIGN PATENT DOCUMENTS

| CN | 101449396 A | 6/2009 |
| DE | 10 2007 029 369 A1 | 1/2009 |

(Continued)

OTHER PUBLICATIONS

International Search Report and Written Opinion of the International Searching Authority, International Application No. PCT/US2012/037209, Aug. 6, 2012.
(Continued)

*Primary Examiner* — Ori Nadav
(74) *Attorney, Agent, or Firm* — Myers Bigel, P.A.

(57) ABSTRACT

A light emitting device includes a mounting substrate having a reflective layer that defines spaced apart anode and cathode pads, and a gap between them. A light emitting diode die is flip-chip mounted on the mounting substrate, such that the anode contact of the LED die is bonded to the anode pad and the cathode contact of the LED die is bonded to the cathode pad. A lens extends from the mounting substrate to surround the LED die. The reflective layer extends on the mounting substrate to cover substantially all of the mounting substrate that lies beneath the lens, excluding the gap, and may also extend beyond the lens.

23 Claims, 30 Drawing Sheets

Related U.S. Application Data of application No. 13/027,006, filed on Feb. 14, 2011, which is a continuation-in-part of application No. 13/018,013, filed on Jan. 31, 2011.

(51) Int. Cl.

| | |
|---|---|
| H01L 25/075 | (2006.01) |
| H01L 33/20 | (2010.01) |
| H01L 33/48 | (2010.01) |
| H01L 33/62 | (2010.01) |

(52) U.S. Cl.
CPC .......... *H01L 33/486* (2013.01); *H01L 33/505* (2013.01); *H01L 33/62* (2013.01); *H01L 2224/16* (2013.01)

(58) Field of Classification Search
USPC ....................................... 257/79–81, 98–100
See application file for complete search history.

(56) References Cited

U.S. PATENT DOCUMENTS

| | | | |
|---|---|---|---|
| 4,966,862 A | 10/1990 | Edmond | |
| 5,027,168 A | 6/1991 | Edmond | |
| 5,210,051 A | 5/1993 | Carter, Jr. | |
| 5,309,001 A | 5/1994 | Watanabe et al. | |
| 5,337,179 A | 8/1994 | Hodges | |
| 5,338,944 A | 8/1994 | Edmond et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,696,389 A | 12/1997 | Ishikawa et al. | |
| 5,739,554 A | 4/1998 | Edmond et al. | |
| 5,912,477 A | 6/1999 | Negley | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,614,056 B1 | 9/2003 | Tarsa et al. | |
| 6,791,119 B2 | 9/2004 | Slater, Jr. et al. | |
| 6,853,010 B2 | 2/2005 | Slater, Jr. et al. | |
| 7,081,667 B2 | 7/2006 | Du | |
| 7,141,825 B2 | 11/2006 | Horio et al. | |
| 7,262,467 B2 | 8/2007 | Kelberlau | |
| 7,285,801 B2 | 10/2007 | Eliashevich et al. | |
| 7,326,583 B2 | 2/2008 | Andrews et al. | |
| 7,442,564 B2 | 10/2008 | Andrews | |
| 7,476,337 B2 | 1/2009 | Sakane et al. | |
| 7,521,728 B2 | 4/2009 | Andrews | |
| 7,646,035 B2 | 1/2010 | Loh et al. | |
| 7,652,298 B2 | 1/2010 | Chen et al. | |
| D615,504 S | 5/2010 | Keller et al. | |
| 7,709,853 B2 | 5/2010 | Medendorp, Jr. | |
| 7,737,634 B2 | 6/2010 | Leng et al. | |
| 7,763,478 B2 | 7/2010 | Loh et al. | |
| 7,800,125 B2 | 9/2010 | Chen | |
| 7,850,887 B2 | 12/2010 | Loh et al. | |
| 7,854,365 B2 | 12/2010 | Li et al. | |
| 8,008,850 B2 | 8/2011 | Su et al. | |
| 8,067,783 B2 | 11/2011 | Wirth | |
| 8,115,217 B2 | 2/2012 | Duong et al. | |
| 2002/0043926 A1 | 4/2002 | Takahashi et al. | |
| 2002/0123164 A1 | 9/2002 | Slater et al. | |
| 2003/0006418 A1 | 1/2003 | Emerson et al. | |
| 2003/0089918 A1 | 5/2003 | Hiller et al. | |
| 2004/0056260 A1 | 3/2004 | Slater et al. | |
| 2005/0127485 A1 | 6/2005 | Shei et al. | |
| 2005/0179375 A1 | 8/2005 | Kim et al. | |
| 2005/0211989 A1 | 9/2005 | Horio et al. | |
| 2006/0113555 A1 | 6/2006 | Yang | |
| 2006/0124953 A1 | 6/2006 | Negley et al. | |
| 2006/0163589 A1 | 7/2006 | Fan et al. | |
| 2006/0192223 A1 | 8/2006 | Lee et al. | |
| 2006/0208271 A1 | 9/2006 | Kim et al. | |
| 2006/0255353 A1 | 11/2006 | Taskar et al. | |
| 2007/0200128 A1 | 8/2007 | Yano | |
| 2007/0269925 A1 | 11/2007 | Shchekin et al. | |
| 2008/0089053 A1 | 4/2008 | Negley | |
| 2008/0191225 A1 | 8/2008 | Medendorp | |
| 2008/0217635 A1 | 9/2008 | Emerson et al. | |
| 2008/0315214 A1 | 12/2008 | Wall, Jr. et al. | |
| 2009/0050908 A1 | 2/2009 | Yuan et al. | |
| 2009/0108281 A1 | 4/2009 | Keller et al. | |
| 2009/0140633 A1 | 6/2009 | Tanimoto et al. | |
| 2009/0145647 A1 | 6/2009 | Tanaka et al. | |
| 2009/0161420 A1 | 6/2009 | Shepard | |
| 2009/0166653 A1* | 7/2009 | Weaver et al. | 257/98 |
| 2009/0243467 A1 | 10/2009 | Shimizu et al. | |
| 2009/0283787 A1 | 11/2009 | Donofrio et al. | |
| 2009/0283789 A1 | 11/2009 | Kim et al. | |
| 2009/0315061 A1 | 12/2009 | Andrews | |
| 2010/0109030 A1 | 5/2010 | Krames et al. | |
| 2010/0140648 A1 | 6/2010 | Harada et al. | |
| 2010/0155763 A1 | 6/2010 | Donofrio et al. | |
| 2010/0230693 A1 | 9/2010 | Tran | |
| 2010/0308354 A1 | 12/2010 | David et al. | |
| 2011/0006334 A1 | 1/2011 | Ishii et al. | |
| 2011/0018013 A1 | 1/2011 | Margalith et al. | |
| 2011/0114989 A1 | 5/2011 | Suehiro et al. | |

FOREIGN PATENT DOCUMENTS

| | | |
|---|---|---|
| EP | 2 151 873 A2 | 2/2010 |
| JP | 2010-114144 A | 5/2010 |

OTHER PUBLICATIONS

Chen K. et al., "Integration of Phosphor Printing and Encapsulant Dispensing Processes for Wafer Level LED Array Packaging", 2010, *11th International Conference on Electronic Packaging Technology & High Density Packaging*, pp. 1386-1392.

International Search Report Corresponding to International Application No. PCT/US12/24580; Date of Mailing: Jun. 22, 2012; 14 Pages.

International Search Report and Written Opinion of the International Searching Authority, Application No. PCT/US2012/021631, May 17, 2012.

"AuSn Die Attach", Application Note: Appnote-002 Rev. B, 3 pages, retrieved from the internet Jun. 25, 2014. http://www.cree.com/sitecore%20modules/web/~/media/Files/Cree/RF/Application%20Notes/Appnote%202%20AuSn.pdf.

"Cree XLamp® XP-E High Efficiency White LEDs", Product Family Data Sheet, CLD-DS34 Rev 4B, 13 pages, retrieved from the internet Jun. 25, 2014. http://www.cree.com/sitecore%20modules/web/~/media/Files/Cree/LED%20Components%20and%20Modules/XLamp/Date/%20and%20Binning/XLampXPEHEW.pdf.

"Cree XLamp® XP-E LEDs", Product Family Data Sheet, CLD-DS18 Rev 19, 19 pages, retrieved from the internet Jun. 25, 2014. http://www.cree.com/sitecore%20modules/web/~/media/Files/Cree/LED%20Components%20and%20Modules/XLamp/Data%20and%20Binning/XLampXPE.pdf.

"XBright® & XThin® Au/Sn Die Attachment Recommendations", Application Note: CPR3An01, Rev. B, 3 pages, retrieved from the internet Jun. 25, 2014. http://www.cree.com/sitecore%20modules/web/~/media/Files/Cree/Chips%20and%20Material/Application%20Notes%20Chips/CPR3AN01.pdf.

"XThin™ Sn Die Attachment Recommendations", CREE Optoelectronics, Application Note: CPR3-AN02, 5 pages, retrieved from the internet Jun. 25, 2014. http://www.cree.com/sitecore%20modules/web/~/media/Files/Cree/Chips%20and%20Material/Application%20Notes%20Chips/CPR3AN02.pdf.

Communication with Supplementary European Search Report, EPO Application No. 12742154.3, Sep. 9, 2015.

Rasiah, Dr. Ignatius J., "Selecting an underfill for flip chip packaging", *Electronics Engineer*, May 1999, 4 pages.

(56) References Cited

OTHER PUBLICATIONS

Stockham, Norman, "Die attachment" *TWI Knowledge Summary*, retrieved from the Internet Jun. 29, 2011, 4 pages http://www.twi.co.uk/content/ksnrs001.html.
U.S. Appl. No. 13/017,845; Applicant: Matthew Donofrio et al., Title: Conformally Coated Light Emitting Devices and Methods for Providing the Same; filed Jan. 31, 2011, 61 pages.
U.S. Appl. No. 13/018,013; Applicant: Matthew Donofrio et al., Title: Horizontal Light Emitting Diodes Including Phosphor Particles; filed Jan. 31, 2011, 45 pages.
Chinese Office Action and Search Report Corresponding to Chinese Application No. 201280030330.4; Date of Issuance: Nov. 30, 2015; Foreign Text, 9 Pages, English Translation Thereof, 7 Pages.

\* cited by examiner

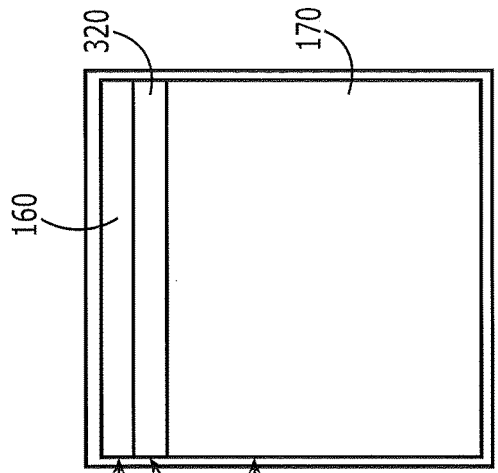
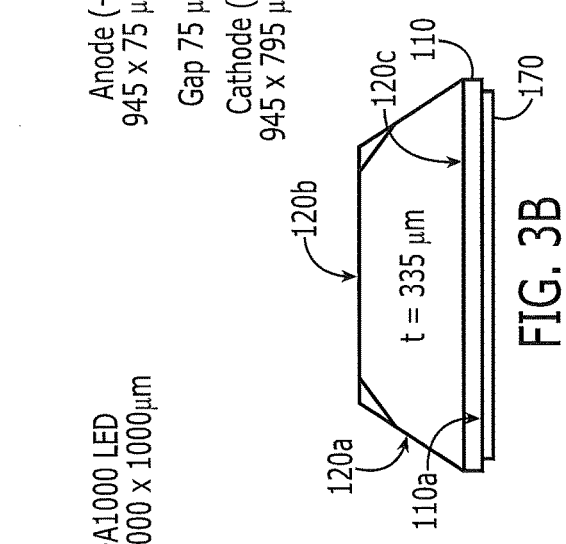
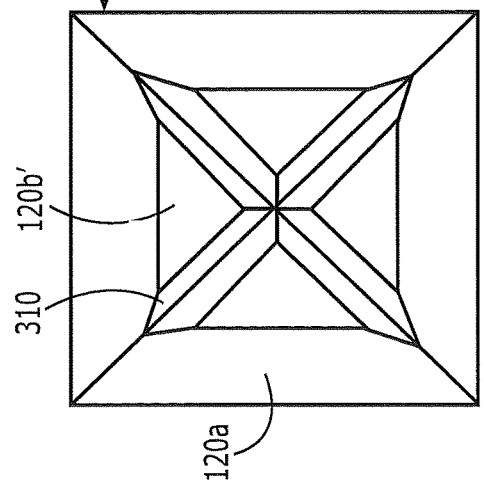
FIG. 3C
FIG. 3B
FIG. 3A

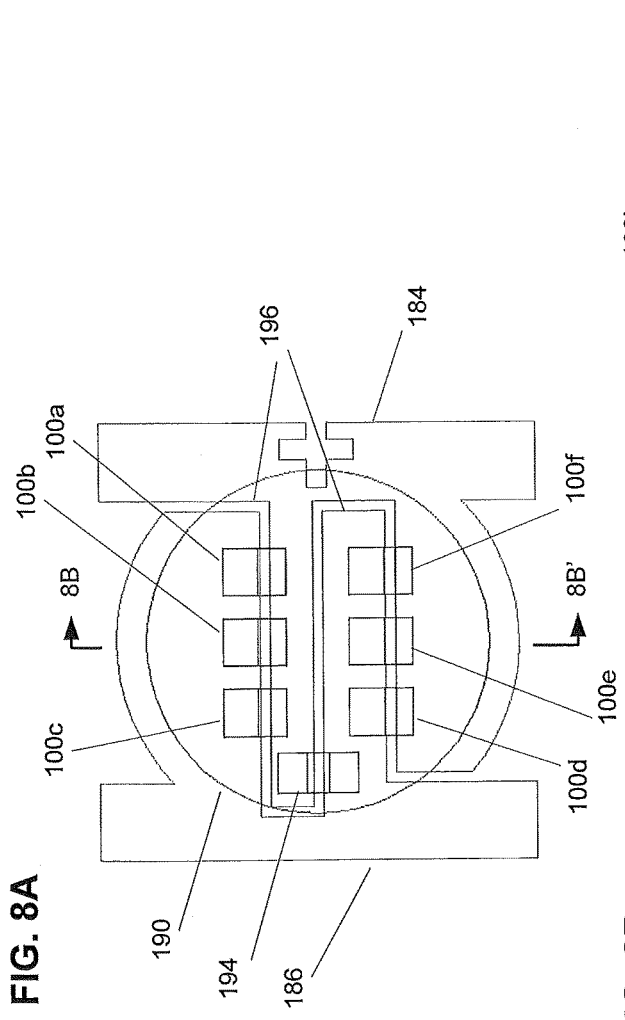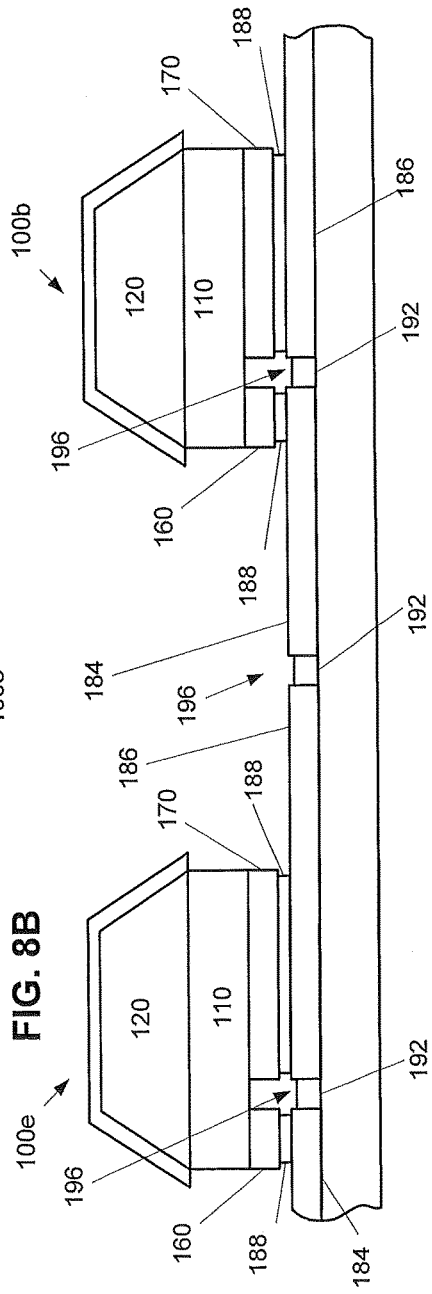

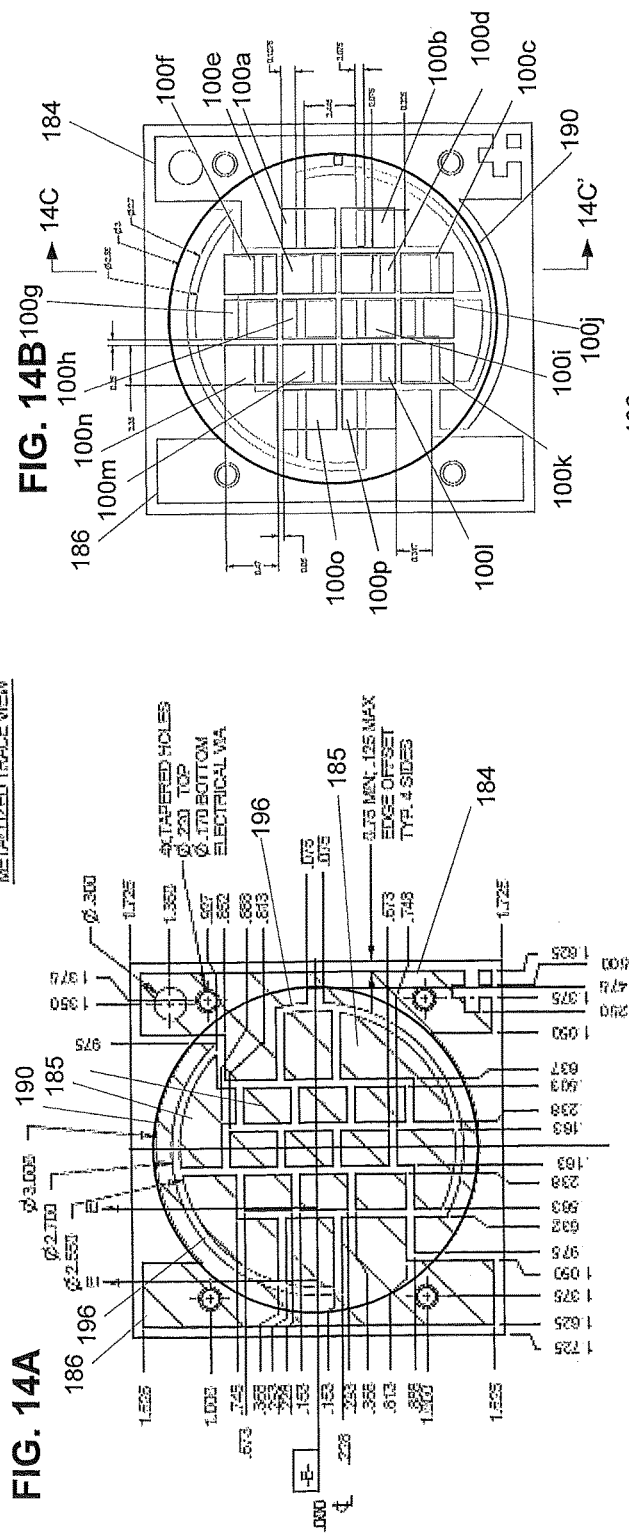
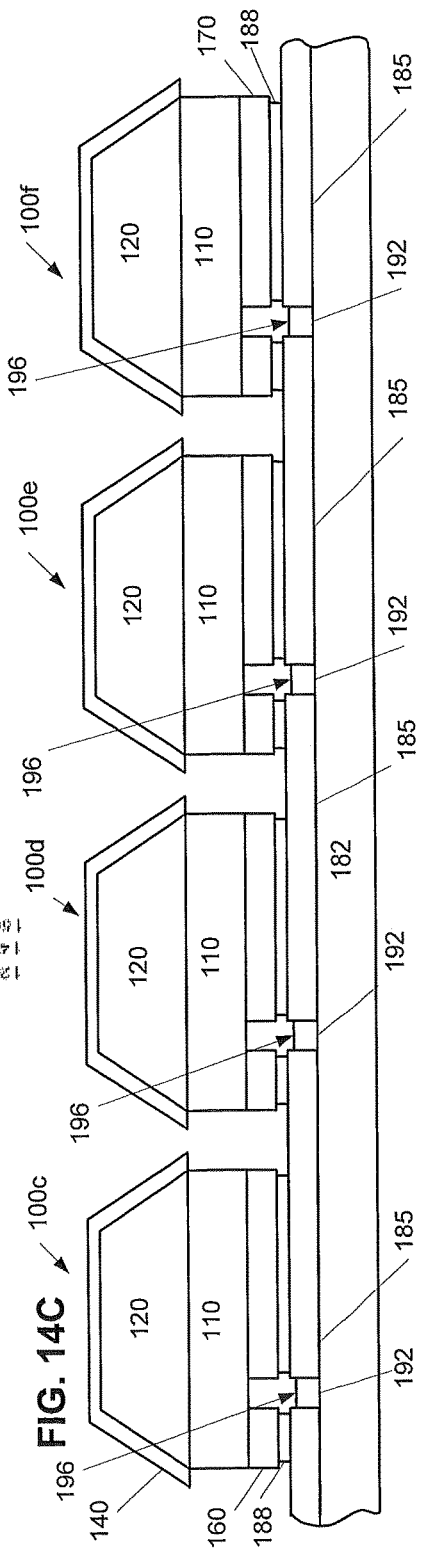
FIG. 14A
FIG. 14B
FIG. 14C

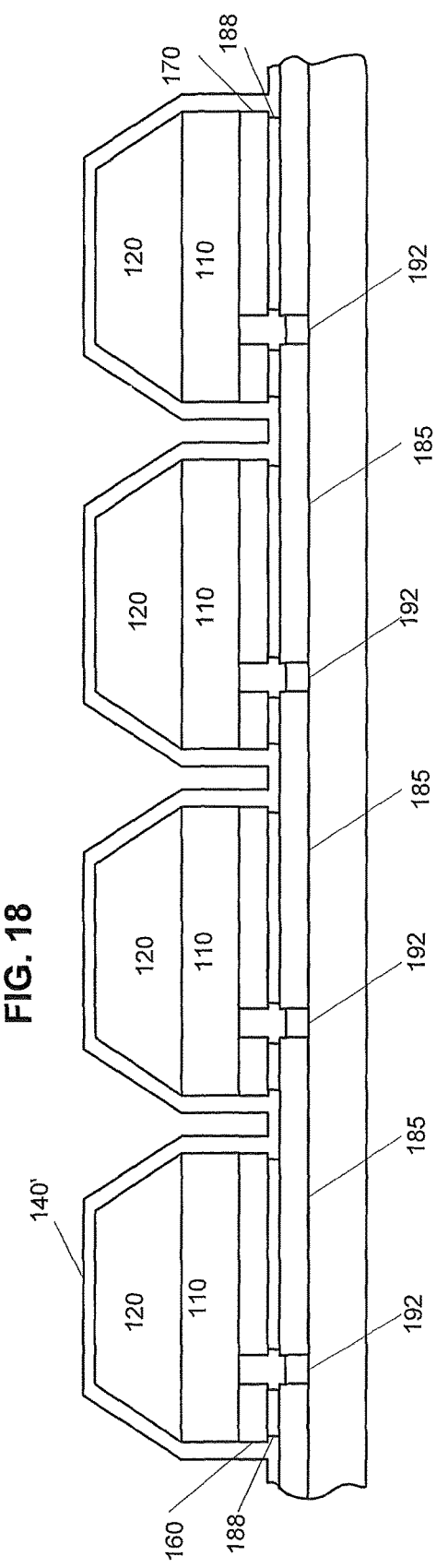

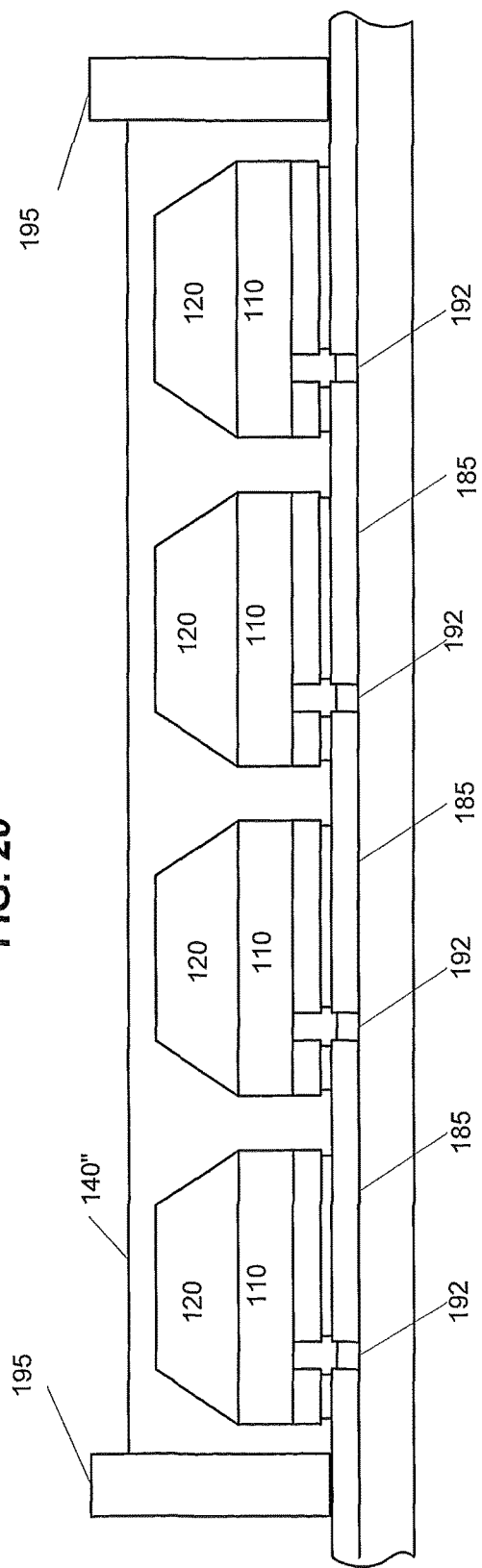

PANEL DESIGN   537 mW@454 nm   133 lm @ 6500K   104 lm @ 3080K

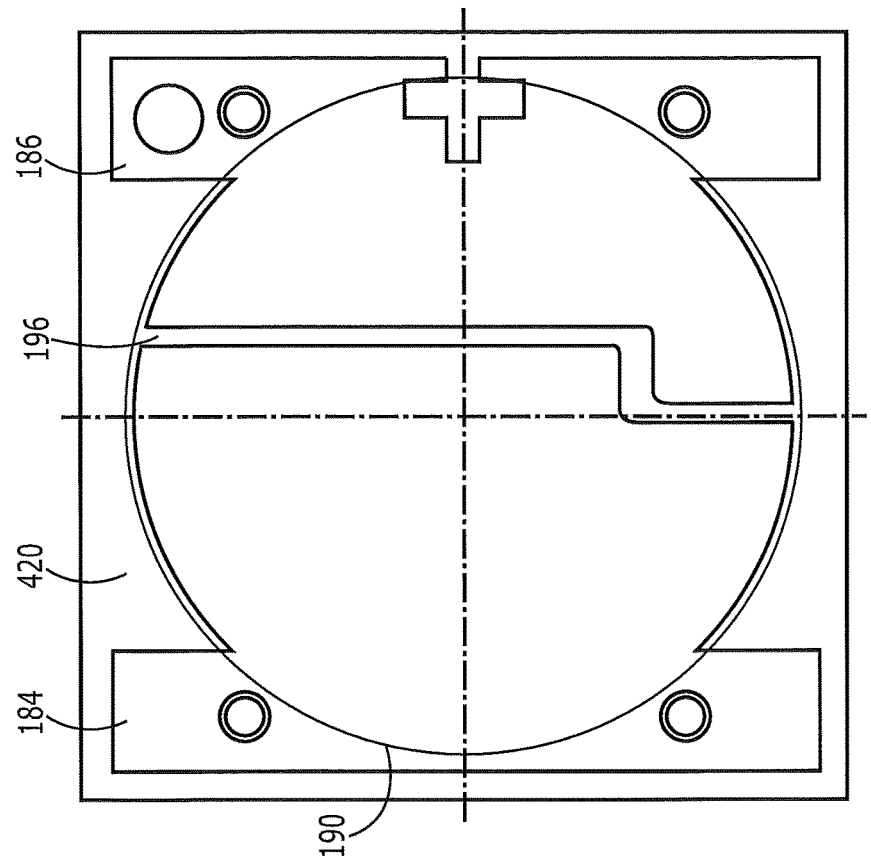

Total Package Area Comparison 3.45mm×3.45mm:
Reflective Electrode area = 9.07mm2
Total Package Area = 11.90mm2
Ratio: ~76% area is reflective.

Area Under 3.06mm Lens Comparison:
Reflective Electrode Area = 6.939mm2
Lens Area = 7.354mm2
Ratio: ~94% area is reflective.

Area outside chip 1mm chip with 3.06mm Lens Comparison:
Reflective Electrode Area = 6.0135mm2
Lens Area -1mm2 = 6.354mm2
Ratio: ~94.6% area around the chip is reflective.

FIG. 28

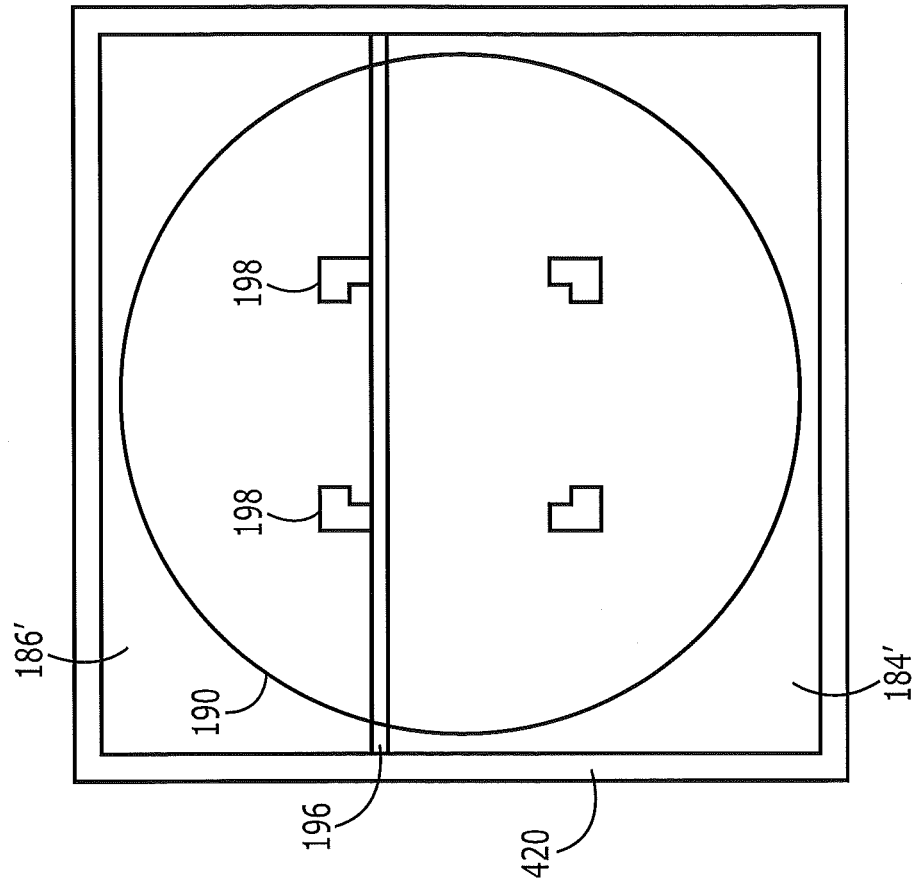

Total Package Area Comparison 3.5mmx3.5mm:
Reflective Electrode area = 10.643mm2
Total Package Area = 12.25mm2
Ratio: ~86% area is reflective.

Area Under 3.06mm Lens Comparison:
Reflective Electrode Area = 7.1267mm2
Lens Area = 7.354mm2
Ratio: ~97% area is reflective.

Area outside chip 1mm chip with 3.06mm Lens Comparison:
Reflective Electrode Area = 6.206mm2
Lens Area -1mm2 = 6.354mm2
Ratio: ~97% area around the chip is reflective.

FIG. 29

REFLECTIVE MOUNTING SUBSTRATES FOR FLIP-CHIP MOUNTED HORIZONTAL LEDS

RELATED APPLICATIONS

The present application claims the benefit of priority as a continuation-in-part (CIP) of U.S. application Ser. No. 13/112,502, filed May 20, 2011, and entitled "Gap Engineering for Flip-Chip Mounted Horizontal LEDs", which itself is a CIP of U.S. application Ser. No. 13/027,006, filed Feb. 14, 2011, and entitled "Light Emitting Diode (LED) Arrays Including Direct Die Attach and Related Assemblies", which itself is a CIP of U.S. application Ser. No. 13/018,013, filed Jan. 31, 2011, and entitled "Horizontal Light Emitting Diodes Including Phosphor Particles", the disclosures of all of which are hereby incorporated herein in their entirety by reference.

BACKGROUND

This invention relates to semiconductor light emitting devices and assemblies and methods of manufacturing the same, and more particularly, to semiconductor Light Emitting Diodes (LEDs) and assemblies thereof.

Semiconductor LEDs are widely known solid-state lighting elements that are capable of generating light upon application of voltage thereto. LEDs generally include a diode region having first and second opposing faces, and including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with a goal being to provide a replacement for the ubiquitous incandescent light bulb.

SUMMARY

Light emitting devices according to various embodiments described herein include a mounting substrate having a reflective layer thereon that defines spaced apart anode and cathode pads and a gap therebetween. A light emitting diode die, including spaced apart anode and cathode contacts that extend along a face thereof, is flip-chip mounted on the mounting substrate, such that the anode contact is adjacent and conductively bonded to the anode pad and the cathode contact is adjacent and conductively bonded to the cathode pad. A lens extends from the mounting substrate to surround the light emitting diode die. The reflective layer extends on the mounting substrate to cover substantially all of the mounting substrate that lies beneath the lens, excluding the gap. For example, in some embodiments, the reflective layer extends on the mounting substrate to cover at least about 85% of the mounting substrate that lies beneath the lens, excluding the gap. Accordingly, reflective mounting substrates for flip-chip mounted horizontal LEDs may be provided.

In some embodiments, a reflective filler material is also provided in the gap and, in other embodiments, the reflective filler material completely fills the gap. The reflective filler material may comprise white solder mask, low modulus material having reflective particles therein and/or other materials.

In other embodiments, the reflective layer also extends on the mounting substrate beyond the lens and, in some embodiments, covers substantially all of the mounting substrate, excluding the gap. Moreover, a phosphor layer may be provided that extends on the reflective layer to cover substantially all of the reflective layer that extends beyond the light emitting diode die and that lies beneath the lens. In some embodiments, the phosphor layer also covers the light emitting diode die itself. In still other embodiments, when the reflective layer extends on the mounting substrate beyond the lens or to cover substantially all of the mounting substrate, excluding the gap, the phosphor layer may also extend on the reflective layer to cover substantially all of the reflective layer that extends beyond the light emitting diode die.

As noted above, the light emitting diode is flip-chip mounted on the mounting substrate. In some embodiments, the light emitting diode die is flip-chip mounted on the mounting substrate such that the anode contact is adjacent and eutectically bonded to the anode pad, and the cathode contact is adjacent and eutectically bonded to the cathode pad. In other embodiments, the light emitting diode die is flip-chip mounted on the mounting substrate such that the anode contact is adjacent and flux eutectically bonded to the anode pad, and the cathode contact is adjacent and flux eutectically bonded to the cathode pad. In some embodiments, the flux does not extend on the mounting substrate substantially beyond the anode and cathode contacts of the light emitting diode die.

In other embodiments, the mounting substrate also includes a fiducial or alignment mark thereon that is configured to facilitate a light emitting diode die being flip-chip mounted on a mounting substrate, such that the anode contact is adjacent and conductively bonded to the anode pad and the cathode contact is adjacent and conductively bonded to the cathode pad. The fiducial may comprise a feature in the reflective layer.

Reflective filler material may be provided in the gap independent of the use of a reflective layer that extends on the mounting substrate to cover substantially all of the mounting substrate that lies beneath the lens. Accordingly, light emitting devices according to some embodiments described herein comprise a mounting substrate including spaced apart anode and cathode pads thereon that define a gap therebetween. A light emitting diode die includes spaced apart anode and cathode contacts that extend along a face thereof, and is flip-chip mounted on the mounting substrate, such that the anode contact is adjacent and conductively bonded to the anode pad and the cathode contact is adjacent and conductively bonded to the cathode pad. A reflective filler material is provided in the gap. In some embodiments, the reflective filler material completely fills the gap. The reflective filler material may comprise white solder mask, a low modulus material, such as silicone, having reflective particles, such as titanium oxide particles, suspended therein and/or other materials.

Finally, other embodiments described herein may provide packages for light emitting devices. These packages include a mounting substrate having a reflective layer thereon that defines spaced apart anode and cathode pads, and a gap therebetween. The mounting substrate is configured to flip-chip mount thereon a light emitting diode die including spaced apart anode and cathode contacts that extend along a face thereof, such that the anode contact is adjacent and conductively bonded to the anode pad and the cathode contact is adjacent and conductively bonded to the cathode pad. The mounting substrate is further configured to mount thereon a lens that extends from the mounting substrate to surround the light emitting diode die. A reflective layer extends on the mounting substrate to cover substantially all of the mounting substrate that lies beneath the lens, excluding the gap. A reflective filler material may be provided in the gap in connection with the reflective layer or independent thereof. Other packages and other precursor structures also may be provided.

BRIEF DESCRIPTION OF THE DRAWINGS

FIGS. 3A, 3B, and 3C are a top view, a cross-sectional view, and a bottom view, respectively, of an LED according to embodiments of FIG. 1 or 2.

FIGS. 8A and 8B are respective plan and cross-sectional views of an array of packaged LED die electrically coupled in parallel on a submount including interdigitated cathode and anode pads according to various embodiments described herein.

FIG. 14A is a plan view of a submount including cathode, island, and anode pads for an array of LED die according to various embodiments described herein.

FIG. 14B is a plan view of an array of LED die electrically coupled in series on the submount of FIG. 14B.

FIG. 14C is a cross-sectional view of a column of LED die from the array of FIG. 14B.

FIG. 18 is a cross-sectional view of an array of LED die with a continuous and conformal phosphor layer according to various embodiments described herein.

FIG. 20 is a cross-sectional view of an array of LED die with a dam containing a phosphor layer on the array according to various embodiments described herein.

FIGS. 28 and 29 are plan views of light emitting devices according to various embodiments described herein.

DETAILED DESCRIPTION

Figure 1:
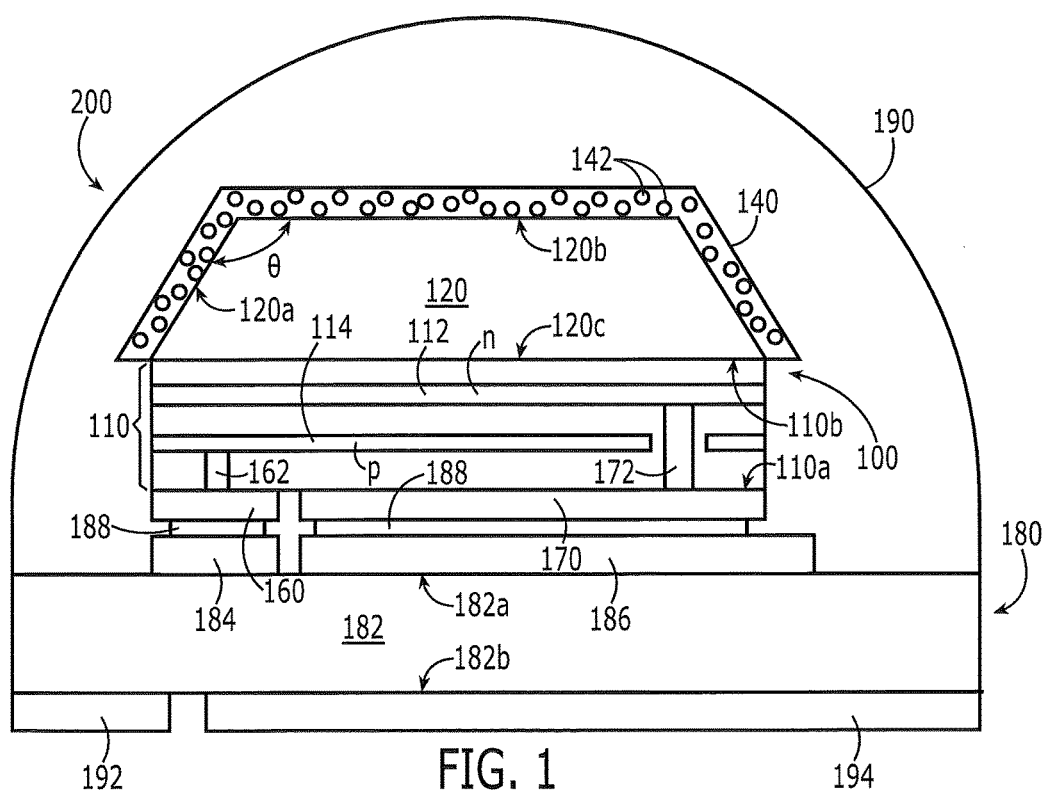
FIGS. 1 and 2 are cross-sectional views of LEDs and packaged LEDs according to various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region of an LED is considered to be "transparent" when at least 90% of the radiation from the LED that impinges on the transparent layer or region emerges through the transparent region. For example, in the context of blue and/or green LEDs that are fabricated from gallium nitride-based materials, silicon dioxide can provide a transparent insulating layer (for example, at least 90% transparent), whereas indium tin oxide (ITO) can provide a transparent conductive layer (for example, at least 90% transparent) as measured by considering transmitted and reflected components on a sapphire substrate. Moreover, as used herein, a layer or region of an LED is considered to be "reflective" when at least 90% of the angle averaged radiation that impinges on the reflective layer or region from the LED is reflected back into the LED. For example, in the context of gallium nitride-based blue and/or green LEDs, silver (for example, at least 90% reflective) may be considered reflective materials. In the case of ultraviolet (UV) LEDs, appropriate materials may be selected to provide a desired, and in some embodiments high, reflectivity and/or a desired, and in some embodiments low, absorption.

Some embodiments now will be described generally with reference to gallium nitride (GaN)-based light emitting diodes on silicon carbide (SiC)-based growth substrates for ease of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc. of Durham, N.C.

It is known to provide a conformal phosphor layer on an oblique or tapered sidewall of a light emitting diode, as described in U.S. Pat. No. 6,853,010, to Slater, Jr. et al., entitled Phosphor-Coated Light Emitting Diodes Including Tapered Sidewalls, and Fabrication Methods Therefor, assigned to the assignee of the present application, the entire disclosure of which is hereby incorporated by reference herein as if set forth fully herein (hereinafter referred to as "the '010 patent"). As described in the '010 patent, the tapered or oblique sidewall can allow at least some of the emitting surfaces of a light emitting diode (LED) to be covered with a nearly conformal phosphor-containing layer of substantially uniform thickness. This more conformal coverage can produce a desired spectrum of light, while also allowing more radiant flux to be emitted from the phosphor-coated LED. Phosphor layers are further discussed detail in U.S. application Ser. No. 13/018,013 to Donofrio et al., entitled Horizontal Light Emitting Diodes Including Phosphor Particles, and in U.S. application Ser. No. 13/017,845 to Donofrio et al., entitled Conformally Coated Light Emitting Devices And Methods For Providing The Same, both filed Jan. 31, 2011, and assigned to the assignee of the present application. The disclosures of both of the above referenced applications are hereby incorporated herein by reference in their entireties as if set forth fully herein.

Various embodiments described herein may arise from recognition that a conformal phosphor layer on an oblique sidewall of an LED may provide further unanticipated advantages. Specifically, larger particle size phosphor particles may be used in the conformal layer that comprises phosphor. It is well known that larger phosphor particles are generally more efficient in light conversion than small sized phosphor particles. Unfortunately, due to their large size, large phosphor particles may also have a lower light scattering efficiency than relatively small phosphor particles. The low scattering efficiency may produce a high angular variation in Correlated Color Temperature (CCT), which is typical in white LEDs using large particulate size phosphor particles for brightness boost.

In sharp contrast, various embodiments described herein may provide relatively high brightness with relatively low angular variation, by providing a conformal layer that comprises large phosphor particles on the outer face and on the oblique sidewall of an LED.

It will be understood that real world phosphor particle layers are not precisely uniform in size. Rather, consistent with other particulate materials, a range of particle sizes may be provided, and various metrics are used to indicate a measure of particle size in a particulate material. Particle size is generally measured by an equivalent particle diameter, which may take into account the fact that the particles may be non-spherical. Moreover, the particle size distribution may be specified by providing one or more equivalent particle diameters, often abbreviated with "d", to indicate a mass percent of the particles that has a smaller diameter. Thus, d50, also referred to as an average equivalent particle diameter, indicates that 50 mass-% of the particles has a smaller diameter. Moreover, an equivalent particle diameter d10 refers to 10 mass-% of the particles having a smaller diameter, whereas an equivalent particle diameter d90 refers to 90 mass-% of the particles having a smaller diameter. A given phosphor may be specified in terms of d50, d10 and/or d90. Moreover, other metrics other than d50, d10 and d90 may be used, such as d75 and d25. Combinations of these metrics also may be used.

FIG. 1 is a cross-sectional view of a light emitting diode (also referred to as a light emitting diode "die" or "chip") and a packaged light emitting diode according to various embodiments described herein. Referring to FIG. 1, these light emitting diodes 100 include a diode region 110 having first and second opposing faces 110*a*, 110*b*, respectively, and including therein an n-type layer 112 and a p-type layer 114. Other layers or regions may be provided, which may include quantum wells, buffer layers, etc., that need not be described herein. An anode contact 160 ohmically contacts the p-type layer 114 and extends on a first face 110*a*. The anode contact 160 may directly ohmically contact the p-type layer 114, or may ohmically contact the p-type layer 114 by way of one or more conductive vias 162 and/or other intermediate layers. A cathode contact 170 ohmically contacts the n-type layer 112 and also extends on the first face 110*a*. The cathode contact may directly ohmically contact the n-type layer 112, or may ohmically contact the n-type layer 112 by way of one or more conductive vias 172 and/or other intermediate layers. As illustrated in FIG. 1, the anode contact 160 and the cathode contact 170 that both extend on the first face 110*a* are coplanar. The diode region 110 also may be referred to herein as an "LED epi region", because it is typically formed epitaxially on a substrate 120. For example, a Group III-nitride based LED epi 110 may be formed on a silicon carbide growth substrate. In some embodiments, as will be described below, the growth substrate may be present in the finished product. In other embodiments, the growth substrate may be removed. In still other embodiments, another substrate may be provided that is different from the growth substrate, and the other substrate may be bonded to the LED after removing the growth substrate.

As also shown in FIG. 1, a transparent substrate 120, such as a transparent silicon carbide growth substrate or a transparent sapphire growth substrate, is included on the second face 110*b* of the diode region 110. The transparent substrate 120 includes a sidewall 120*a* and may also include an inner face 120*c* adjacent the second face 110*b* of the diode region 110 and an outer face 120*b*, remote from the inner face 120*c*. The outer face 120*b* is of smaller area than the inner face 120*c*. In some embodiments, the sidewall 120*a* may be stepped, beveled and/or faceted, so as to provide the outer face 120*b* that is of smaller area than the inner face 120*c*. In other embodiments, as shown in FIG. 1, the sidewall is an oblique sidewall 120*a* that extends at an oblique angle θ, and in some embodiments at an obtuse angle, from the outer face 120*b* towards the inner face 120*c*. According to some embodiments, transparent substrate 120 may have a thickness of at least about 50 micrometers, at least about 100 micrometers, or even at least about 150 micrometers. Transparent substrate 120, for example, may have a thickness in the range of about 150 micrometers to about 400 micrometers, or in the range of about 175 micrometers to about 35 micrometers. Phosphor layer 140 may thus be separated from portions of diode region 110 by a thickness of transparent substrate 120.

LEDs 100 configured as was described above in connection with FIG. 1, may be referred to as "horizontal" or "lateral" LEDs, because both the anode and the cathode contacts thereof are provided on a single face of the LED. Horizontal LEDs may be contrasted with vertical LEDs in which the anode and cathode contacts are provided on opposite faces thereof, as is illustrated, for example, in the '010 patent.

Various other configurations of horizontal LEDs that may be used according to any of the embodiments described herein, are described in detail in U.S. Patent Application publication 2009/0283787 to Donofrio et al., entitled Semiconductor Light Emitting Diodes Having Reflective Structures and Methods of Fabricating Same, assigned to the assignee of the present application, the disclosure of which is hereby incorporated herein by reference in its entirety as if set forth fully herein (hereinafter referred to as "the '787 Publication").

Still continuing with the description of FIG. 1, a conformal layer 140 that comprises phosphor particles 142 having an average equivalent particle diameter d50 of at least 10 μm, is provided on the outer face 120*b* and on the oblique sidewall 120*a*. In embodiments of FIG. 1, the entire outer face 120*b* and the entire oblique sidewall 120*a* are covered with the phosphor layer 140. However, in other embodiments, the entire outer face 120*b* and/or the entire oblique sidewall 120*a* need not be covered with the phosphor layer 140. Moreover, the conformal phosphor layer 140 may be of uniform thickness on the outer face 120*b* and on the oblique sidewall 120*a*. In some embodiments, this uniform thickness is between the range of between about 36 μm and about 56

µm and, in other embodiments, a range of between about 30 µm and about 75 µm may be provided. In other embodiments, a thickness of about 46 µm may be provided.

Various embodiments of phosphor layers 140 and diode regions 110 may be provided according to various embodiments described herein. For example, in some embodiments, the diode region 110 is configured to emit blue light, for example light having a dominant wavelength of about 450-460 nm, and the conformal layer comprises yellow phosphor, such as YAG:Ce phosphor having a peak wavelength of about 550 nm and an average equivalent particle diameter d50 of at least 10 µm. In other embodiments, an average equivalent diameter d50 of at about 15 µm is provided. In still other embodiments, an average equivalent diameter d50 of between about 15 µm and about 17 µm is provided.

In other embodiments, the diode region 110 is configured to emit blue light upon energization thereof, as described above, and the conformal layer 140 may comprise a mixture of phosphor having average equivalent particle diameter of at least about 10 µm, as described above, and red phosphor, such as a CASN-based phosphor, having an average equivalent particle diameter d50 of about 10 µm in size. In still other embodiments, the mixture of yellow phosphor and red phosphor may have a phosphor weight ratio of the yellow phosphor to the red phosphor of at least about 5:1 and, in other embodiments, at least about 9:1. In some embodiments, since at least five times as much yellow phosphor as red phosphor is provided, a wider range of red phosphor particle sizes may be used in combination with yellow phosphor particles having an average equivalent particle diameter d50 of at least about 10 µm.

As was described above, various embodiments of FIG. 1 may arise from recognition that a conformal phosphor layer 140 on an oblique sidewall 120a of an LED 100 may provide further unanticipated advantages. Specifically, large particle size phosphor particles 142 may be used in the conformal layer 140 that comprises phosphor. It is well known that larger phosphor particles 142 are generally more efficient in light conversion than small sized phosphor particles. Unfortunately, due to their large size, large phosphor particles 142 may also have a lower light scattering efficiency than relatively small phosphor particles. The low scattering efficiency may produce a high angular variation in CCT, which is typical in white LEDs using large particulate size phosphor particles for brightness boost.

In sharp contrast, various embodiments described herein may provide relatively high brightness with relatively low angular variation, by providing a conformal layer 140 that comprises large phosphor particles 142 on the outer face 120b and on the oblique sidewall 120a of an LED.

Moreover, various embodiments described herein may provide other unexpected advantages. Specifically, since the CCT variation can be reduced compared to an LED with a non-oblique sidewall, less red phosphor may need to be used. For example, with non-oblique walls, a ratio of yellow phosphor to red phosphor may be about 2:1 whereas, as described above, ratios of at least about 5:1 or at least about 9:1 may be used. Since red phosphor often is more expensive than yellow phosphor, lower cost LEDs may be obtained. Moreover, since a higher ratio of yellow phosphor to red phosphor may be used, the particle size of the red phosphor may vary over a wide range because the particle size of the yellow phosphor will dominate.

Continuing with the description of FIG. 1, the LED 100 may be combined with a packaging substrate, such as a submount 180, and a lens 190 to provide a packaged LED 200. The submount 180 may include a body 182 that may comprise aluminum nitride (AlN). In other embodiments, metal core substrates, printed circuit boards, lead frames and/or other conventional packaging substrates may be used to mount the LED 100 in a flip-chip configuration. The submount 180 includes a submount face 182a, and an anode pad 184 and a cathode pad 186 thereon. The anode and cathode pads may comprise silver-plated copper and/or other conductive materials. As illustrated in FIG. 1, the LED 100 is mounted on the submount 180, such that the first face 110a is adjacent the submount face 182a, the outer face 110b is remote from the submount 180, the anode contact 184 is adjacent the anode pad 160, and the cathode contact 186 is adjacent the cathode pad 170. In some embodiments, a bonding layer, such as a eutectic gold/tin solder layer 188, is used to electrically, thermally and mechanically connect the anode contact 160 to the anode pad 184, and the cathode contact 170 to the cathode pad 186. In other embodiments, direct attachment of the anode contact 160 to the anode pad 184, and direct attachment of the cathode contact 170 to the cathode pad 186 may be provided, for example using thermocompression bonding and/or other techniques.

A packaged device anode 192 and a packaged device cathode 194 may be provided on a second face 182b of the submount body 182, and may be connected to the anode pad 184 and cathode pad 186, respectively, using internal vias and/or conductive layers that extend on and/or around the submount body 182.

Various embodiments of submounts 180 that may be used with embodiments described herein, are described in the '787 Publication that was cited above. Various other embodiments of submounts 180 are described in U.S. Patent Application Publication 2009/0108281 to Keller et al., entitled Light Emitting Diode Package and Method for Fabricating Same, assigned to the assignee of the present application, the disclosure of which is hereby incorporated herein by reference in its entirety as if set forth fully herein (hereinafter referred to as "the '281 Publication"). It will be understood that any and all embodiments of these submounts may be used in embodiments of FIG. 1. However, the pad structure on the submount may be modified so as to be used with a horizontal LED 100 of FIG. 1, rather than the vertical LEDs described in the '281 Publication.

Finally, the packaged LED 200 may also include a lens 190 that extends from submount face 180a to surround the LED 100. The lens 190 may be a molded plastic lens, as described in detail in the '281 Publication, and may be fabricated on the submount according to techniques that are described in the '281 Publication, and/or other techniques. In some embodiments, the lens may be about 3.06 mm in diameter.

Figure 2:
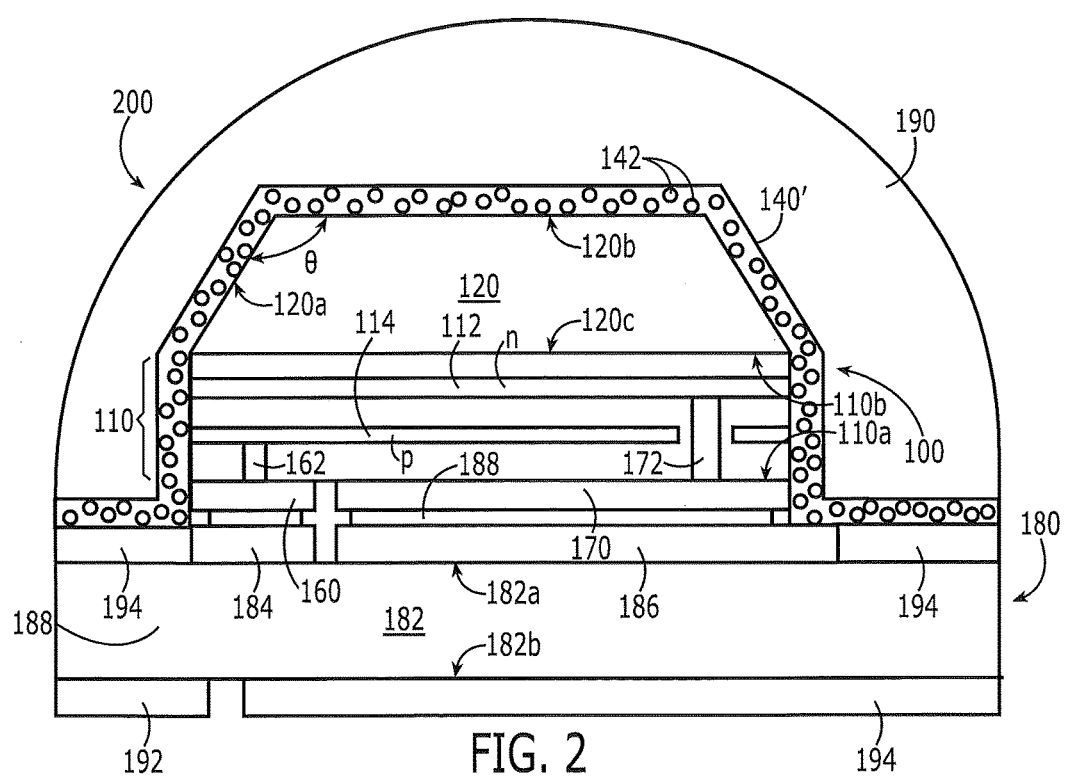

FIG. 2 is a cross-sectional view of LEDs and packaged LEDs according to various other embodiments. Compared to embodiments of FIG. 1, the phosphor layer 140' extends across the diode region 110 and/or on the first face 182 of the submount body 182. The phosphor layer may be fabricated to extend onto the submount as is described in the '281 Publication. Moreover, as shown in FIG. 2, the submount 180 may include a layer 194 on the first face 182a thereof. The layer 194 may be an extension of the anode pad 184 and the cathode pad 186 or may be distinct therefrom. In some embodiments, the layer 194 is a reflective layer that extends between the submount face 182a and the conformal layer 140' that includes phosphor that extends on the submount face 182a. This reflective layer 194 can reflect light that passes through the phosphor layer that is on the submount face 182a back toward the lens 190, and can thereby increase efficiency of the LED.

Packaged LEDs as described above in connection with FIGS. 1 and 2 may be embodied as a Cree® XLamp® XP-E High-Efficiency White (HEW) LED, as described, for example, in the *Cree® XLamp® XP-E High-Efficiency White LEDs Data Sheet*, Publication No. CLD-DS34, Rev. 0, dated Dec. 6, 2010, and available at cree.com/products/xlamp_xpe.asp, the disclosure of which is hereby incorporated herein by reference in its entirety as if set forth fully herein.

FIGS. 3A, 3B and 3C are a top view, a cross-section and a bottom view, respectively, of an LED 100 of FIG. 1 or 2. The phosphor layer 140/140' is not illustrated.

In FIGS. 1 and 2, the outer face 120b was planar. However, in embodiments of FIG. 3A, the outer face 120b' includes at least one groove, such as an X-shaped groove 310 therein. Multiple X-shaped grooves and/or other shaped grooves may also be provided. Moreover, as shown in FIG. 3C, in some embodiments, the anode contact 160 and the cathode contact 170 may collectively occupy at least about 90% of the active diode region area.

Specifically, FIGS. 3A-3C illustrate an embodiment wherein the inner face 120c of the substrate 120 is a square inner face 120c having sides that are about 1,000 µm long, the outer face 120b' is a square outer face having sides that are about 642 µm long, and a thickness or distance t between the square inner and outer faces (also referred to as "height") is about 335 µm, so as to define an area ratio between the outer face 120b and the inner face 120c of about 0.41. The diode region 110 may also be a square, having sides that are about 1,000 µm long. A small gap 320 of about 75 µm (micrometers) is provided between the anode contact 160 and the cathode contact 170. A width of the gap 320 between the anode and cathode contacts 160 and 170 may be less than about 100 µm. In some embodiments, the gap 320 may have a width that is less than about 80 µm. In further embodiments, the gap 320 may have a width that is less than about 60 µm, and in still further embodiments, the gap 320 may have a width that is less than about 40 µm. In some embodiments, the gap 320 may have a width that is between about 10 µm and about 100 µm. In further embodiments, the gap 320 may have a width that is between about 50 µm and about 75 µm, and in still further embodiments, the gap 320 may have a width that is between about 50 µm and about 60 µm.

In some embodiments, the gap 320 may have an aspect ratio (defined as the height of the gap divided by the width of the gap) that is between about 0.2 and 2. In further embodiments, the gap 320 may have an aspect ratio that is between about 0.5 and 1.5, and in still further embodiments, the gap 320 may have an aspect ratio that is between about 0.8 and 1.2. In particular embodiments, the gap 320 may have an aspect ratio that is about 1.

A calculation of the active attach area may be made as follows:

Total active area of diode region=751,275 µm²(cathode)+70,875 µm²(gap)+70,875 µm²(anode)
=893,025 µm².

Total active attach area=751,275 µm²(cathode)+70,875 µm²(anode)=822,150 µm².

Thus, the active attach area is at least about 90% of the active diode region area.

According to some embodiments, a total attach area (i.e., a combined surface area of anode contact 160 and cathode contact 170) may be greater than 70% of a total surface area of face 110a of the LED, greater than 80% of the total surface area of face 110a, or even greater than 90% of the total surface area of face 110a. As shown in FIGS. 3A to 3C, for example, face 110a of the LED may have a surface area of 1×10⁶ µm², anode contact 160 may have a contact surface area of 70,875 µm², and cathode contact 170 may have a contact surface area of 751,275 µm². Accordingly, anode contact 160 and cathode contact 170 may collectively occupy about 82% of the surface area of face 110a of the LED.

Surface areas of anode and cathode contacts 160 and 170 may be asymmetric, with cathode 170 accounting for at least 70% of the combined contact area, at least 80% of the combined contact area, or even at least 90% of the combined contact area. As shown in FIGS. 3A to 3C, for example, cathode contact 170 may occupy about 91% of the total contact area (i.e., 100%×751,275 µm²/(751,275 m²+70,875 µm²)) or about 75% of the surface area of face 110a (i.e., 100%×751,275 m²/(1×10⁶ µm²)) of the LED. As further shown in FIGS. 3A to 3C, for example, anode contact 160 may occupy about 9% of the total contact area (i.e., 100%×70,875 µm²/(751,275 µm²+70,875 µm²)), or about 7% of the surface area of face 110a (i.e., 100%×70,875 µm²/1×10⁶ µm²) of the LED. Accordingly, LED 100 may asymmetrically bridge anode and cathode pads 184 and 186 of submount 180 as shown in FIGS. 1 and 2.

As further shown in FIGS. 3A to 3C, widths of anode and cathode contacts 160 and 170 may be at least 60% of a width of face 110a of the LED, at least 70% of a width of face 110a of the LED, or even at least 90% of a width of face 110a of the LED. For example, each of anode and cathode contacts 160 and 170 may have a width of about 945 µm, and LED face 110A may have a width of 1,000 µm (taken in a same direction as the widths of anode and cathode contacts 160 and 170). Accordingly, each of anode and cathode contacts 160 and 170 of FIG. 3C may have a width that is about 95% of a width of LED face 110a.

Table 1 illustrates various configuration geometries of the substrate 120 that may be provided according to various other embodiments. It will be understood that the "area ratios" used herein are based on the dimensions of the sides of the faces and do not include any added surface area due to texturing, grooves and/or other light extraction features.

TABLE 1

| Designator | Base (Inner) Area, µm² | Top (Outer) Area, µm² | Area Ratio (Top/Base) | Aspect Ratio (Height/Base) |
|---|---|---|---|---|
| DA1000 | 1,000,000 | 412,164 | 0.412164 | 0.335 |
| DA850 | 722,500 | 242,064 | 0.335036678 | 0.394 |
| DA700 | 490,000 | 116,964 | 0.238702041 | 0.5 |

Figure 4:
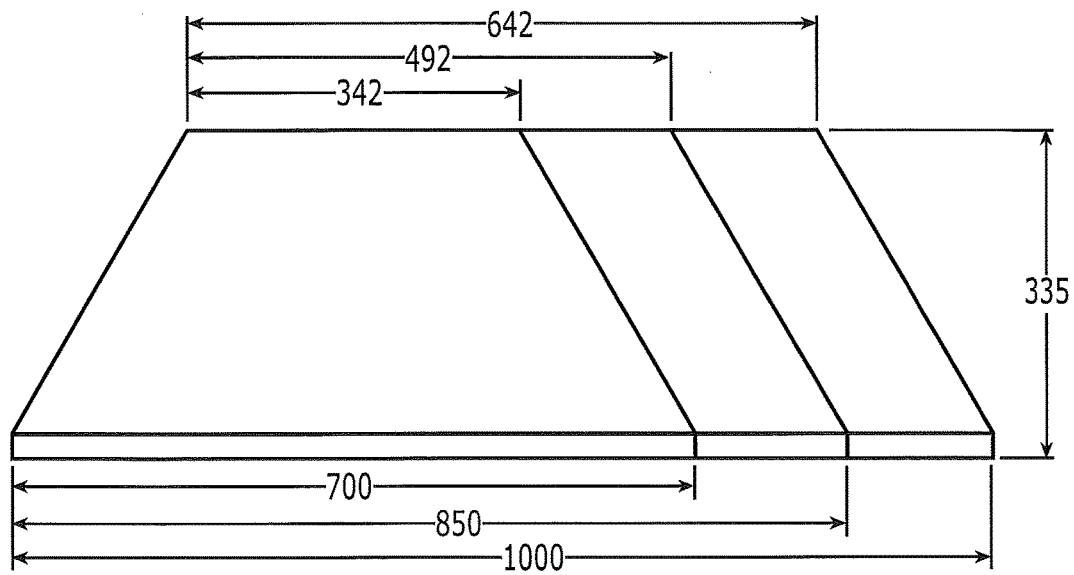
FIGS. 4 and 5 illustrate geometries of substrates of FIGS. 1-3, according to various embodiments described herein.

FIG. 4 illustrates these embodiments. Specifically, the top row of Table 1 illustrates various embodiments wherein the inner face 120c is a square inner face having sides that are about 1,000 µm (micrometer) long (total area 1,000,000 µm²), the outer face 120b is a square outer face having sides that are about 642 µm long (total area 412,164 µm²) and a distance (height) between the square inner and outer faces is about 335 µm so as to define an area ratio of the outer face to the inner face (top to base) of about 0.41, and an aspect ratio of height to a side of the inner face (base) of about 0.335. These embodiments are also illustrated in FIG. 3B. The second row of Table 1 illustrates embodiments wherein the inner face 120c is a square inner face having sides that are about 850 µm long (total area 722,500 µm²), the outer face 120b is a square outer face having sides that are about 492 µm long (total area 242,064 µm$^2$) and a distance (height) between the square inner and outer faces is about 335 µm so as to define an area ratio of the outer face to the inner face of about 0.33 and an aspect ratio of height to base of about 0.39. Finally, the third row of Table 1 illustrates various embodiments wherein the inner face 120c is a square inner face having sides that are about 700 µm long (total area about 72,2500 µm$^2$), the outer face 120b is a square outer face having sides that are about 342 µm long (total area about 116,964 µm=$^2$) and a distance height between the square inner and outer faces is about 335 µm so as to define an area ratio of the outer face to the inner face of about 0.24 and an aspect ratio of height to base of about 0.5.

Figure 5:
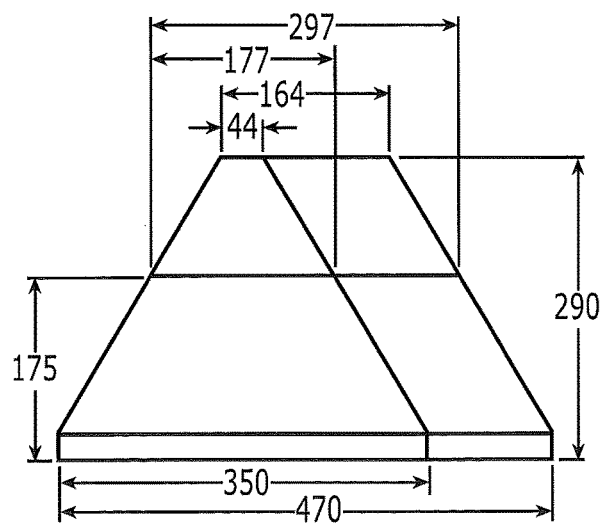

FIG. 5 and Table 2 illustrate other embodiments wherein the inner face 120c is a rectangular inner face of size 350 µm×470 µm. In the first line of Table 2, the height is about 175 µm thick, and the outer face 120b is a rectangle of size 177 µm×297 µm, so as to provide a base (inner) area of 164,500 µm$^2$ and a top (outer) area of 52,569 µm. The area ratio of top to base is about 0.32, and the ratio of height to base is about 0.5. The second line of Table 2 illustrates a thicker height of about 290 µm, so that the top has sides of about 44 µm×164 µm, leading to an area ratio of about 0.044 and a ratio of height to base of about 0.8.

TABLE 2

| Designator | Base (Inner) Area, µm$^2$ | Top (Outer) Area, µm$^2$ | Area Ratio (Top/Base) | Aspect Ratio (Height/Base) |
|---|---|---|---|---|
| DA350 - Standard 175 µm thick | 164,500 | 52,569 | 0.319568389 | 0.5 |
| DA350 Extreme - 290 µm thick | 164,500 | 7,216 | 0.043866261 | 0.828 |

Accordingly, embodiments of Table 1 and Table 2, corresponding to FIGS. 4 and 5, can provide light emitting diodes wherein an area ratio of the outer face to the inner face is less than or about 0.4 and, in some of these embodiments, the aspect ratio of the height to a side of the inner face is at least about 0.3. These tables and figures also illustrate other embodiments wherein the area ratio of the outer face to the inner face is less than or about 0.33 and, in some embodiments, the aspect ratio of the height to a side of the inner face is at least about 0.4. These tables and figures also illustrate yet other embodiments wherein the area ratio of the outer face to the inner face is less than or about 0.04 and, in some embodiments, the height to base aspect ratio is at least about 0.8.

It has been found that light extraction may be improved as the ratio of the outer area to the inner area is reduced. The larger area devices, such as the DA1000 described on the first line of Table 1 can provide additional extraction by providing a groove, as was illustrated in FIG. 3A. This would appear to indicate that further extraction benefit would be obtained by a further reduction in the ratio of the top to base, but this may be expensive due to the blade width that may be needed for beveling the sidewalls. On the smaller devices, such as the DA350 described in the first row of Table 2, there may be no further gain at blue light in further increasing the ratio, so that an aspect ratio of about 0.32 may already be sufficient for maximum blue extraction.

Lateral LED configurations as were described in Tables 1 and 2 can allow for very low ratios of top to base (outer to inner surfaces of the substrate) compared to previous generation vertical chips, since the backside (top) contact area need not be considered for the electrical performance of the device. Moreover, improved light extraction of these devices may also be a factor in conversion efficiency, since the phosphor layers can scatter light back into the chips.

Figure 6A:
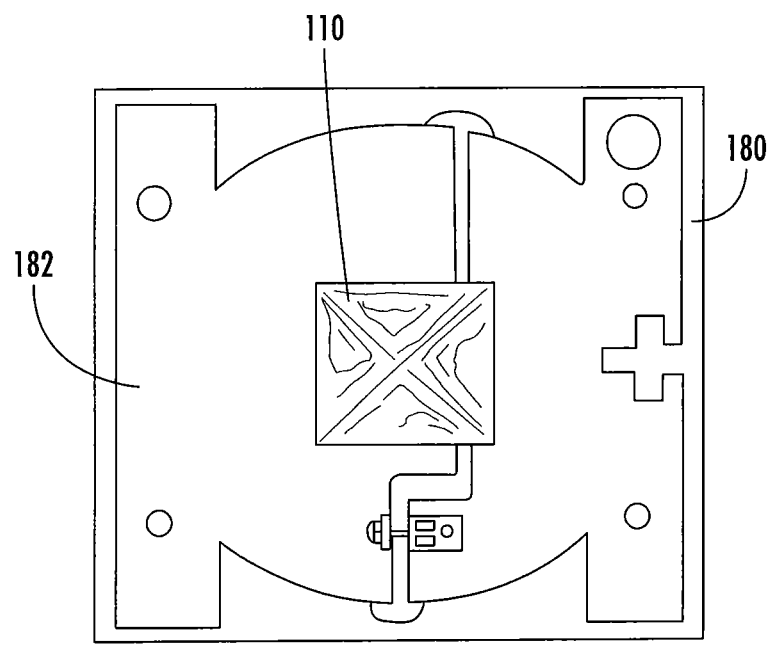
FIG. 6A is a photograph of a submount with an LED mounted thereon according to various embodiments of FIGS. 1-4.
Figure 6B:
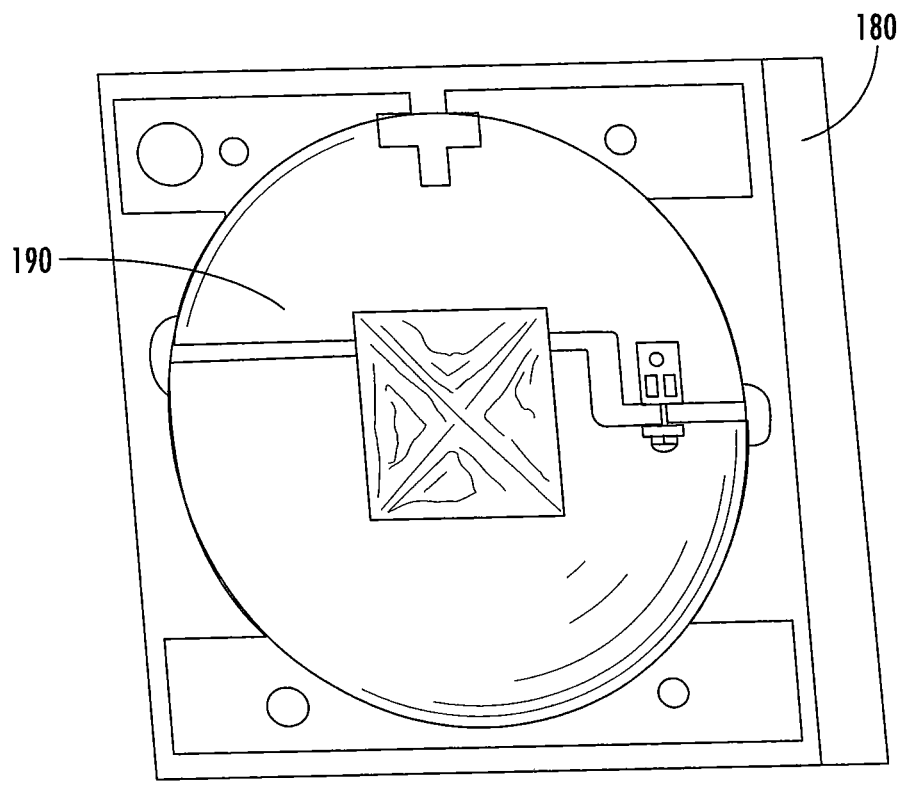
FIG. 6B is a photograph of a packaged LED according to various embodiments of FIGS. 1-4.

FIG. 6A is a photograph of a submount 180 with an LED 110 mounted thereon, as was described in connection with FIGS. 1-4. FIG. 6B is a photograph of a packaged LED 200 of FIGS. 1-4 including lens 190.

Various embodiments that were illustrated in FIGS. 1-6 may also be regarded as illustrating a light emitting diode 100 that comprises a diode region 110 having first and second opposing faces 110a, 110b and including therein an n-type layer 112 and a p-type layer 114. An anode contact 160 ohmically contacts the p-type layer and extends on the first face 110a. A cathode contact 170 ohmically contacts the n-type layer 112 and also extends on the first face 110a. A transparent substrate 120 is provided on the second face 110b. The transparent substrate includes an inner face 120c adjacent the second face 110b, an outer face 120b remote from the second face that is of smaller area than the inner face 120c, and a sidewall 120a that extends from the outer face to the inner face. An area ratio of the outer face to the inner face is less than or about 0.4. In some embodiments, the sidewall is a stepped sidewall. In other embodiments, the sidewall comprises an oblique sidewall that extends at an oblique angle from the outer face towards the inner face. A conformal layer 140, 140' that comprises phosphor 142 having an average equivalent particle diameter d50 of at least about 10 µm is provided on the outer face 120b and on the sidewall 120a.

FIGS. 1-6 may also be regarded as describing other embodiments of a packaged light emitting diode die 200 that includes a light emitting diode die including a diode region, an anode contact and a cathode contact, as described above. A submount 180 is also provided as was described above. Moreover, a conformal layer 140, 140' that comprises phosphor 142 is spaced apart from the diode region 110 and extends conformally onto the submount face 182a away from the light emitting diode die 110. The conformal layer may be spaced apart from the diode region by the transparent substrate 120 and/or by other means, such as a dome.

LEDs of FIGS. 1, 2, 3A to 3C, 4, 5, and 6A to 6B may also be provided in arrays on a same packing substrate (e.g., submount) as discussed in greater detail below. For example, an array of LEDs may be provided with the LEDs electrically connected in series and/or parallel. Each of the LEDs may have a horizontal structure with anode and cathode contacts of each LED provided between the LED and respective pads of the submount. Using direct LED die attach as discussed above, arrays of LED die may be provided with spacings between LED die of less than about 250 micrometers, less than about 100 micrometers, or even less than about 50 micrometers.

Some embodiments may provide relatively small area LED submounts for LED arrays with higher voltages where LED die bonding areas are more efficiently utilized to balance desired operating voltage and chip area and balanced with practical aspects of maintaining a chip spacing that provides ease of manufacture and less light absorption to provide increased efficiency and increased light output. Spacings between LED die, for example, may be less than about 75 micrometers, less than about 60 micrometers, less than about 40 micrometers, and/or in the range of about 40 micrometers to about 75 micrometers. Generally, smaller spacings between light emitting diode die may be desired, provided that sufficient space (e.g., greater than about 10 micrometers, or greater than about 20 micrometers) is provided to allow manufacturing placement and/or to reduce light absorption between light emitting diode die. According to some embodiments, spacings between LED die may be in the range of about 20 micrometers to about 500 micrometers, in the range of about 40 micrometers to about 150 micrometers, or even in the range of about 50 micrometers to about 100 micrometers.

In embodiments discussed below, LED die, submounts, and elements thereof may be provided as discussed above with respect to FIGS. 1, 2, 3A to 3C, 4, 5, and 6A to 6B. For ease of illustration, however, elements may be omitted from the following figures where inclusion of such elements would be overly repetitious. For example, diode regions 110 may be illustrated below without showing elements thereof (e.g., without separately showing n-type layer 112, p-type layer 114, conductive vias 162/172, etc.). Each of diode regions 110 discussed below, however, may include elements discussed above with respect to FIGS. 1 and 2.

Figure 7A:
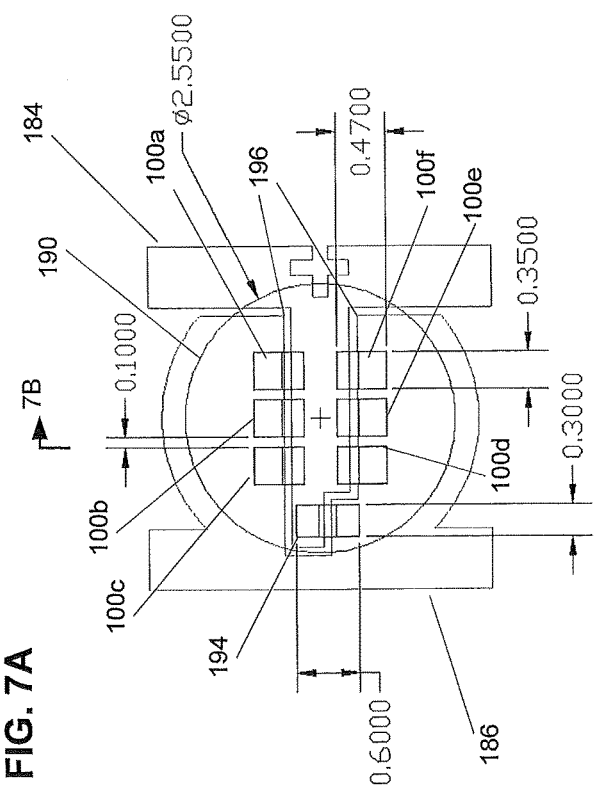
FIGS. 7A and 7B are respective plan and cross-sectional views of an array of packaged LED die electrically coupled in parallel on a submount according to various embodiments described herein.
Figure 7B:
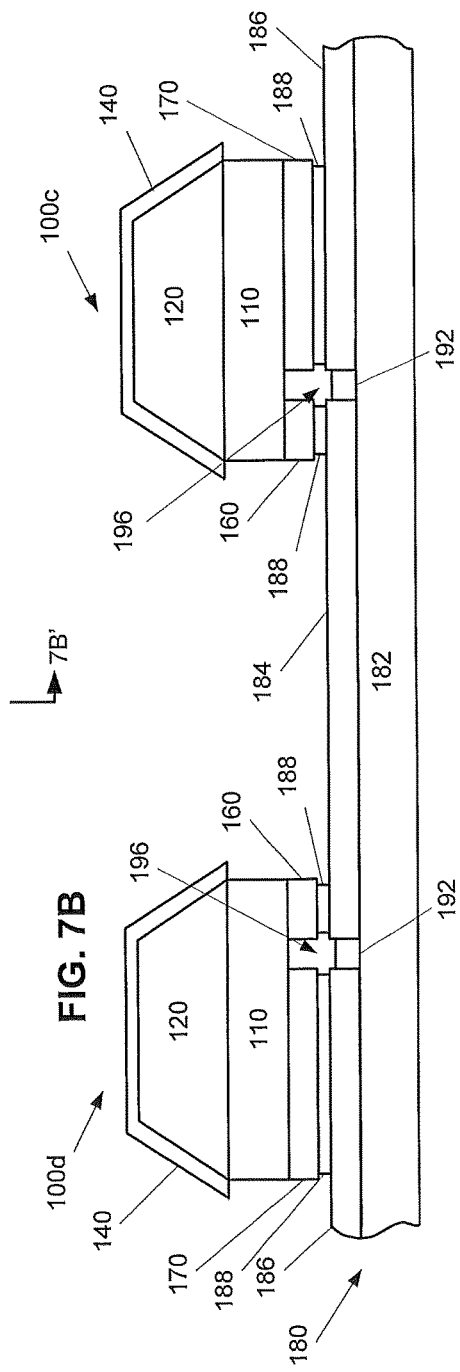

FIGS. 7A and 7B illustrate plan and cross-sectional views of an array of six LED die 100a to 100f electrically coupled in parallel between anode and cathode pads 184 and 186 of submount 180. In addition, an electrostatic discharge (ESD) protection device 194 may be electrically coupled between anode and cathode pads 184 and 186. As shown, portions of anode pad 184 may extend between opposing portions of cathode pad 186, and LED die 100a to 100f may bridge gap 196 between anode and cathode pads 184 and 186. Moreover, all of LED die 100a to 100f may be provided within a circular area of a same lens 190. While each LED die 100a to 100f is shown with an individual phosphor layer 140 as discussed above with respect to FIG. 1, a continuous phosphor layer may be provided over all of the LED die 100a to 100f as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100f may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100f over cathode pad 186 may be significantly greater than portions of LED die 100a to 100f over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 μm or even less than about 40 μm.

In the assembly of FIGS. 7A and 7B, LED die 100a to 100f are arranged in a rectangular array of 2 rows and 3 columns (with each row including a same number of LED die and with each column including a same number of LED die). Spacing between adjacent LED die may be about 0.1 mm, and all of the LED die may be provided within a circular perimeter of a lens 190 having a diameter of about 2.55 mm. Each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 7A and into the plane of FIG. 7B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100f are sufficiently spaced from a perimeter of lens 190, an efficiency of light transmission through lens 190 may be improved. While lens 190 is not shown in the cross-section of FIG. 7B, it will be understood that lens 190 may substantially form a hemisphere or hemispherical section on submount 180 surrounding all of LED die 100a to 100f.

FIGS. 8A and 8B illustrate plan and cross-sectional views of an array of six LED die 100a to 100f electrically coupled in parallel between anode and cathode pads 184 and 186 of submount 180. In addition, an electrostatic discharge (ESD) protection device 194 may be electrically coupled between anode and cathode pads 184 and 186. As shown, anode and cathode pads 184 and 186 may be interdigitated, and LED die 100a to 100f may bridge gap 196 between anode and cathode pads 184 and 186. Moreover, all of the LED die 100a to 100f may be provided within a circular area of a same lens 190. While each LED die 100a to 100f is shown with an individual phosphor layer 140 as discussed above with respect to FIG. 1, a continuous phosphor layer may be provided over all of LED die 100a to 100f as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100f may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100f over cathode pad 186 may be significantly greater than portions of LED die 100a to 100f over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of the gap 196 between the anode and cathode pads 184 and 186 (and filler 192 therein) may be less than about 100 μm. In some embodiments, the gap 196 may have a width that is less than about 80 μm. In further embodiments, the gap 196 may have a width that is less than about 60 μm, and in still further embodiments, the gap 196 may have a width that is less than about 40 μm. In some embodiments, the gap 196 may have a width that is between about 10 μm and about 100 μm. In further embodiments, the gap 196 may have a width that is between about 50 μm and about 75 µm, and in still further embodiments, the gap 196 may have a width that is between about 50 µm and about 60 µm.

In some embodiments, the gap 196 may have an aspect ratio (defined as the height of the gap divided by the width of the gap) that is between about 0.2 and 2. In further embodiments, the gap 196 may have an aspect ratio that is between about 0.5 and 1.5, and in still further embodiments, the gap 196 may have an aspect ratio that is between about 0.5 and 1.5. In particular embodiments, the gap 196 may have an aspect ratio that is about 1.

In the assembly of FIGS. 8A and 8B, LED die 100*a* to 100*f* are arranged in a rectangular array of 2 rows and 3 columns. Dimensions of LED die and spacings therebetween may be the same as discussed above with respect to the structure of FIGS. 7A and 7B. In contrast to the structure of FIGS. 7A and 7B, however, LED die 100*a* to 100*f* of both rows of FIGS. 8A and 8B may be aligned such that anode contacts 160 of both rows are oriented toward a first side of submount 180 and cathode contacts 170 of both rows are oriented toward a second side of submount opposite the first side. While lens 190 is not shown in the cross-section of FIG. 8B, it will be understood that lens 190 may substantially form a hemisphere on submount 180 surrounding all of LED die 100*a* to 100*f*.

Figure 9A:
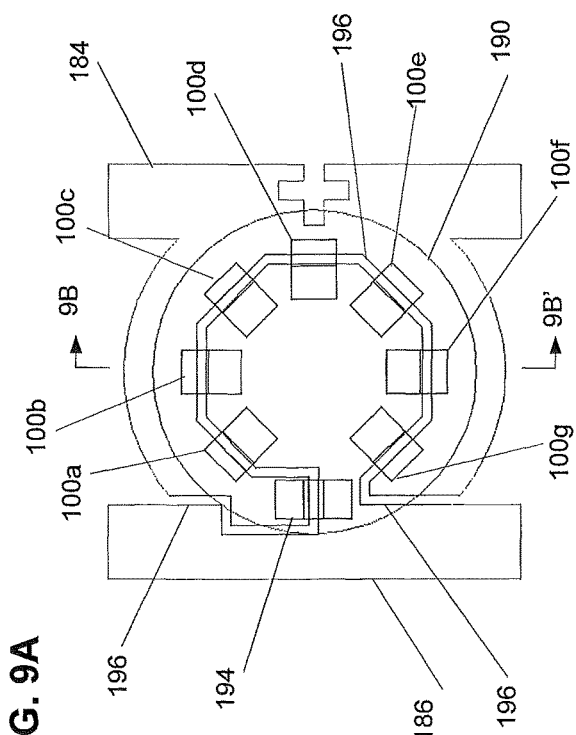
FIGS. 9A and 9B are respective plan and cross-sectional views of an array of radially arranged LED die electrically coupled in parallel on a submount according to various embodiments described herein.
Figure 9B:
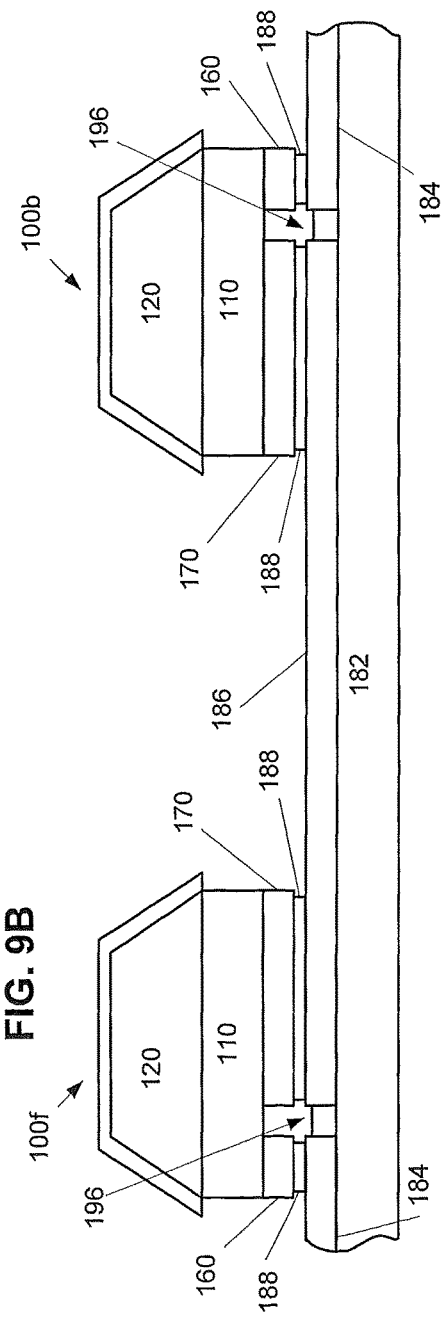

FIGS. 9A and 9B illustrate plan and cross-sectional views of a substantially circular array of seven LED die 100*a* to 100*g* electrically coupled in parallel between anode and cathode pads 184 and 186 of submount 180. In addition, an electrostatic discharge (ESD) protection device 194 may be electrically coupled between anode and cathode pads 184 and 186. As shown, all of LED die 100*a* to 100*g* may be provided within a circular area of a same lens 190. Moreover, each of the LED die 100*a* to 100*g* may share a same spacing relative to a perimeter of lens 190, and each of LED die 100*a* to 100*g* may be oriented radially relative to center of the circular array and/or relative to a center of lens 190. By providing that LED die 100*a* to 100*g* of the circular array are spaced symmetrically relative to the perimeter of lens 190, a more uniform and/or efficient light output may be provided through lens 190. As before, LED die 100*a* to 100*g* may bridge gap 196 between anode and cathode pads 184 and 186. While each LED die 100*a* to 100*g* is shown with an individual phosphor layer 140 as discussed above with respect to FIG. 1, a continuous phosphor layer may be provided over all of the LED die 100*a* to 100*g* as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100*a* to 100*g* may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100*a* to 100*g* over cathode pad 186 may be significantly greater than portions of LED die 100*a* to 100*g* over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 µm or even less than about 40µ.

In the assembly of FIGS. 9A and 9B, each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (into the plane of FIG. 9B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100*a* to 100*g* are sufficiently spaced from a perimeter of lens 190, an efficiency of light transmission through lens 190 may be improved. While lens 190 is not shown in the cross-section of FIG. 9B, it will be understood that lens 190 may substantially form a hemisphere on submount 180 surrounding all of LED die 100*a* to 100*g*.

Figure 10A:
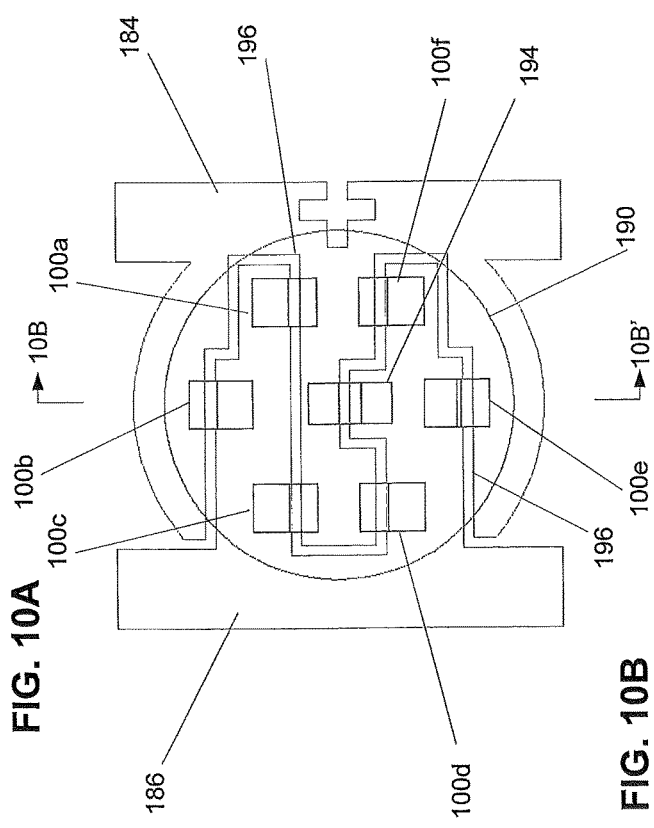
FIGS. 10A and 10B are respective plan and cross-sectional views of an array of packaged LED die electrically coupled in parallel on a submount including interdigitated electrodes according to various embodiments described herein.
Figure 10B:
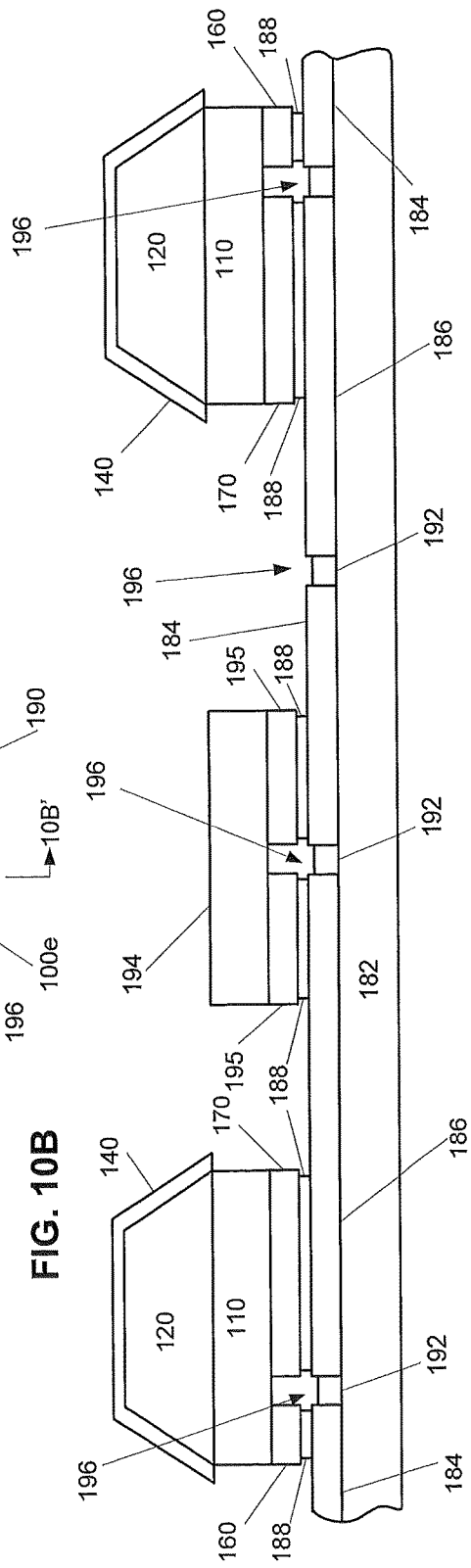

FIGS. 10A and 10B illustrate plan and cross-sectional views of a substantially circular array of seven LED die 100*a* to 100*f* electrically coupled in parallel between anode and cathode pads 184 and 186 of submount 180. In addition, an electrostatic discharge (ESD) protection device 194 may be electrically coupled between anode and cathode pads 184 and 186 via respective metallic bonds 188. ESD protection device 194 may include contacts 195 electrically and mechanically coupled to anode and cathode pads 184 and 186. As shown, all of LED die 100*a* to 100*f* may be provided within a circular area of a same lens 190. Moreover, each of the LED die 100*a* to 100*f* may share substantially a same spacing relative to a perimeter of lens 190. In contrast to the circular array of FIGS. 9A and 9*b*, each of LED die 100*a* to 100*f* of FIGS. 10A and 10B may be oriented along a same axis (e.g., the vertical axis of FIG. 10A), and anode and cathode pads 184 and 186 may be interdigitated. By providing that LED die 100*a* to 100*f* of the circular array are spaced symmetrically relative to the perimeter of lens 190, a more uniform and/or efficient light output may be provided through lens 190. As before, LED die 100*a* to 100*f* may bridge gap 196 between anode and cathode pads 184 and 186. While each LED die 100*a* to 100*f* is shown with an individual phosphor layer 140 as discussed above with respect to FIG. 1, a continuous phosphor layer may be provided over all of the LED die 100*a* to 100*f* as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100*a* to 100*f* may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100*a* to 100*f* over cathode pad 186 may be significantly greater than portions of LED die 100*a* to 100*f* over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 µm or even less than about 40µ.

In the assembly of FIGS. 10A and 10B, each LED die may have a width of about 0.35 mm and a length of about 0.47 mm, and ESD protection device 194 may have a width of about 0.3 mm and a length of about 0.6 mm. As discussed above with respect to FIGS. 3A to 3C, widths of metallic bonds (i.e., solder layers 188) between anode contacts 160 and anode pad 184 and between cathode contacts 170 and cathode pad 186 (into the plane of FIG. 7B) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100f are sufficiently spaced from a perimeter of lens 190, an efficiency of light transmission through lens 190 may be improved. While lens 190 is not shown in the cross-section of FIG. 7B, it will be understood that lens 190 may substantially form a hemisphere on submount 180 surrounding all of LED die 100a to 100f.

Figure 11A:
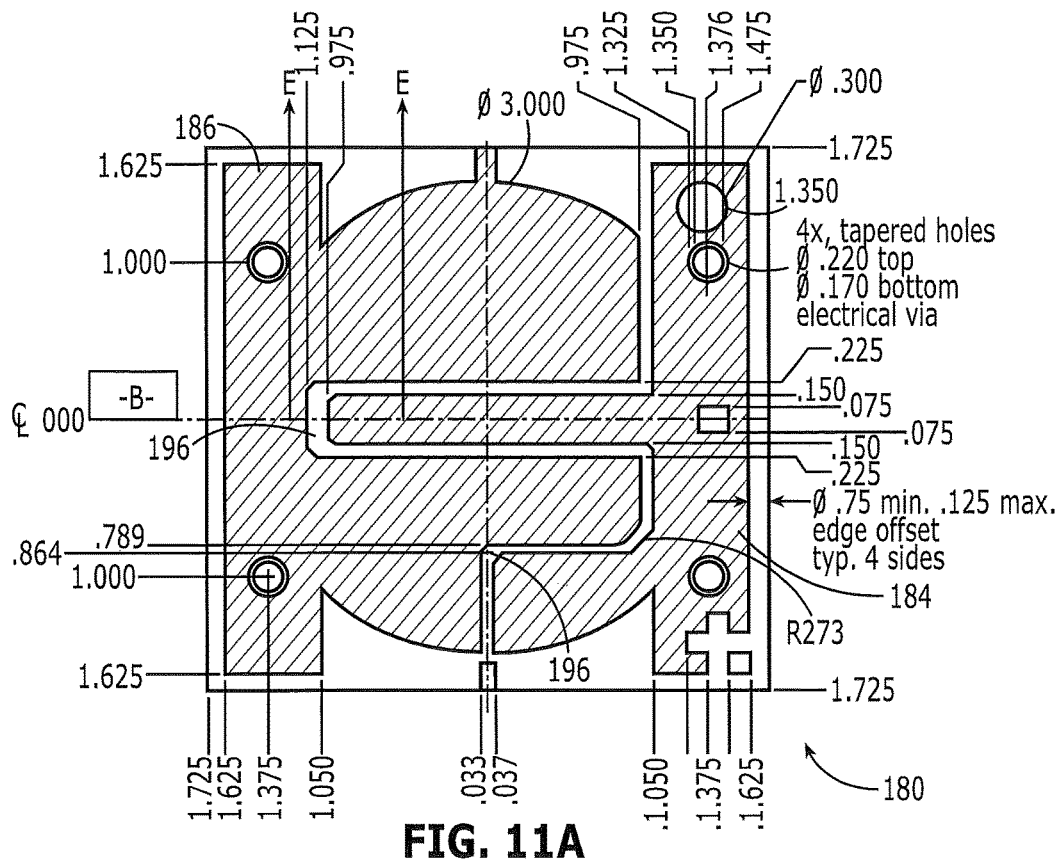
FIG. 11A is a plan view of a submount including cathode and anode pads for an array of LED die according to various embodiments described herein.
Figure 11B:
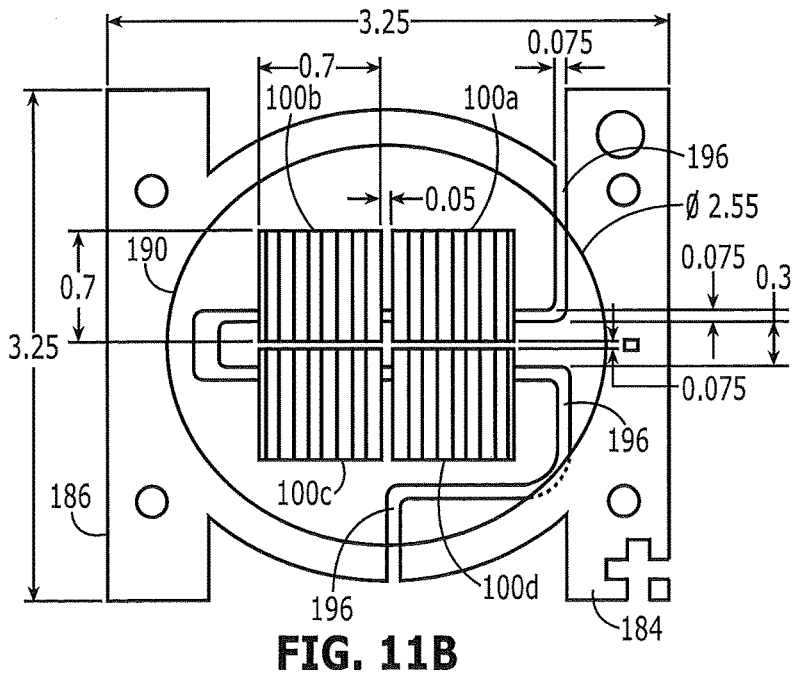
FIG. 11B is a plan view of an array of LED die electrically coupled in parallel on the submount of FIG. 11B.

FIG. 11A is a plan view of a submount 180 including anode and cathode pads 184 and 186 without LED die, and FIG. 11B is a plan view of an assembly including submount 180 with LED die 100a to 100d mounted thereon. A separate cross-sectional view is not provided for the structure of FIGS. 11A and 11B because the cross-sectional view would be substantially the same as that shown in FIG. 7A. As shown, four LED die 100a to 100d may be electrically coupled in parallel between anode and cathode pads 184 and 186 of submount 180. Moreover, portions of anode pad 184 may extend between opposing portions of cathode pad 186, and LED die 100a to 100d may bridge gap 196 between anode and cathode pads 184 and 186. Moreover, all of LED die 100a to 100d may be provided within a circular area of a same lens 190. Each LED die 100a to 100d may be provided with an individual phosphor layer 140 as discussed above with respect to FIG. 1, or a continuous phosphor layer may be provided over all of LED die 100a to 100d as discussed above with respect to FIG. 2.

As discussed above with respect to FIGS. 3A to 3C, surface areas of anode and cathode contacts (160 and 170) of LED die 100a to 100d may be asymmetric, with cathodes accounting for at least 70% of the combined contact area, at least 80% of the combined contact area, or even at least 90% of the combined contact area. Accordingly, LED die 100a to 100d may asymmetrically bridge the gap 196 between anode and cathode pads 184 and 186 of submount 180. Stated in other words, a contact area between cathode contacts and cathode pad 186 may be significantly greater than a contact area between anode contacts and anode pad 184, and portions of LED die 100a to 100d over cathode pad 186 may be significantly greater than portions of LED die 100a to 100d over anode pad 184.

As discussed above, a reflective and electrically insulating filler may be provided on submount body 182 between anode and cathode pads 184 and 186. By providing reflective filler between anode and cathode pads 184 and 186, light loss into a less reflective submount body may be reduced, and efficiency may thus be improved. A body of submount body 180, for example, may be alumina and/or aluminum nitride, and the filler may be white solder mask, a low modulus material (e.g., a silicone, a gel, etc.) loaded with titanium oxide particles, etc. A width of gap 196 (and filler therein) may be about 75 µm or less, or even less than about 40 µm. Further dimensions of submount 180 and LED die 100a to 100d are shown in FIGS. 11A and 11B with all dimensions given in units of millimeters (mm).

In the assembly of FIG. 11B, LED die 100a to 100d are arranged in a rectangular array of 2 rows and 2 columns (with each row including a same number of LED die and with each column including a same number of LED die). Spacing between adjacent columns of LED die may be about 0.05 mm, spacings between adjacent rows of LED die may be about 0.075 mm, and all of the LED die may be provided within a circular perimeter of a lens 190 having a diameter of about 2.55 mm. Each LED die may have a width of about 0.7 mm and a length of about 0.7 mm. As discussed above with respect to FIGS. 3A to 3C, widths of metallic bonds (i.e., solder layers 188) between LED anode contacts and anode pads 184 and between LED cathode contacts and cathode pads 186 (in the horizontal direction of FIG. 11B) may be at least 60% of a width of the LED die (e.g., at least 0.42 mm), at least 70% of a width of the LED die (e.g., at least 0.49 mm), or even at least 90% of a width of the LED die (e.g., at least 0.63 mm). By providing relatively large surface areas of contact, electrical and thermal resistances may be reduced. By providing that all of LEDs 100a to 100d are sufficiently spaced from a perimeter of lens 190, an efficiency of light transmission through lens 190 may be improved. While a cross-section of lens 190 is not shown, it will be understood that lens 190 may substantially form a hemisphere on submount 180 surrounding all of LED die 100a to 100d.

Figure 12A:
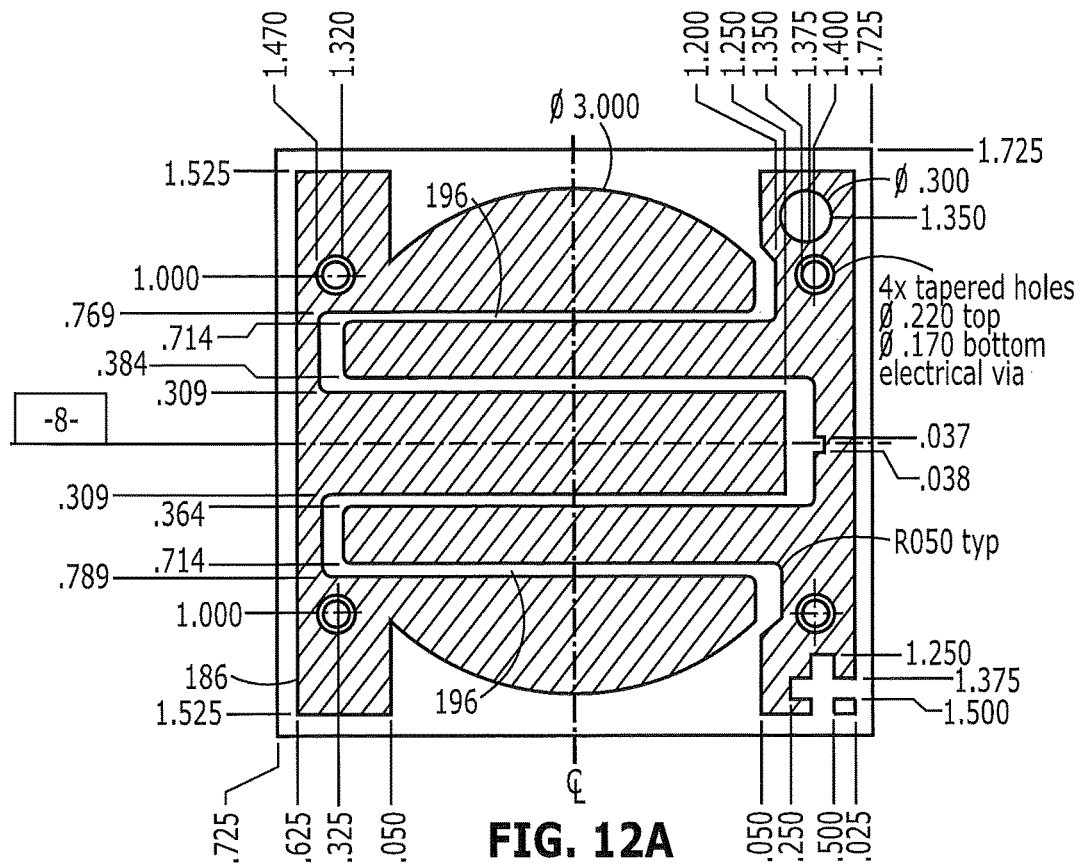
FIG. 12A is a plan view of a submount including interdigitated cathode and anode pads for an array of LED die according to various embodiments described herein.
Figure 12B:
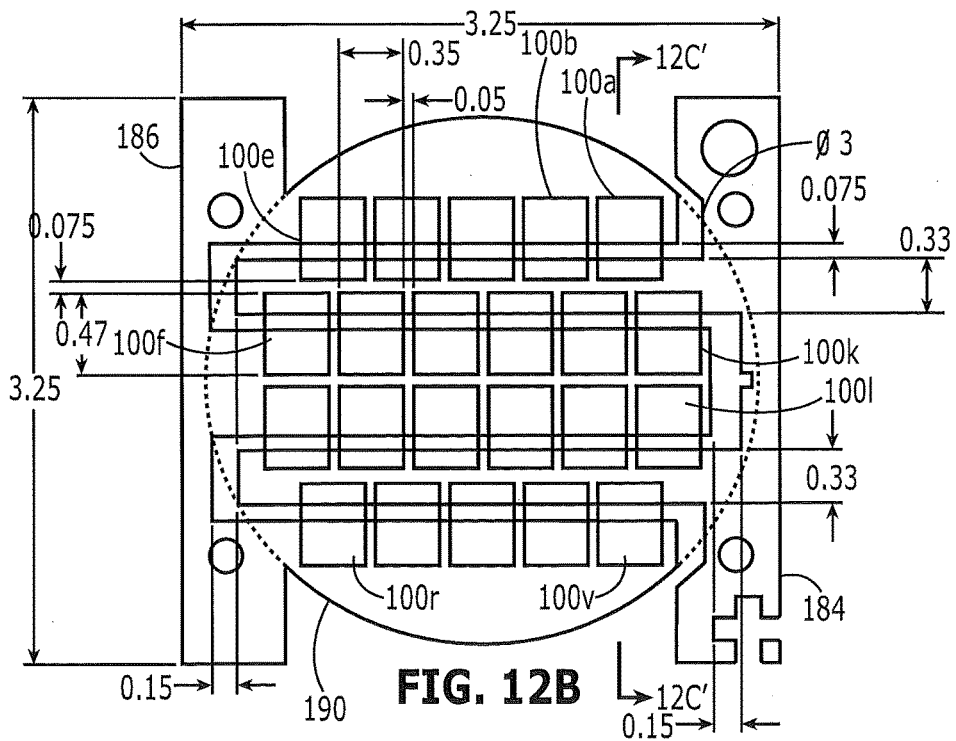
FIG. 12B is a plan view of an array of LED die electrically coupled in parallel on the submount of FIG. 12B.
Figure 12C:
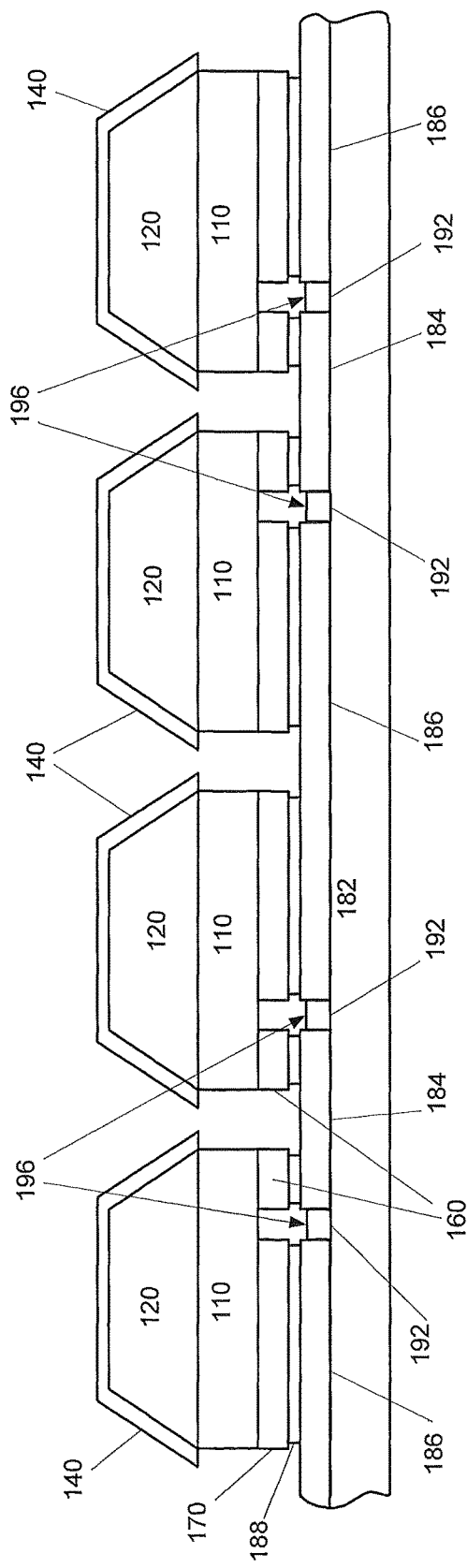
FIG. 12C is a cross-sectional view of a column of LED die from the array of FIG. 12B.

FIG. 12A is a plan view of a submount 180 including anode and cathode pads 184 and 186 without LED die, FIG. 12B is a plan view of an assembly including submount 180 with LED die 100a to 100v mounted thereon, and FIG. 12C is a cross-sectional view take through LED die 100a, 100j, 100m, and 100v (as indicated by section line 12C-12C'). In FIGS. 12A, 12B, and 12C, an array of twenty two LED die 100a to 100v are electrically coupled in parallel between anode and cathode pads 184 and 186 of submount 180. As shown, anode and cathode pads 184 and 186 may be interdigitated, and LED die 100a to 100v may bridge gap 196 between anode and cathode pads 184 and 186. Moreover, all of LED die 100a to 100v may be provided within a circular area of a same lens 190. While each LED die 100a to 100v is shown with an individual phosphor layer 140 as discussed above with respect to FIG. 1, a continuous phosphor layer may be provided over all of the LED die 100a to 100v as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100v may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100v over cathode pad 186 may be significantly greater than portions of LED die 100a to 100v over anode pad 184.

In addition, a reflective and electrically insulating filler 192 may be provided on submount body 182 between anode and cathode pads 184 and 186. By providing reflective filler 192 between anode and cathode pads 184 and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 µm or even less than about 40 µm.

In the assembly of FIGS. 12A, 12B, and 12C, LED die 100a to 100v are arranged in a linear array of four rows, and LED die of at least some adjacent rows may be offset so the array does not have conventional columns. By providing that central rows (or lines) of the array are longer than peripheral rows (or lines) of the array (e.g., that central rows include a greater number of LED die than peripheral rows), an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.075 mm, and all of the LED die may be provided within a circular perimeter of a lens 190 having a diameter of about 3 mm. Each LED die may have a width of about 0.35 mm and a length of about 0.47 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 12B and into the plane of FIG. 12C) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100v are sufficiently spaced from a perimeter of lens 190, an efficiency of light transmission through lens 190 may be improved. While lens 190 is not shown in the cross-section of FIG. 12C, it will be understood that lens 190 may substantially form a hemisphere on submount 180 surrounding all of LED die 100a to 100v.

Figure 13A:
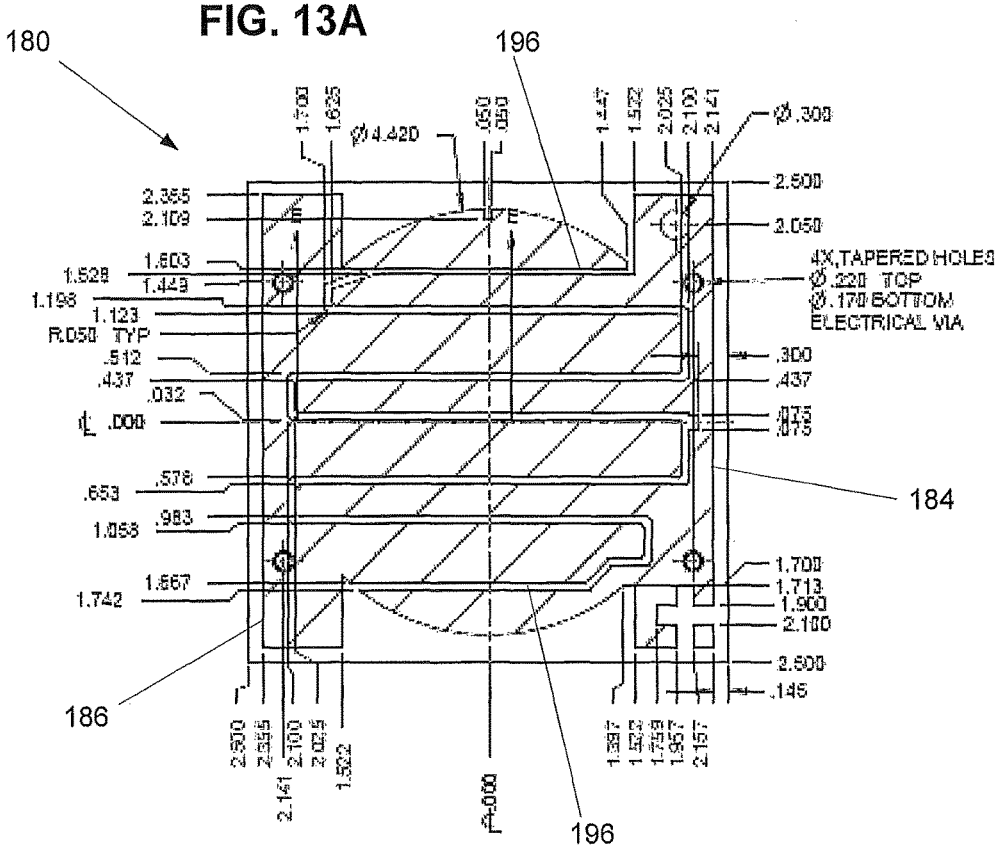
FIG. 13A is a plan view of a submount including interdigitated cathode and anode pads for an array of LED die according to various embodiments described herein.
Figure 13B:
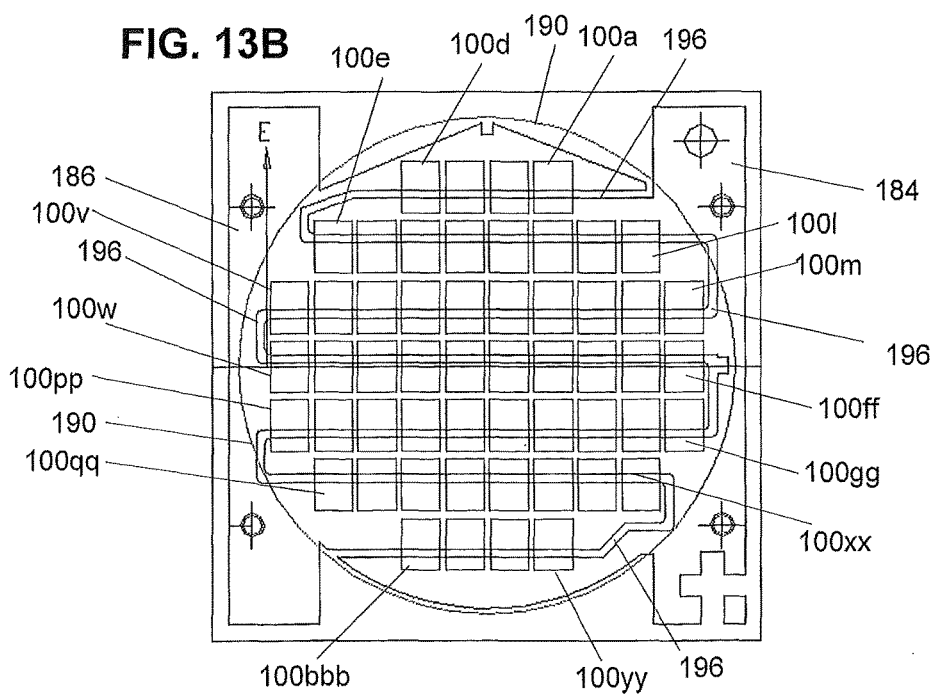
FIG. 13B is a plan view of an array of LED die electrically coupled in parallel on the submount of FIG. 13A.

FIG. 13A is a plan view of a submount 180 including anode and cathode pads 184 and 186 without LED die, and FIG. 13B is a plan view of an assembly including submount 180 with 54 LED die 100a to 100bbb mounted thereon. A separate cross-sectional view is not provided because the cross-sectional structure will be understood in light of the previously provided cross-sections. A cross-section taken through LED die 100a, 100j, 100p, and 100cc would be substantially the same as that illustrated in FIG. 12C.

In FIGS. 13A and 13B, an array of 54 LED die 100a to 100bbb are electrically coupled in parallel between anode and cathode pads 184 and 186 of submount 180. As shown, anode and cathode pads 184 and 186 may be interdigitated, and LED die 100a to 100bbb may bridge gap 196 between anode and cathode pads 184 and 186. Moreover, all of LED die 100a to 100bbb may be provided within a circular area of a same lens 190. While each LED die 100a to 100bbb may have an individual phosphor layer 140 as discussed above with respect to FIG. 1, a continuous phosphor layer may be provided over all of LED die 100a to 100bbb as discussed above with respect to FIG. 2.

As discussed above with respect to FIGS. 3A to 3C, surface areas of anode and cathode contacts of the LED die may be asymmetric, with cathode contacts accounting for at least 70% of the combined contact area, at least 80% of the combined contact area, or even at least 90% of the combined contact area. Accordingly, LED die 100a to 100bbb may asymmetrically bridge the gap 196 between anode and cathode pads 184 and 186 of submount 180. Stated in other words, a contact area between cathode contacts and cathode pad 186 may be significantly greater than a contact area between anode contacts and anode pad 184, and portions of LED die 100a to 100bbb over cathode pad 186 may be significantly greater than portions of LED die 100a to 100bbb over anode pad 184.

In addition, a reflective and electrically insulating filler may be provided on submount body 182 between anode and cathode pads 184 and 186. By providing reflective filler between anode and cathode pads 184 and 186, light loss into a less reflective submount body may be reduced, and efficiency may thus be improved. Submount body, for example, may be alumina and/or aluminum nitride, and filler may be white solder mask, a low modulus material (e.g., a silicone, a gel, etc.) loaded with titanium oxide particles, etc. A width of gap 196 (and filler therein) may be about 75 µm or less, or even less than about 40 µm.

In the assembly of FIGS. 13A and 13B, LED die 100a to 100bbb are arranged in a linear array of seven rows (or horizontal lines) and ten columns (or vertical lines). Moreover, central rows of the array are longer than peripheral rows of the array, so that central rows include a greater number of LED die than peripheral rows. Similarly, central columns of the array are longer than peripheral columns of the array, so that central rows include a greater number of LED die than peripheral columns. By providing that central rows and/or columns of the array are longer than peripheral rows and/or columns of the array, an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.075 mm, and all of the LED die may be provided within a circular perimeter of a lens 190 having a diameter of about 4.42 mm. Each LED die may have a width of about 0.35 mm and a length of about 0.47 mm. As discussed above with respect to FIGS. 3A to 3C, widths of metallic bonds (i.e., solder layers 188) between anode contacts 160 and anode pad 184 and between cathode contacts 170 and cathode pad 186 (in the horizontal direction of FIG. 12B and into the plane of FIG. 12C) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100bbb are sufficiently spaced from a perimeter of lens 190, an efficiency of light transmission through lens 190 may be improved. While lens 190 is not shown in a cross-section, it will be understood that lens 190 may substantially form a hemisphere on submount 180 surrounding all of LED die 100a to 100bbb.

FIG. 14A is a plan view of a submount 180 including anode pad 184, cathode pad 186, and island pads 185 without LED die, FIG. 14B is a plan view of an assembly including submount 180 with LED die 100a to 100p mounted thereon, and FIG. 14C is a cross-sectional view take through LED die 100c to 100f (as indicated by section line 14C-14C'). In FIGS. 14A, 14B, and 14C, an array of 16 LED die 100a to 100p are electrically coupled in series between anode and cathode pads 184 and 186 of submount 180.

More particularly, island pads 185 may provide electrical connection between LED die that are electrically adjacent in the series connection between anode and cathode pads 184 and 186. Moreover, anode, cathode and island pads 184, 186, and 185 may be separated by gaps 196 and/or reflective and electrically insulating filler 192. Electrical coupling may thus be provided from anode pad 184 through LED die 100a, 100b, 100c, . . . 100p (in alphabetical order) to cathode pad 105. Moreover, each island pad 185 may provide electrical coupling between an anode contact 160 and a cathode contact of electrically adjacent LED die, and each LED die may bridge a gap between anode, pad 184 and an island pad 185, between two island pads 185, or between an island pad 185 and cathode pad 186.

In addition, all of LED die 100a to 100p may be provided within a circular area of a same lens 190. While each LED die 100a to 100p is shown with an individual phosphor layer 140 as discussed above with respect to FIG. 1, a continuous phosphor layer may be provided over all of the LED die 100a to 100p as discussed above with respect to FIG. 2.

As discussed above with respect to FIGS. 3A to 3C, surface areas of anode and cathode contacts 160 and 170 may be asymmetric, with cathodes 170 accounting for at least 70% of the combined contact area, at least 80% of the combined contact area, or even at least 90% of the combined contact area. Accordingly, LED die 100a to 100v may asymmetrically bridge the gap 196 between anode and cathode pads 184 and 186 of submount 180. Stated in other words, a contact area between cathode contacts 170 and cathode pad 186 may be significantly greater than a contact area between anode contacts 160 and anode pad 184, and portions of LED die 100a to 100v over cathode pad 186 may be significantly greater than portions of LED die 100a to 100v over anode pad 184.

In addition, a reflective and electrically insulating filler 192 may be provided on submount body 182 between anode, island, and cathode pads 184, 185, and 186. By providing reflective filler 192 between pads 184, 185, and 186, light loss into a less reflective submount body 182 may be reduced, and efficiency may thus be improved. Submount body 182, for example, may be alumina and/or aluminum nitride, and filler 192 may be white solder mask, a low modulus material (e.g., a silicone, a gel, etc.) loaded with titanium oxide particles, etc. A width of gap 196 (and filler 192 therein) may be less than about 75 µm or even less than about 40 µm.

In the assembly of FIGS. 14A, 14B, and 14C, LED die 100a to 100p are arranged in a linear array of four rows (or horizontal lines) and four columns (or vertical lines). Moreover, central rows of the array are longer than peripheral rows of the array so that central rows have a larger number of LED die than peripheral rows, and central columns of the array are longer than peripheral columns of the array so that central columns have a larger number of LED die than peripheral columns. By providing that central rows and/or columns of the array are longer than peripheral rows and/or columns of the array, an increased number of LED die may be provided in the array while maintaining a sufficient spacing between all of the die and a perimeter of lens 190. Accordingly, a greater light output may be obtained without significantly reducing an efficiency of output from perimeter LED die of the array. As used herein, a line of LED die may refer to any linear arrangement of LED die, such as a column of LED die or a row of LED die.

Spacings between adjacent LED die in a row may be about 0.05 mm, spacings between LED die of adjacent rows may be about 0.05 mm, and all of the LED die may be provided within a circular perimeter of a lens 190 having a diameter of about 3 mm. Each LED die may have a width of about 0.35 mm and a length of about 0.47 mm. As discussed above with respect to FIGS. 3A to 3C, widths of metallic bonds (i.e., solder layers 188) between anode contacts 160 and respective pads 184/185 and between cathode contacts 170 and respective pads 185/186 (in the horizontal direction of FIG. 14B and into the plane of FIG. 14C) may be at least 60% of a width of the LED die (e.g., at least 0.21 mm), at least 70% of a width of the LED die (e.g., at least 0.25 mm), or even at least 90% of a width of the LED die (e.g., at least 0.32 mm). By providing relatively large surface areas of contact, electrical and thermal resistances may be reduced. By providing that all of LEDs 100a to 100p are sufficiently spaced from a perimeter of lens 190, an efficiency of light transmission through lens 190 may be improved. While lens 190 is not shown in the cross-section of FIG. 14C, it will be understood that lens 190 may substantially form a hemisphere on submount 180 surrounding all of LED die 100a to 100p.

Figure 15A:
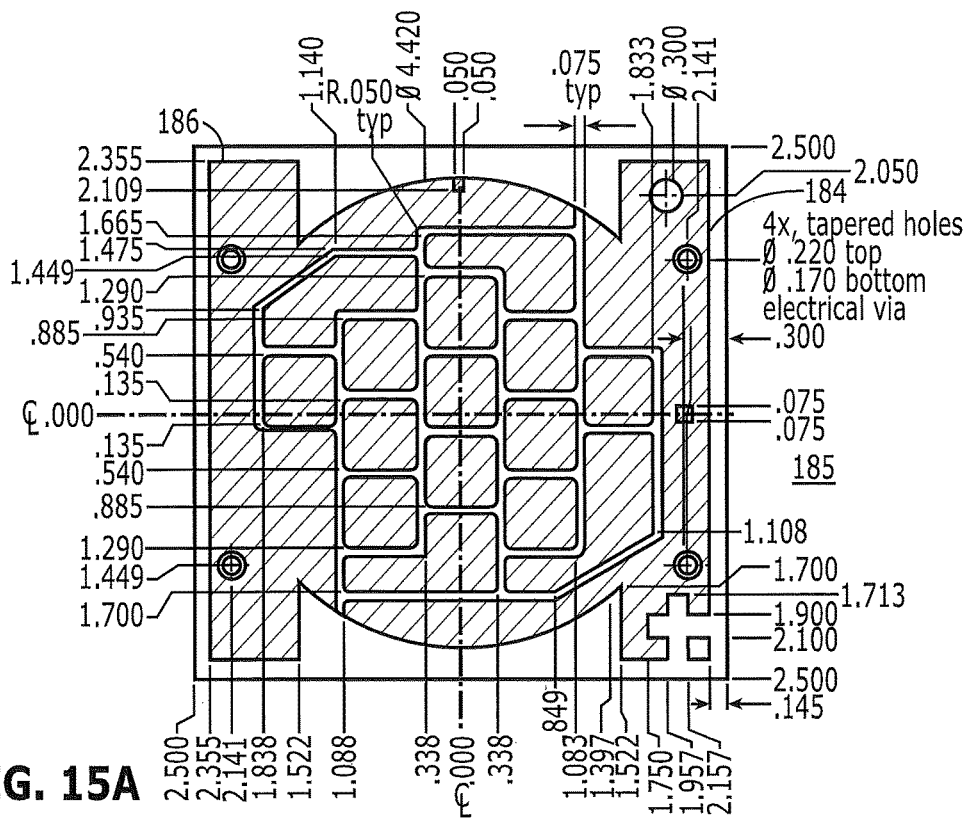
FIG. 15A is a plan view of a submount including cathode, island, and anode pads for an array of LED die according to various embodiments described herein.
Figure 15B:
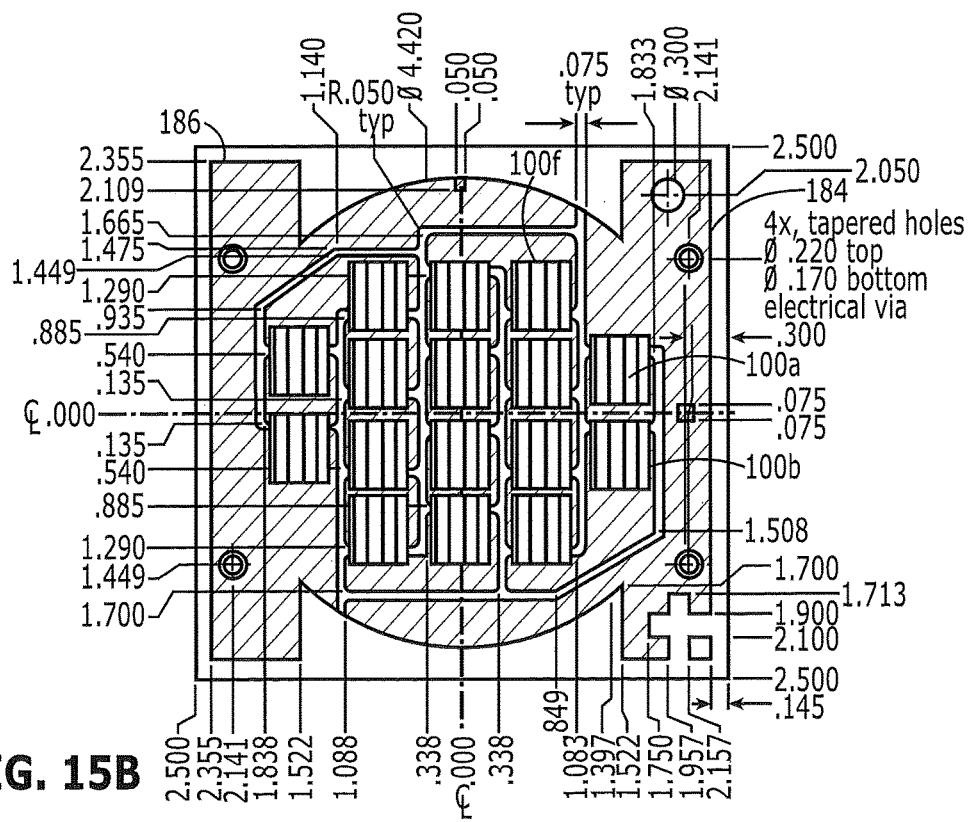
FIG. 15B is a plan view of an array of LED die electrically coupled in series on the submount of FIG. 15B.

FIG. 15A is a plan view illustrating a submount 180 with anode, island, and cathode pads 184, 185, and 186 for a series array of LED die, and FIG. 15B is a plan view of the submount of FIG. 15A populated with a serially connected array of LED die 100a to 100p. The structure of FIGS. 15A and 15B is similar to that of FIGS. 14A, 14B, and 14C, with the difference being that the submount of FIGS. 15A and 15B is provided for larger LED die having dimensions of 0.7 mm by 0.7 mm. Other dimensions of FIGS. 15A and 15B are provided in millimeters (mm). In FIG. 15B, the current path traverses vertically through each column from anode pad 184 to cathode pad 186. More particularly, the current path traverses down through the left most column (including LED die 100a to 100b), up through the next column (including LED die 100c to 100f), down through the next column (including LED die 100g to 100j), up through the next column (including LED die 100k to 100n), and down through the left most column (including LED die 100o to 100p).

Figure 16A:
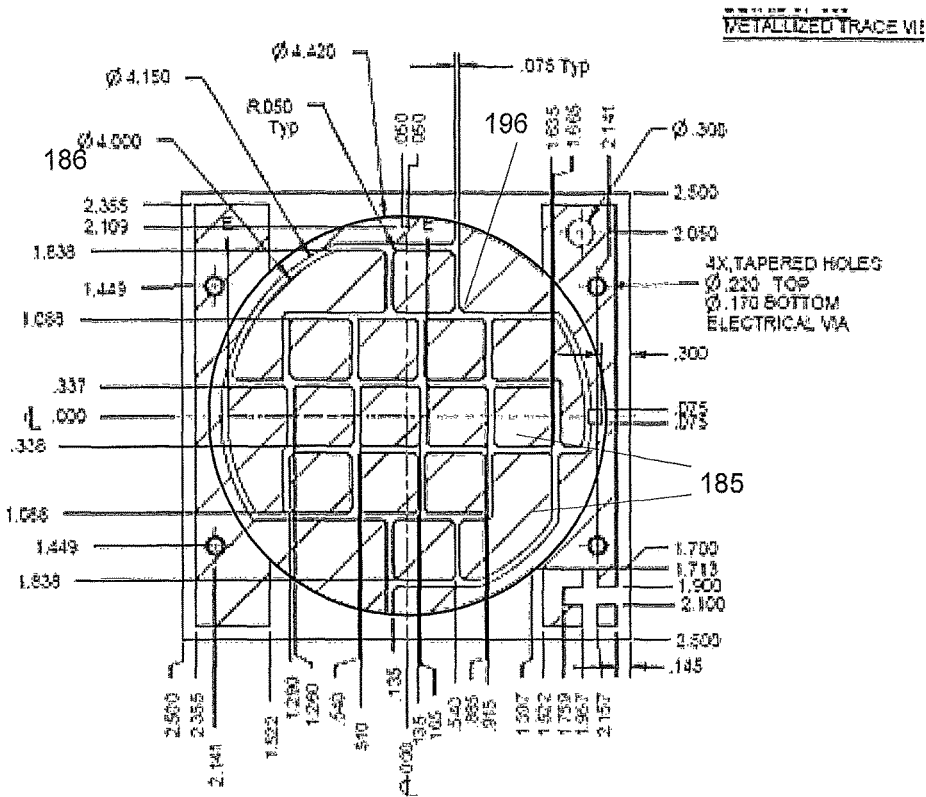
FIG. 16A is a plan view of a submount including cathode, island, and anode pads for an array of LED die according to various embodiments described herein.
Figure 16B:
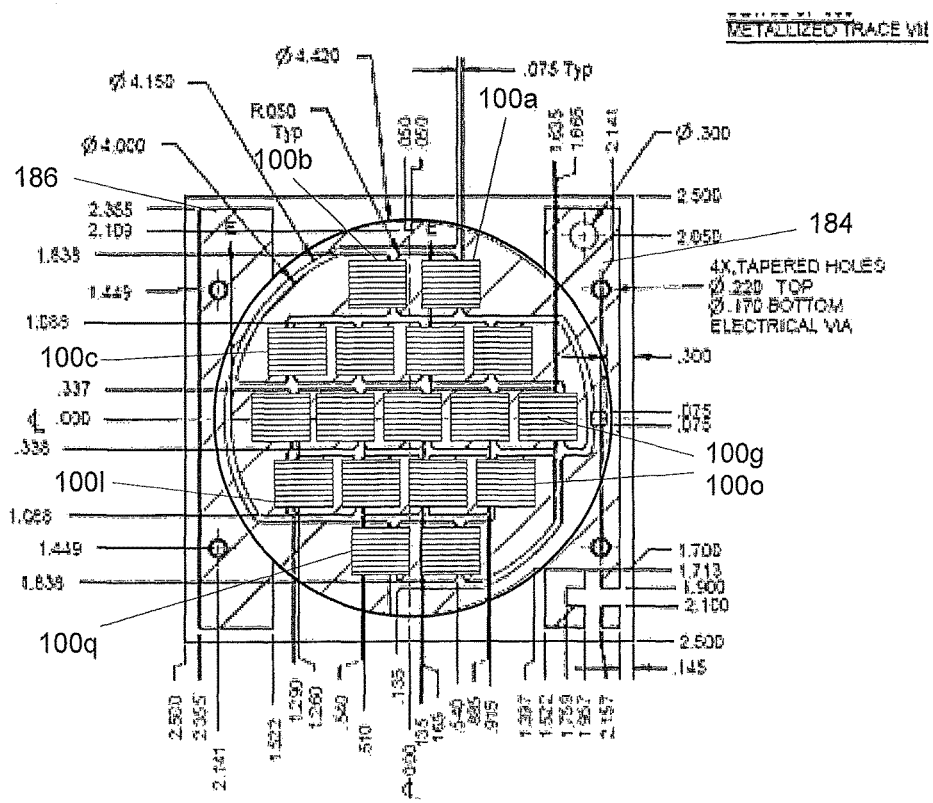
FIG. 16B is a plan view of an array of LED die with offset rows electrically coupled in series on the submount of FIG. 16B.

FIG. 16A is a plan view illustrating a submount 180 with anode, island, and cathode pads 184, 185, and 186 for a series array of LED die, and FIG. 16B is a plan view of the submount of FIG. 16A populated with a serially connected array of seventeen LED die 100a to 100q. The structure of FIGS. 16A and 16B is similar to that of FIGS. 15A and 15B, with differences being that the submount of FIGS. 16A and 16B provides horizontal current paths and offsets between LED die of adjacent rows. Dimensions of FIGS. 16A and 16B are provided in millimeters (mm). In FIG. 16B, the current path traverses horizontally through each row from anode pad 184 to cathode pad 186. More particularly, the current path traverses from right to left through the uppermost row (including LED die 100a to 100b), left to right through the next row (including LED die 100c to 100f), right to left through the next row (including LED die 100g to 100k), left to right through the next row (including LED die 100l to 100o), and right to left through the bottom most row (including LED die 100p to 100q).

Figure 17B:
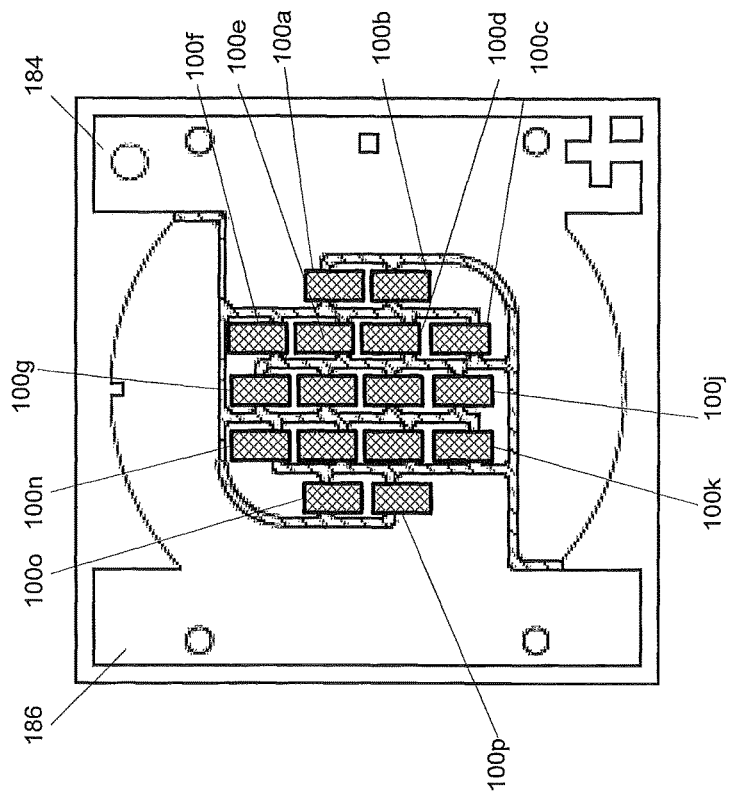
FIG. 17B is a plan view of an array of LED die with aligned rows and columns electrically coupled in series on the submount of FIG. 17B.
Figure 17A:
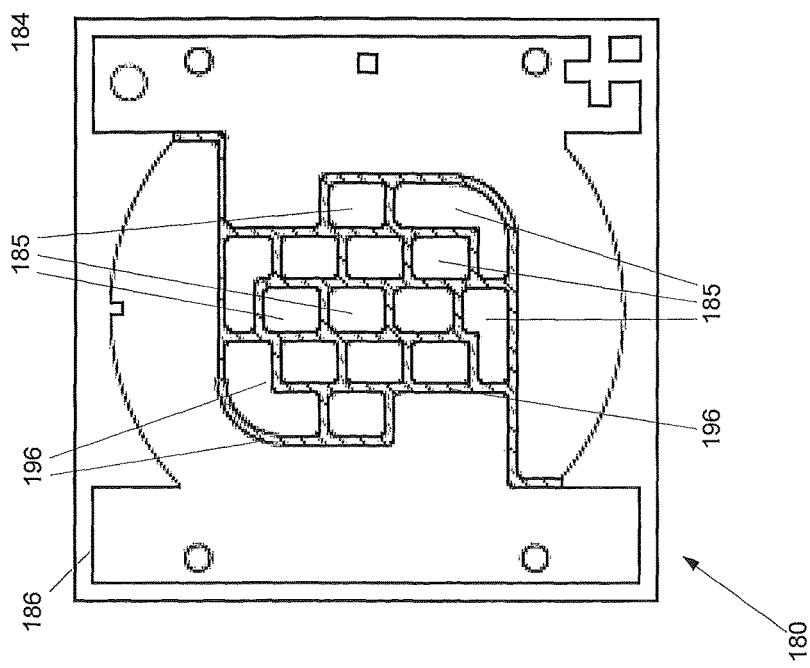
FIG. 17A is a plan view of a submount including cathode, island, and anode pads for an array of LED die according to various embodiments described herein.

FIG. 17A is a plan view illustrating yet another submount 180 with anode, island, and cathode pads 184, 185, and 186 for a series array of LED die, and FIG. 17B is a plan view of the submount of FIG. 17A populated with a serially connected array of sixteen LED die 100a to 100p. The structure of FIGS. 17A and 17B is similar to that of FIGS. 14A, 14B, and 14C. In FIG. 17B, the current path traverses vertically through each column from anode pad 184 to cathode pad 186. More particularly, the current path traverses down through the left most column (including LED die 100a to 100b), up through the next column (including LED die 100c to 100f), down through the next column (including LED die 100g to 100j), up through the next column (including LED die 100k to 100n), and down through the left most column (including LED die 100o to 100p).

Figure 19:
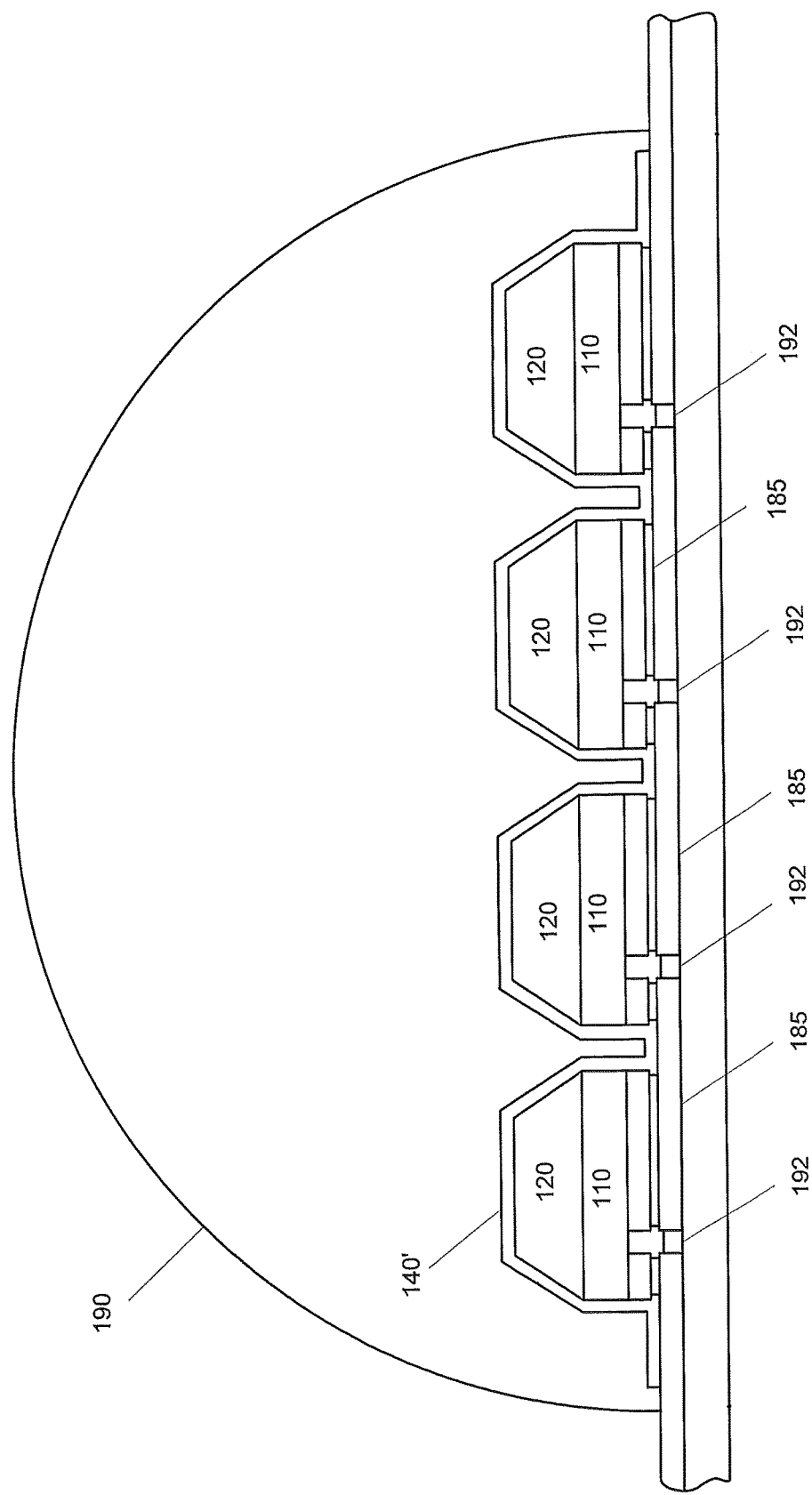
FIG. 19 is a cross-sectional view of an array of LED die with a l according to various embodiments described herein.

As discussed above, for example, with respect to FIGS. 7B, 8B, 9B, 10B, 12C, and 14C, individual phosphor layers 140 may be provided for each LED die 100. According to other embodiments, a continuous and conformal phosphor layer 140' may be provided on the array of LED die 100 and on portions of the submount between LED die as shown in FIG. 18. The conformal phosphor layer 140', for example, may have a thickness that is less than a thickness of the LED die 100 and that is less than half of a spacing between adjacent LED die 100. With either individual or continuous phosphor layers 140 or 140', a single lens 190 may be provided on the array as shown in FIG. 19. While FIGS. 18 and 19 show a series arrangement of LED die 100 on island pads 185, a continuous and conformal phosphor layer 140' and/or a lens may be provided on any of the parallel or series arrays discussed above.

According to still other embodiments, a dam 195 may surround the array of LED die 100 as shown in the cross-sectional view of FIG. 20, and the dam 195 may be used to confine a phosphor layer 140" that may be dispensed as a liquid therein and then solidified. The dam 195 and phosphor layer 140" may be substituted for a lens 190 and phosphor layer 140/140' in any of the structures discussed above. The dam 195, for example, may define a perimeter surrounding the array of LED die 100, wherein the perimeter defined by the dame 195 has a placement and dimensions corresponding to those of a perimeter of a lens 190 as discussed above with respect to FIGS. 7A, 8A, 9A, 10A, 11B, 12B, 13B, 14B, and 16B. As shown in FIG. 20, phosphor layer 140" may have a thickness that is greater than a thickness of LED die 100 (including cathode/anode contacts and bonding metal 188.) While dam 195 and thick phosphor layer 140" are shown with a series array of LED die 100 and island pads 185, dam 195 and thick phosphor layer 140" may be used with any of the parallel or series structures discussed above.

Figure 21A:
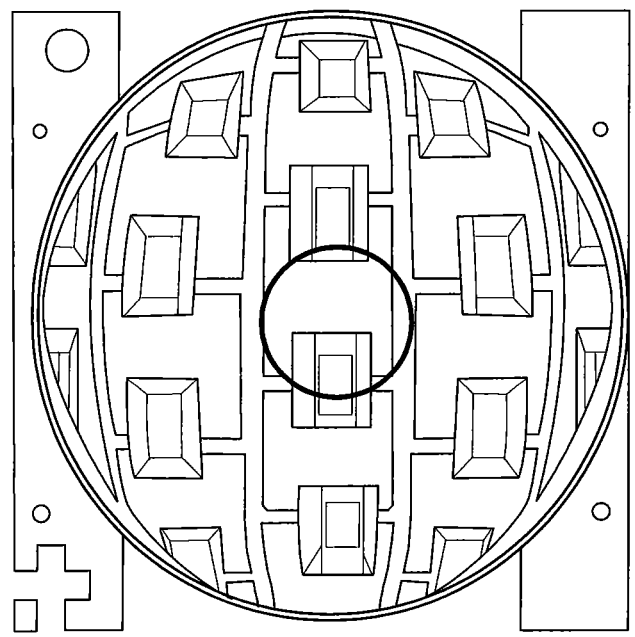
FIG. 21A is a photograph of a LED assembly including 16 LED die with a common encapsulating lens on a submount according to various embodiments described, herein.

Examples of LED assemblies according to various embodiments will now be discussed with respect to the photographs of FIGS. 21A-B and 22A-D. In FIG. 21A, an LED assembly includes an array of sixteen LED die electrically coupled in series on a submount and encapsulated in a common lens, and in FIG. 21B, the LED assembly (including submount and LED die) is shown without the lens. Electrically conductive anode, island, and cathode pads of the submount of FIGS. 21A and 21B, for example, may be provided substantially as shown in FIG. 15A (with mirror image reversal). As shown, LED die of the array may be arranged in columns (more generally referred to as lines) with the serial current path defined up and down through columns of the array. Moreover, different columns of LEDs may include different numbers of LED die and/or LED die of adjacent columns may be offset so that the relatively large array of LED die may be arranged with sufficient spacing between a perimeter of the lens and all of the LED die of the array. Accordingly, an efficiency of light output from the array of LED die through the lens may be improved.

Figure 21B:
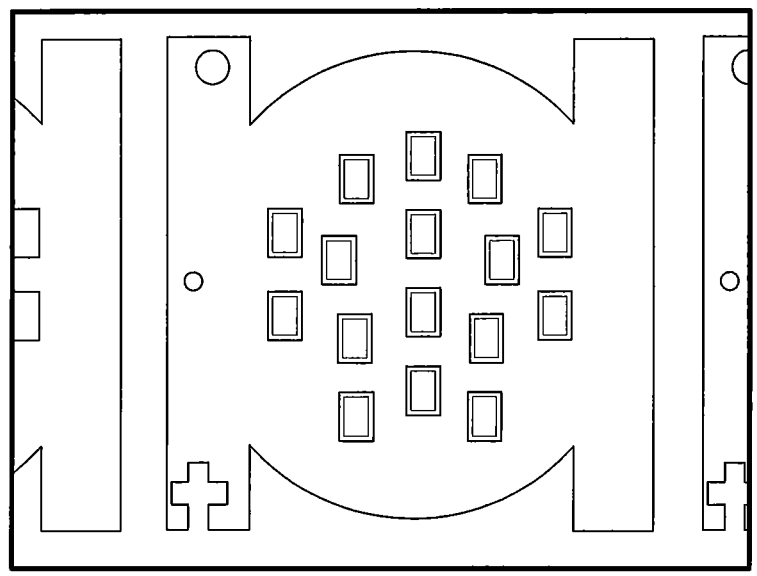
FIG. 21B is a photograph of the assembly of FIG. 21A without the encapsulating lens.

In the LED assembly of FIGS. 21A-B, sixteen LED die may be solder bonded to electrically conductive pads of the submount as discussed above, for example, with respect to FIGS. 1-6 and 15A-B. Each LED die of the array may have dimensions of about 350 micrometers by about 470 micrometers (for a surface area of about 164,500 square micrometers or about 0.1645 square mm), to provide a total active light emitting area for the LED assembly of about 2.63 square mm. The submount may have dimensions of about 5 mm by 5 mm for a surface area of about 25 square mm. Spacings between adjacent LED die may be about 425 micrometers. Moreover, LED die arrangements/spacings shown in FIG. 21B may provide improved luminous flux, for example, by reducing light absorption between LED die and/or by maintaining adequate spacings between all LED die of the array and a perimeter of the lens.

After testing, each of the 16 LED die may have a forward operating voltage Vf of about 3 volts, and the serially coupled array of the 16 LED die may have a forward operating voltage of about 46 volts. With an operating current of about 21.9 mA through the serially coupled array of 16 LED die, a forward operating voltage of about 46 volts, and a resulting power of about 1 Watt, the LED assembly of FIGS. 21A-B provided a luminous flux of about 146 lm and a color rendering index (CRI) of about 70.

Figures 22A, 22B, 22C, 22D:
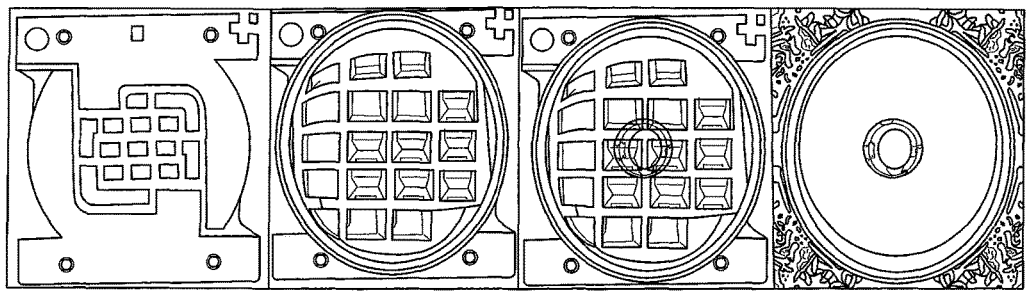
FIG. 22A is a photograph of a submount including electrically conductive pads for an array of serially connected LED die according to various embodiments described herein.
FIGS. 22B, 22C, and 22D are photographs of LED assemblies including the submount of FIG. 22A.

A similar LED assembly with a smaller submount and a serially coupled array of smaller LED die may be provided as shown in FIGS. 22A-D. In FIG. 22A, an LED submount is provided for an array of sixteen LED die electrically coupled in series, and FIG. 22B-C show arrays of LED die packaged on the submount of FIG. 22A with different lenses/phosphors. Electrically conductive anode, island, and cathode pads of the submount of FIGS. 22A-D, for example, may be provided substantially as shown in FIGS. 14A and/or 17A. As shown, LED die of the array may be arranged in rows (more generally referred to as lines) with the serial current path defined to the left and right through rows of the array. Moreover, different rows and/or columns of LEDs may include different numbers of LED die so that the relatively large array of LED die may be arranged with sufficient spacing between a perimeter of the lens and all of the LED die of the array. Accordingly, an efficiency of light output from the array of LED die through the lens may be improved.

In the LED assembly of FIGS. 22A-D, sixteen LED die may be solder bonded to electrically conductive pads of the submount as discussed above, for example, with respect to FIGS. 1-6, 14A-C, and 17A-B. Each LED die of the array may have dimensions of about 240 micrometers by about 470 micrometers (for a surface area of about 76,800 square micrometers or about 0.0768 square mm), to provide a total active light emitting area for the LED assembly of about 1.23 square mm. The submount may have dimensions of about 3.5 mm by 3.5 mm for a surface area of about 12.25 square mm. Moreover, LED die arrangements/spacings for the LED arrays of FIGS. 22A-D may provide improved luminous flux, for example, by reducing light absorption between LED die and/or by maintaining adequate spacings between all LED die of the array and a perimeter of the lens.

After testing, each of the 16 LED die may have a forward operating voltage Vf of about 3.08 volts, and the serially coupled array of the 16 LED die may have a forward operating voltage of about 49.4 volts. With an operating current of about 21.9 mA through the serially coupled array of 16 LED die, a forward operating voltage of about 49.4 volts, and a resulting power of about 1.08 Watts (electrical Watts) consumed by the array of 16 LED die, the LED assembly of FIG. 22B provided a radiant flux of about 537 mW at a wavelength of 454 nm, the LED assembly of FIG. 22C provided a cool white output measured as 133 lumens at 6500K, and the LED assembly of FIG. 22D provided a warm white output measured as 104 lumens at 3080K. The different outputs of the assemblies of FIGS. 22B-D resulted from different phosphor combinations/compositions/concentrations/etc. used with the different assemblies. Measured individually, each LED die of FIGS. 22B-D may generate a light output having a wavelength of about 454 nm with an operating current of about 20 ma at a power of about 32 mw.

Accordingly, some embodiments may enable relatively small area LED submounts (e.g., 25 square mm or less, or even 12.25 square mm or less) for higher voltage application LED arrays. Such LEDs, for example, may provide Vfs of at least about 12V, at least about 24V, at least about 36V, at least about 42V, at least about 48V, at least about 50V, or even greater than 54V (assuming that each LED die has a Vf of about 3 V) with corresponding higher efficiencies due to lower current requirements. Certain embodiments may enable very high voltage operation (e.g., greater than about 45V as discussed above with respect to FIGS. 21A-B and 22A-D) with efficiency numbers for individual LED die as set forth, for example, in U.S. application Ser. No. 13/018,013 filed Jan. 31, 2011, the disclosure of which is hereby incorporated herein in its entirety by reference.

According to some embodiments discussed above, LED assemblies may include serially coupled LED die on a submount having a total surface area in the range of about 0.5 square mm to about 5.0 square mm, and more particularly, in the range of about 1 square mm to about 3 square mm. Each individual LED die have a surface area in the range of about 0.01 square mm to about 0.3 square mm, and more particularly, in the range of about 0.05 square mm to about 0.2 square mm. Accordingly, a serially coupled array of 16 LED die may provide a combined LED die surface area in the range of about 0.16 square mm to about 4.8 square mm, and more particularly, in the range of about 0.8 square mm to about 3.2 square mm. With an array of 16 LED die electrically coupled in series, the array may provide a total forward operating voltage greater than about 45 volts, greater than about 48 volts, greater than about 50 volts, or even greater than about 54 volts. As discussed above, the LED die may be solder bonded to submount pads eliminating wirebonds between LED die of the array and improving electrical coupling between LED die of the array.

The numerous embodiments discussed above may thus provide an electronic device including a plurality of light emitting diode (LED) die electrically and mechanically bonded to a submount, with each LED die including a diode region, an anode contact, and a cathode contact. More particularly, each LED die may include the diode region having first and second opposing faces and including therein an n-type layer and a p-type layer with the first face between the second face and the packaging substrate. The anode contact of each LED die may ohmically contact the p-type layer and may extend on the first face between the first face and the packaging substrate, and the cathode contact may ohmically contact the n-type layer and may extend on the first face between the first face and the packaging substrate. Moreover, adjacent LED die may be spaced apart by distances in the range of about 20 micrometers to about 500 micrometers, by distances in the range of about 40 micrometers to about 150 micrometers, or even by distances in the range of about 50 micrometers to about 100 micrometers.

These electronic devices may be assembled by sequentially (and individually) placing each of a plurality of light emitting diode (LED) die on the submount, and by performing a reflow operation to provide a metallic bond between anode and cathode contacts of each of the LED die and the submount. Moreover, the metallic bonds may be provided using eutectic solder bonds. By sequentially/individually placing relatively small LED die, the LED die can be individually tested to provide improved yield relative to large area LED die and/or relative to arrays of LED die maintained on a growth substrate during placement operations. According to some embodiments, flux may be provided between the LED die and the submount, and the reflow operation may be performed after placing all of the LED die on the submount. According to some other embodiments, a temperature of the submount may be maintained above a reflow temperature for metallic bonding while the plurality of LED die are placed on the submount.

The plurality of LED die may be electrically coupled in series, wherein each of the plurality of LED die has a forward operating voltage in the range of about 2 volts to about 4 volts, and wherein a forward operating voltage of the serially coupled plurality of LED die is at least about 12 volts. More particularly, each of the LED die may have a forward operating voltage in the range of about 2.5 volts to about 3.5 volts (e.g., about 3 volts), and the forward operating voltage of the serially coupled plurality of LED die may be at least about 12 volts, at least about 24 volts, at least about 36 volts, at least about 48 volts, or even at least about 54 volts. For example, the plurality of serially coupled LED die may include at least about 4 LED die, at least about 8 LED die, at least about 12 LED die, or even at least about 16 LED die.

According to some other embodiments, the plurality of LED die may be electrically coupled in parallel. By using an array of a larger number of smaller LED die in parallel as opposed to using fewer or even one larger LED die, an effective yield of LED die may be improved because a larger percentage of a fabrication wafer will be converted to useful LED die when smaller die are produced. For example, the plurality of parallel LED die may include at least about 4 LED die, at least about 8 LED die, at least about 12 LED die, or even at least about 16 LED die. Going to LED die sizes beyond 1 mm or 1.4 mm may be prohibitive from a cost and manufacturing perspective to provide desired performance and light extraction. Instead of a 1.4 mm LED die, for example, four 700 micrometer LED die may be used. Die yield percentage per wafer may increase as LED die size is reduced. For a 700 micrometer LED die, an extraction efficiency per chip may improve because the rations of outer to inner surface is reduced. Increasing a thickness of a large LED die (e.g., a 1.4 mm LED die) to increase extraction efficiency may be impractical due to costs for dicing saw blades and for starting substrate thickness.

Moreover, the plurality of LED die may be bonded to a surface of the submount having a surface are of less than about 85 $mm^2$, less than about 65 $mm^2$, less than about 30 $mm^2$, or even less than about 15 $mm^2$. As noted above, arrays of LED die including at least 4, at least 8, at least 12, or even at least 16 LED die may be provided on these relatively small submounts.

Gap Engineering for Flip-Chip Mounted Horizontal LEDs

Various embodiments that will now be described can configure a gap that extends between the closely spaced apart anode and cathode contacts of the LED die and between the closely spaced apart anode and cathode pads of the mounting substrate, so as to prevent sufficient encapsulant from entering the gap that would degrade operation of the light emitting device.

Specifically, as has been described extensively above, a flip-chip horizontal LED can provide an efficient, robust and reliable light emitting component. Since the horizontal flip-chip LED can provide a large area die attach, a high die shear strength may be obtained, for example through a eutectic die attach on an appropriate, thermally matched substrate.

Various embodiments that will now be described may arise from recognition that achieving a high die shear strength using an appropriate die attach on an appropriate thermally matched substrate may be necessary, but may not be sufficient, to provide a highly reliable flip-chip mounted horizontal LED. More specifically, various embodiments described herein may arise from recognition that encapsulant that is provided between the lens and mounting substrate, after the light emitting diode die is flip-chip mounted on the mounting substrate, may encroach under the LED die during or after the encapsulation process. If the amount of encroaching encapsulant is too high, it can weaken the die attach upon curing, since the encapsulant generally expands when it cures or hardens. When the encapsulant expands, what was thought to be a reliable bonding between the light emitting diode die and the mounting substrate may degrade during subsequent packaging that includes placing a lens on the mounting substrate with an encapsulant between the lens and the mounting substrate. Various embodiments described herein can provide "gap engineering" to prevent sufficient encapsulant from entering the gap that would degrade operation of the light emitting device. The maximum amount of encapsulant that is allowable in the gap may be a function of the adhesion between the die and the substrate at all relevant interfaces, such as the adhesion between the die and the anode and cathode contacts, the adhesion between the substrate and the anode and cathode pads, the adhesion of the bond between the anode and cathode contacts and the anode and cathode pads, and the encapsulant properties. For example, more encapsulant may be allowed to enter the gap if the encapsulant is very soft or has a low expansion during curing, while less encapsulant may be allowable in the gap when the die shear strength is low. Various detailed embodiments of gap engineering will now be described.

Figure 23A:
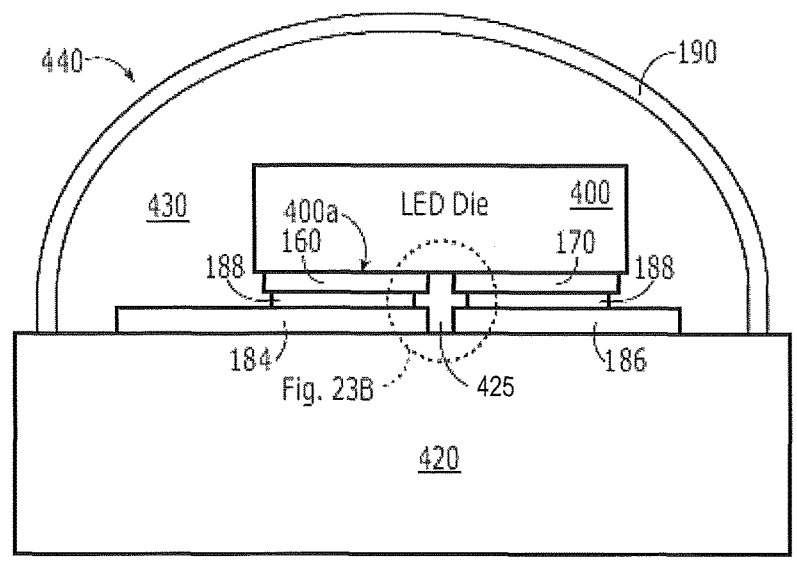
FIG. 23A is a cross-sectional view of a packaged light emitting device according to various embodiments described herein.
Figure 23B:
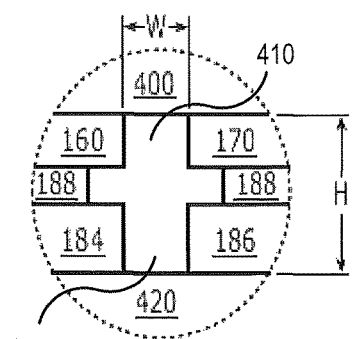
FIG. 23B is an enlarged view of the area surrounding a gap illustrated in FIG. 23A.

FIG. 23A is a cross-section of a light emitting device including an engineered gap according to various embodiments described herein, and FIG. 23B is an enlarged view of the area surrounding the gap. Referring to FIGS. 23A and 23B, a horizontal flip-chip mounted LED die 400 is provided, for example, according to any of the embodiments of FIGS. 1-22. The LED die 400 may include a diode region having first and second opposing faces including therein an n-type layer and a p-type layer, a substrate and/or a conformal layer that comprises phosphor according to any of the embodiments described herein, or may be configured according to any other configuration of a horizontal flip-chip mounted LED die. As shown in FIG. 23A, the LED die 400 includes closely spaced apart anode and cathode contacts 160, 170, respectively, that extend along a face 400a thereof.

A mounting substrate 420 is also provided according to any of the embodiments described herein, or any other mounting substrates for LEDs. The mounting substrate 420 may also be referred to herein as a "submount". The mounting substrate 420 includes closely spaced apart anode and cathode pads 184 and 186, respectively, on a face 420a thereof. The light emitting diode die 400 is flip-chip mounted on the mounting substrate 420, such that the anode contact 160 is adjacent and conductively bonded to the anode pad 184, and the cathode contact 170 is adjacent and conductively bonded to the cathode pad 186. The bonding may be a direct bond or a bond using a die attach material 188, according to any of the embodiments described herein or other attachment techniques.

As shown in FIGS. 23A and 23B, the flip-chip bonding defines a gap 425. The gap 425 extends along the face 400a and includes a gap 410 between the closely spaced apart anode and cathode contacts 160 and 170 on the LED die 400, respectively, and a gap 196 between the closely spaced apart anode and cathode pads 184 and 186 on the mounting substrate 420, respectively. Accordingly, as shown in FIG. 23B, the gap 425 may define a gap height H and a gap width W. It will be understood that the width W of the gap 425 need not be uniform throughout the height H of the gap and/or the height H need not be uniform throughout the width W. For example, the spacing between the anode and cathode pads 160 and 170 may be different than the spacing between the anode and cathode contacts 184 and 186, or the die attach material 188 may also have a different gap width. In that case, the width W of the gap 425 may be considered as the width of the wider of the two gaps 196, 410.

In some embodiments, a ratio of the width of the gap 410 on the LED die 400 to the width of the gap 196 on the mounting substrate 420 may be about 1 (i.e. the gap 196 and the gap 410 have about the same width). In other embodiments, the ratio of the width of the gap 410 on the LED die 400 to the width of the gap 196 on the mounting substrate 420 may be less than 1 (i.e., the gap 410 on the LED die 400 is smaller than the gap 196 on the mounting substrate 420). In particular embodiments, the ratio of the width of the gap 410 on the LED die 400 to the width of the gap 196 on the mounting substrate 420 may be about 0.5 to 1.

In particular, the gap 410 on the LED die 400 may have a narrower width than the gap 196 on the mounting substrate 420. In some embodiments, the width of the gap 410 on the LED die 400 may be about 75 µm or less, while the width of the gap 196 on the mounting substrate 420 may be greater than 75 µm. In some embodiments, the width of the gap 410 on the LED die 400 may be about 50 µm or less, while the width of the gap 196 on the mounting substrate 420 may be greater than 50 µm.

In some embodiments, the width of the gap 410 on the LED die 400 may be at least about 10 µm less than the width of the gap 196 on the mounting substrate 420. In some embodiments, the width of the gap 410 on the LED die 400 may be at least about 20 µm less than the width of the gap 196 on the mounting substrate 420, and in some embodiments, the width of the gap 410 on the LED die 400 may be at least about 30 µm less than the width of the gap 196 on the mounting substrate 420.

In particular embodiments, the width of the gap 410 on the LED die 400 may be about 50 µm, while the width of the gap 196 on the mounting substrate 420 may be about 60 µm.

Reducing the width of the gap 410 on the LED die 400 may help to ensure a greater area of contact between the anode and cathode contacts 160 and 170 on the LED die 400 and the anode and cathode pads 184 and 186 on the mounting substrate 420, respectively. Further, reducing the width of the gap 410 on the LED die 400 may reduce the overall volume of the gap 425, which may reduce the amount of encapsulant material that can enter the gap 430.

Figure 24A:
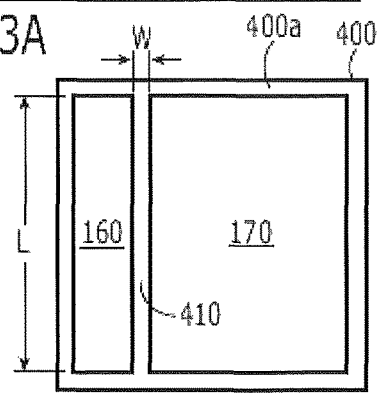
FIG. 24A is a bottom view of an LED of FIG. 23A according to various embodiments described herein.
Figure 24B:
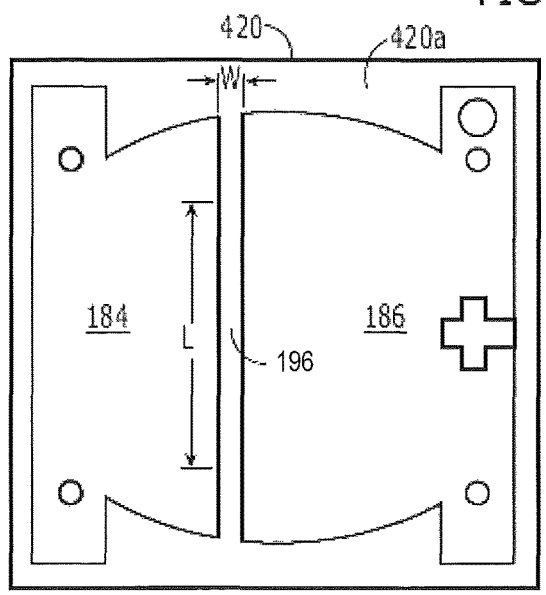
FIG. 24B is a top view of a mounting substrate of FIG. 23A according to various embodiments described herein.
Figure 25A:
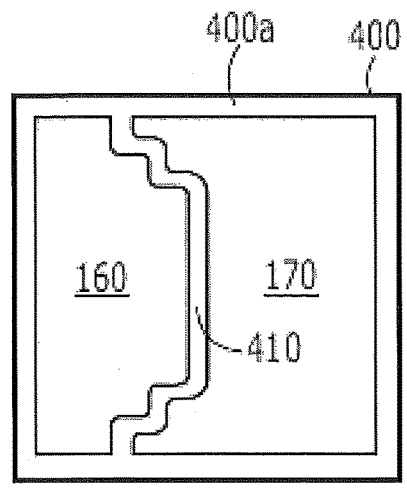
FIG. 25A is a bottom view of an LED of FIG. 23A according to various other embodiments described herein.
Figure 25B:
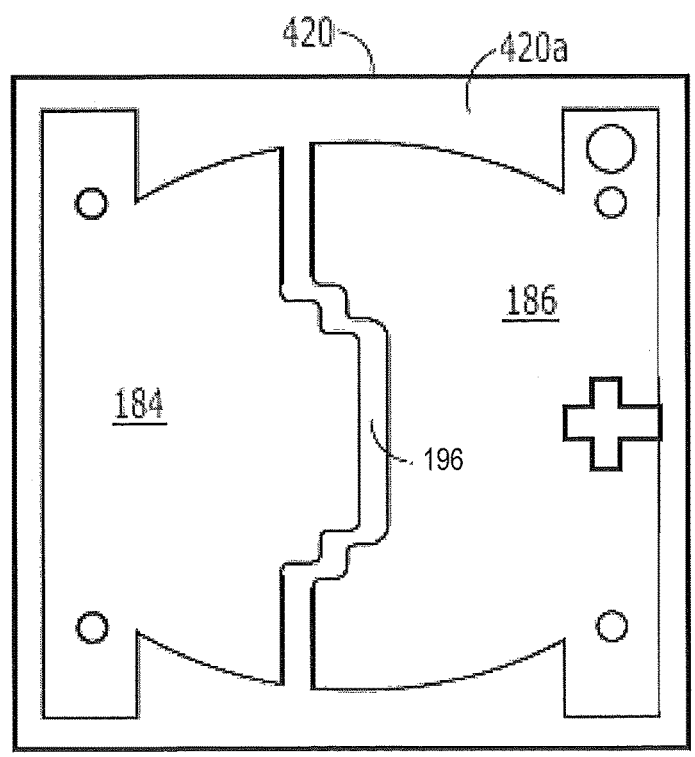
FIG. 25B is a top view of a mounting substrate of FIG. 23A according to various other embodiments described herein.

FIG. 24A is a bottom view of the LED die 400, similar to that which was illustrated in FIG. 3C above. This bottom view illustrates that the gap 410 also includes a length L. Moreover, FIG. 24B is a top view of the mounting substrate 420, which also illustrates the length L of the gap 425. Typically, the substrate 420 has a larger area than the LED die 400, so that the gap length L of the gap 425 is defined by the length of the gap of the LED die 400, as illustrated in FIG. 24A.

Continuing with the description of FIGS. 23A and 23B, a lens 190 extends from the mounting substrate 420 to surround the light emitting diode die 400, according to any of the embodiments described herein and/or other lens configurations. An encapsulant 430 is provided between the lens 190 and the mounting substrate 420, according to any of the embodiments described herein and/or according to other encapsulation techniques.

Still referring to FIGS. 23A and 23B, the gap 425 is configured to prevent sufficient encapsulant 430 from entering the gap 425 that would degrade operation of the light emitting device 440. Specifically, it is known to provide a robust attachment of the anode and cathode pads 160 to the face 400a of the LED die 400, of the anode and cathode contacts 184 and 186 to the face 420a of the mounting substrate 420, and of the die attach material or other bond 188 between the anode and cathode contacts 160 and 170 and the anode and cathode pads 184 and 186, so as to provide sufficient die shear strength to withstand the thermal expansions and/or mechanical stresses that may take place during operation of the light emitting device 440. However, various embodiments described herein also recognize the existence of a unique problem that occurs after flip-chip mounting the LED die 400 on the mounting substrate 420 during the encapsulation or subsequent processes. For example, liquid injection molding, thermocompression molding and/or other molding processes may be used to form the lens 190 and/or to bond the lens 190 onto the substrate 420 with encapsulation material filling the space between the lens 190 and the substrate 420, as described, for example, in U.S. Pat. No. 7,709,853, issued May 4, 2010 to Medendorp, Jr., entitled Packaged Semiconductor Light Emitting Devices Having Multiple Optical Elements; U.S. Pat. No. 7,763,478, issued Jul. 27, 2010 to Loh et al., entitled Methods of Forming Semiconductor Light Emitting Device Packages by Liquid Injection Molding; U.S. Pat. No. 7,850,887, issued Dec. 14, 2010 to Loh et al., entitled Thermocompression Molding of Plastic Optical Elements; and Loh et al., U.S. Patent Application Publication 2008/0191225, published Aug. 14, 2008, entitled Methods of Forming Packaged Semiconductor Light Emitting Devices Having Front Contacts by Compression Molding, the disclosures of all of which are hereby incorporated herein in their entirety by reference. Unfortunately, during the encapsulation process, some of the encapsulation material 430 may enter the gap 425. Moreover, during a subsequent curing or hardening, the encapsulant 430 generally expands. Thus, the encapsulant in the gap 425 may expand sufficiently, so as to degrade operation of the light emitting device 440 and, in an extreme case, may cause the LED die 400 to debond from the substrate 420.

Various embodiments described herein can provide gap engineering, so as to configure the gap 425 to prevent sufficient encapsulant 430 from entering the gap that would degrade operation of the light emitting device 430.

Various embodiments of gap engineering will now be further described in connection with FIGS. 25A-27B. In general, gap engineering may be provided by geometrically configuring the gap 425 to prevent sufficient encapsulant 430 from entering the gap that would degrade operation of the light emitting device 440, and/or by providing a filler material that is different from the encapsulant 430 in the gap, to prevent sufficient encapsulant 430 from entering the gap 425 that would degrade operation of the light emitting device 440.

Various embodiments of geometric configuration will now be described. Geometric configuration can involve the configuration of the height, width, length, aspect ratio and/or shape of the gap.

Gap Width:

In general, the gap width W should be minimized so as to provide a smaller gap opening and limit the amount of encapsulant 430 that can penetrate into the gap 425. In some embodiments, the gap should be no wider than 100 µm. There may also be a limit on how small the gap width W can be. In particular, too low a gap width may cause problems with migration of metal in the pads 160/170 or contacts 184/186, and/or may produce arcing between the anode and cathode contacts 184/186 or between the anode and cathode pads 160/170. Accordingly, in some embodiments, a minimum width of 10 µm may be provided. In some embodiments, the maximum width W is less than 75 µm and, in other embodiments, less than 40 µm, as was described above.

Height:

The height H also may be configured to be sufficiently large, so that any encapsulant 430 that enters the gap 425 will not fill the entire gap 425. The encapsulant can then expand upward or downward along the height direction, without completely filling the gap 425 and degrading the operation of the light emitting device. In some embodiments, the minimum height may be at least 30 µm, and the minimum height may be between 30 µm and 200 µm in some embodiments. In some embodiments, the height H may be controlled by controlling the thickness of the pads 160/170, the contacts 184/186, the bond 188 and/or by providing other standoff features.

Aspect Ratio:

In some embodiments, the aspect ratio, i.e., the ratio of height H to width W, should be at least 0.4, so as to allow expansion for any encapsulant that enters the gap 425. In some embodiments, aspect ratios between 0.4 and 4 may be provided. In particular embodiments, the aspect ratio of the gap 425 may be between about 0.8 and 1.2.

Cross-Sectional Area:

In some embodiments, the cross-sectional area of the gap, i.e., the product of H×W, should be less than 40,000 µm², so as to make it more difficult for the encapsulant 430 to enter the gap. In some embodiments, the cross-sectional area may vary between 2000 µm² and 40,000 µm². In still other embodiments, the cross-section of the gap can be a shape other than rectangular, e.g., trapezoidal or curved.

Length:

In yet other embodiments, the length L of the gap may be increased, so that the encapsulant 430 does not penetrate the gap 425 along its entire length L, and the encapsulant 430 that penetrates into the gap 425 can expand along the portion of the length L that is not penetrated. The length L may be increased by providing a curved gap length, as illustrated, for example, in FIGS. 25A and 25B. The gap 425 may be curved along a portion thereof, to increase the gap length L. Thus, the long path may allow the encapsulant to expand laterally, out from under the die, rather than vertically, against the die. Moreover, corners may be provided to block further penetration of the encapsulant into the gap, as illustrated in FIGS. 24A and 24B, and as also illustrated in FIGS. 10-12 and 13-17.

Figure 26A:
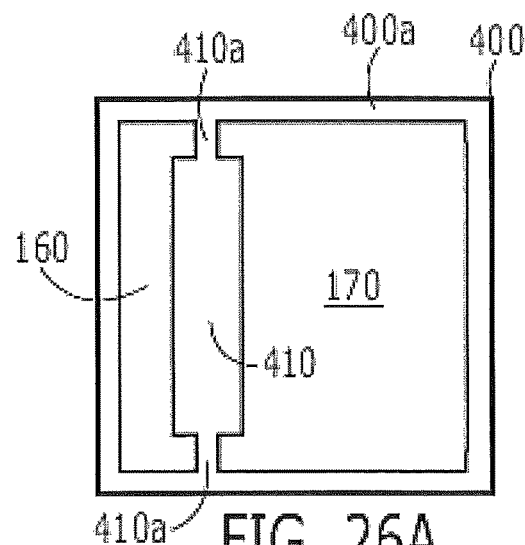
FIG. 26A is a bottom view of an LED of FIG. 23A according to still other embodiments described herein.
Figure 26B:
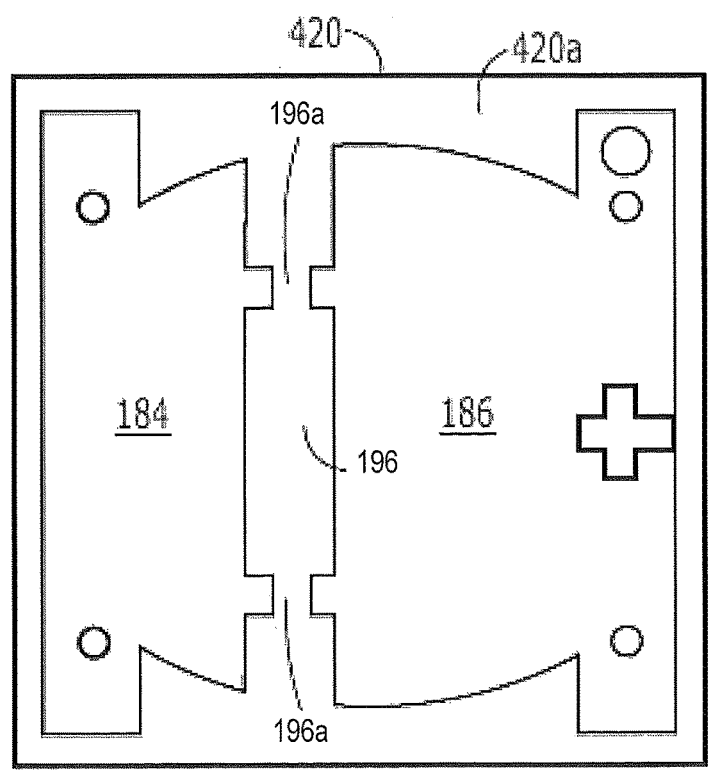
FIG. 26B is a top view of a mounting substrate of FIG. 23A according to still other embodiments described herein.

Constricted Opening:

FIGS. 26A and 26B illustrate a gap 410 that includes a constricted opening 410a at one or more ends thereof. Specifically, the gap 410 may include first and second gap ends 410a and a gap body therebetween that is of larger cross-sectional area than the gap ends 410a. Similarly, the gap 196 on the mounting substrate 420 may include first and second gap ends 196a and a gap body therebetween that is of larger cross-sectional area than the gap ends 196a. Accordingly, the gap 425 formed when the LED die 400 is mounted on the mounting substrate 420 may have constricted openings. By constricting one or more of the gap openings, the amount of encapsulant that enters the gap 425 may be reduced or prevented.

It will also be understood that the above described and various other embodiments of gap geometry may be combined in various combinations and subcombinations.

In other embodiments, gap engineering can configure the gap to prevent sufficient encapsulant from entering the gap that would degrade operation of the light emitting device by providing a filler material that is different from the encapsulant in the gap. The filler material may be selected so as not to expand unduly during subsequent processing.

Figure 27A:
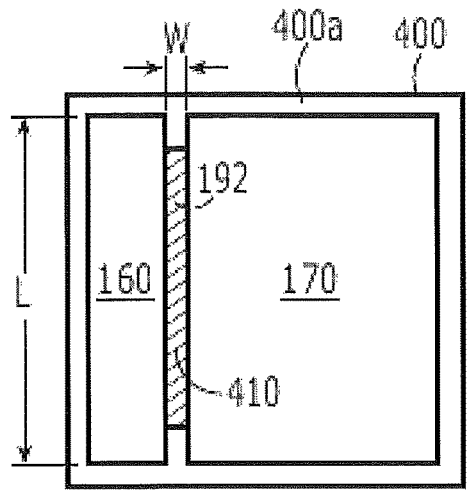
FIG. 27A is a bottom view of an LED of FIG. 23A according to yet other embodiments described herein.
Figure 27B:
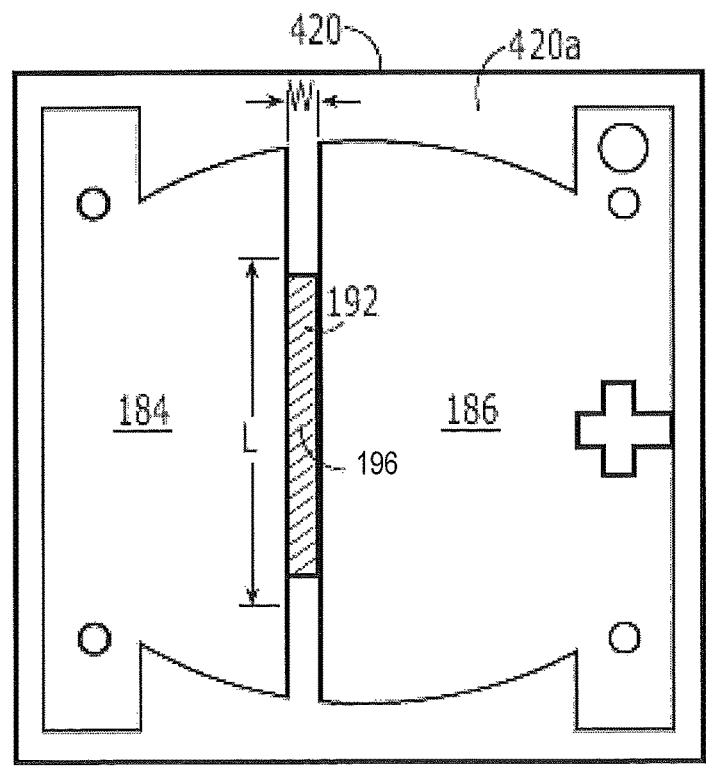
FIG. 27B is a top view of a mounting substrate of FIG. 23A according to yet other embodiments described herein.
Figure 30A:
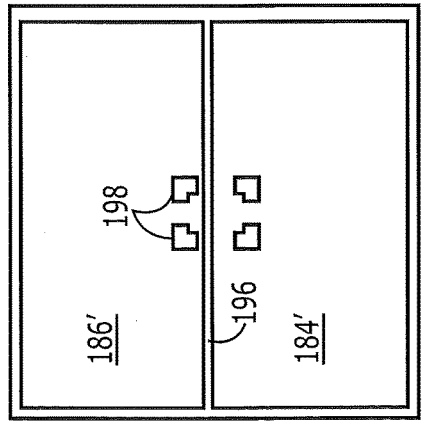
FIGS. 30A-30D are plan views of mounting substrates according to various embodiments described herein.
Figure 30B:
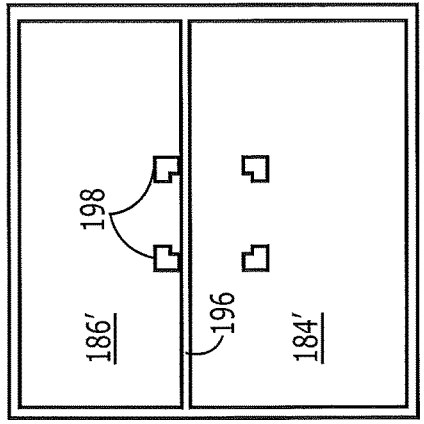
Figure 30C:
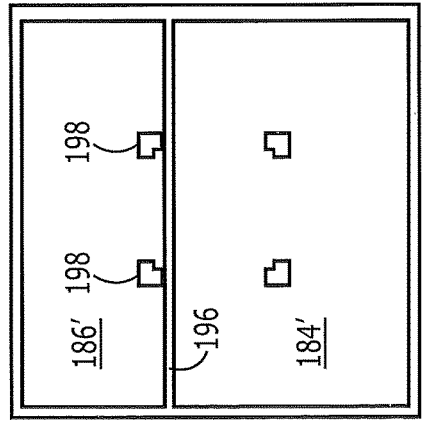
Figure 30D:
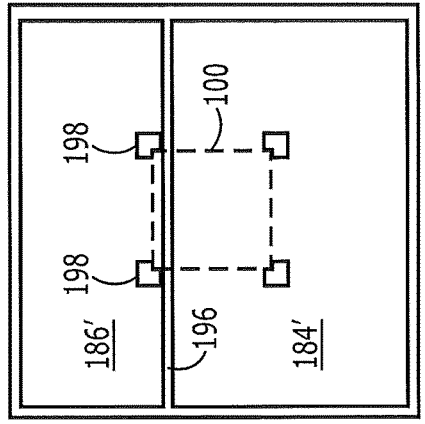

FIGS. 27A and 27B correspond to FIGS. 24A and 24B, but illustrate a filler material 192 in the gap 425 that is different from the encapsulant 430. Filler material may also be provided according to any of the other embodiments described herein. The use of filler material 192 may also be provided as was described in connection with FIGS. 7-20 above. The filler material 192 is electrically insulating and may be reflective in some embodiments. In some embodiments, the filler material may be a light solder mask and/or a low modulus material, such as a silicone gel, etc., and may be loaded with titanium oxide particles in some embodiments. The filler material 192 may partially or fully fill the gap 410.

Many techniques may be used to provide the filler material 192, according to various embodiments described herein. In some embodiments, the filler material 192 may be silicone material having a low expansion rate upon curing. This material may be dispensed in the gap 410 between the anode and cathode contacts 160 and 170, and/or in the gap 196 between the anode and cathode pads 184 and 186. Alternatively, the filler material 192 may be sprayed on the substrate face 420a and/or on the LED die face 400a, and then removed from the contacts 160, 170 and/or 184, 186 using a conventional planarization technique. In still other embodiments, the filler material 192 may be dispensed in the gap 410 through the gap opening(s) after the LED die 400 is flip-chip mounted on the mounting substrate 420, but prior to placement of the lens 190 and encapsulant 430 on the substrate 420. As was described earlier, the thickness of the filler material 193 may be equal to the height H of the gap, or may be equal to or less than the thickness of the contacts 160/170 or 184/186. The filler material 192 also may extend along the entire length L of the gap 410 or only partially along the length L.

In other embodiments, the filler material 192 may comprise white solder mask. The solder mask may be dispensed within the gap 425, as was described above, or may be sprayed on the entire face 400a of the LED die and/or face 420a of the substrate 420, and then removed from the contacts 160/170 and/or 184/186 by planarizing, as was illustrated, for example, in FIGS. 17A/17B and 22A.

In still other embodiments, the filler material 192 may be the same material as the encapsulant 430, but may be cured prior to placing the encapsulant 430 on the substrate 420. More specifically, encapsulant material may be dispensed in gap 425 or coated over the face 410a of the LED die and/or face 420a of the substrate 420 and planarized. The encapsulant may be cured prior to or after planarization. Thus, in these embodiments, the cured encapsulant may act as a filler material 192 to prevent encroachment of uncured encapsulant 430 into the gap during later dispensing of the uncured encapsulant. Accordingly, as used herein, "different material" may include the same material in its uncured and cured states. It will also be understood that various embodiments of filler material may be combined in various combinations and subcombinations, and may be used in various combinations and subcombinations with the geometric configurations that were described above.

Finally, various embodiments have been described above in connection with FIGS. 23-27 that use a single LED. However, multiple LEDs may also be flip-chip mounted on a substrate according to various embodiments described herein, for example as was described in connection with FIGS. 7-22.

Reflective Mounting Substrates for Flip-Chip Mounted Horizontal LEDs

Various embodiments that will now be described can configure a mounting substrate for one or more light emitting diode dies, so as to increase, and in some embodiments to maximize, the reflectivity thereof. LED packages with highly reflective surfaces designed for mounting direct attach LED dies may thereby be provided.

Flip-chip bonded LED packages that do not use wire bonds typically use bump bonding to attach the LED die to the mounting substrate, which may add process complexity and/or reduce thermal conductivity. In contrast, various embodiments described herein can use direct metal attach of the light emitting diode die to the mounting substrate. Some of these embodiments can allow 75% or more, or even 85% or more, of the emitting surface of the LED die to have a direct metal contact to the mounting substrate, which can yield high thermal conductivity.

Various embodiments described herein may also be designed to reduce or minimize any non-reflective surfaces of the mounting substrate, particularly under the lens area. It has been found that LED dies mounted in a flip-chip configuration with sidewall emission can show greater sensitivity to the reflective surfaces of the package, as phosphor is an isotropic emitter. A gap in the electrodes extends under the LED to separate the anode and cathode, with all of the electrode surfaces being highly reflective, in some embodiments. This can allow for packages where substantially all, i.e., more than about 85%, of the exposed surface area is reflective.

Moreover, in some embodiments, the gap may be filled with a suitable underfill material that may also be selected based on reflective properties. The gap in the mounting substrate electrodes is positioned to align with the electrode gap on the LED die, so that when the electrodes on the LED die are aligned and attached to the mounting substrate, the LED die can be substantially centered in the package, in some embodiments. Moreover, the substrate may include one or more fiducial or alignment marks. Phosphor coating on the LED die may also extend onto a portion of and/or all of the exposed surface of the mounting substrate outside the LED die.

Overall package reflectivity, even considering areas outside the lens, can have an impact on the light emitting device performance on the system level, particularly where large numbers of light emitting devices are incorporated into a lighting fixture with an optical diffuser that scatters light back to the mounting substrate.

Various embodiments that were described and illustrated in FIGS. 1-27B provide light emitting devices that include a mounting substrate 180/420, such as a submount, having a reflective layer 194 thereon that defines spaced apart anode and cathode pads 184 and 186, respectively, and a gap 196 therebetween. A light emitting diode die 100 includes spaced apart anode and cathode contacts 160 and 170, respectively, that extend along a face 110a thereof. The light emitting diode die 100 is flip-chip mounted on the mounting substrate 180/420, such that the anode contact 160 is adjacent and conductively bonded to the anode pad 184, and the cathode contact 170 is adjacent and conductively bonded to the cathode pad 186. As also described, in some embodiments, a bonding layer, such as eutectic gold/tin solder layer 188, is used to electrically, thermally and mechanically connect the anode contact 160 to the anode pad 184, and the cathode contact 170 to the cathode pad 186. In other embodiments, direct eutectic attachment of the anode contact 160 to the anode pad 184, and/or direct eutectic attachment of the cathode contact 170 to the cathode pad 186 may be provided, for example using eutectic bonding, flux eutectic bonding and/or other bonding techniques. A lens 190 is also provided that extends from the mounting substrate 180 to surround the light emitting diode die 100.

In some embodiments, as illustrated for example in FIG. 2, the reflective layer 194 extends on the mounting substrate 180 to cover substantially all of the mounting substrate 180 that lies beneath the lens 190, excluding the gap 196.

Moreover, as was described above, a reflective and electrically insulating filler material 192 may be provided in the gap 196. The reflective and electrically insulating filler may comprise a white solder mask, a low modulus material (e.g., a silicone, a gel, etc.) that is loaded with reflective particles, such as titanium oxide particles, etc. As was also described above, in some embodiments, the reflective filler material can completely fill the gap.

Moreover, in still other embodiments that were described above, for example in connection with FIG. 2, a phosphor layer 140' is provided that extends on the reflective layer 194 to cover substantially all of the reflective layer 194 that extends beyond the light emitting diode die 110 and that lies beneath the lens 190. As also shown, the phosphor layer 140' may also cover the light emitting diode die itself.

Various other embodiments of light emitting devices with reflective layers will now be described.

In particular, referring now to FIG. 28, a light emitting device includes a mounting substrate 420, a reflective anode pad 184 and a reflective cathode pad 186 that define a gap 196 therebetween, and a lens 190 that extends on the mounting substrate 420 to surround the light emitting diode die (not shown in FIG. 28, but shown in cross-section in FIGS. 1, 2, 19 and 23A; in perspective view in FIG. 6B; and in plan view in FIGS. 7A, 8A, 9A, 10A, 11B, 12B, 13B, 14A, 14B, 28 and 29). As shown in FIG. 28, the reflective layer 184/186 extends on the mounting substrate 420 to cover substantially all of the mounting substrate 420 that lies beneath the lens 190, excluding the gap 196. For example, in some embodiments, about 85% or more of the mounting substrate that lies beneath the lens, excluding the gap, may be covered by the reflective layer 184/186.

FIG. 28 also includes calculations for an example light emitting device. This example is illustrative, and is not meant to be limiting. As shown by the calculations in FIG. 28, about 76% of the total area of the mounting substrate 420 is reflective, and about 94% of the area under the lens 190 is reflective. Finally, about 94.6% of the area around the LED die ("chip") is reflective. It will be understood that all of the calculations described in FIG. 28 consider the gap 196 to be non-reflective. Adding reflective material to the gap as was described above can increase these percentages.

In some embodiments of FIG. 28, the entire mounting substrate 420, and the LED die mounted thereon, may be covered with phosphor. In other embodiments, the LED die and substantially all of the reflective layer 184/186 that lies beneath the lens 190 may be covered with phosphor. In yet other embodiments, the LED die and substantially all the reflective layer 184/186 (i.e., beneath and beyond the lens 190) may be covered with phosphor. The phosphor may be a conformal or a non-conformal layer and/or may be included in and/or on the lens itself. Stated differently, conformal, spread and/or remote phosphor coating may be used.

FIG. 29 illustrates a light emitting device according to other embodiments, wherein the reflective layer 184', 186' covers substantially the entire surface area of the face of the package 420. Thus, as shown by the calculations in FIG. 29, in these embodiments, about 86% of the total package area is reflective, about 97% of the area under the lens 190 is reflective, and about 97% of the area around the LED die (not shown) is reflective.

Various metals may be used to provide the reflective layer. For example, silver, aluminum and/or gold may be used, with gold being reflective, aluminum being more reflective, and silver being most reflective.

In some embodiments of FIG. 29, the entire face of the mounting substrate 420, including the LED die mounted thereon, may be covered with phosphor. In other embodiments, phosphor may extend on the reflective layer 184', 186' that lies beneath the lens 190 and on the LED die. In still other embodiments, the phosphor may extend on the entire reflective layer 186', 184' by also extending on the portion of the reflective area that is beyond the lens, so as to cover substantially all of the mounting substrate and the LED die. The phosphor may be a conformal or a non-conformal layer and/or may be included in and/or on the lens 190. It will also be understood that the calculations in FIG. 29 consider the gap 196 to be non-reflective. Adding reflective materials to the gap, as was described above, can increase these percentages. Accordingly, FIG. 29 can provide some embodiments wherein substantially all of the face of the mounting substrate is reflective and is covered with phosphor.

FIG. 29 also illustrates the use of one or more fiducials or alignment marks 198 that is configured to facilitate the light emitting diode die being flip-chip mounted on the mounting substrate, such that the anode contact is adjacent and conductively bonded to the anode pad and the cathode pad is adjacent and conductively bonded to the cathode pad. The fiducials may be configured as holes in the reflective layer 186', 184', as elevations in these layers, as additional features on these layers and/or as additional features in the mounting substrate 420. The fiducials 198 may be configured to facilitate optical and/or mechanical alignment processes.

FIGS. 30A-30D illustrate other configurations of fiducials 198. Yet other numbers and configurations of fiducials may be used.

Additional discussion of various die attach methods according to various embodiments described herein will now be provided. In some embodiments, a eutectic die attach may be provided by providing a eutectic die attach material as the outer layer of the anode contact 160 and/or the anode pad 184, and of the cathode contact 170 and/or the cathode pad 186. A eutectic gold/tin solder layer may be used as the eutectic die attach material in some embodiments. In other embodiments, a separate eutectic layer or preform may be provided between the anode contact 160 and the anode pad 184 and/or between the cathode contact 170 and the cathode pad 186.

Figure 31:
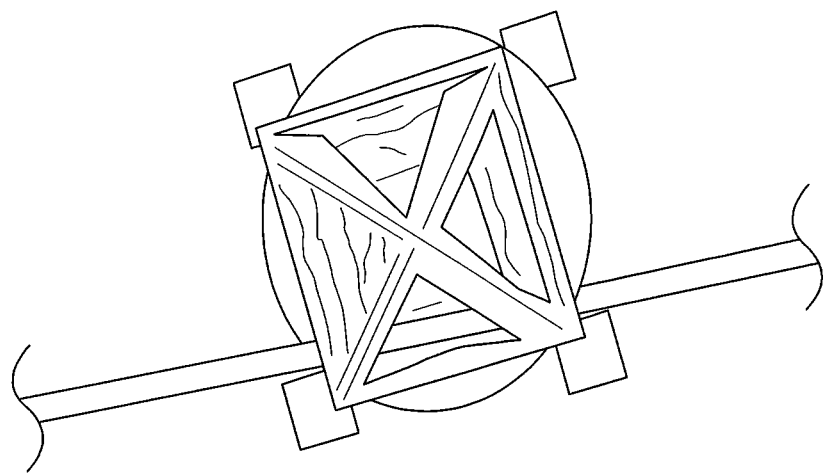
FIG. 31 is a photograph of a eutectic flux attached flip-chip mounted horizontal LED die.

In yet other embodiments, flux may be applied to the surfaces of the pads and/or contacts, to facilitate cleaning prior to die attach. This process may be referred to as a "flux eutectic die attach". In some of these embodiments, a proper amount of flux is dispensed onto the mounting substrate, for example within the center of the four fiducials 198. The LED die is then placed against the substrate such that flux is squeezed out and around the LED die base, but not excessively so. In particular, it has been found that too much flux may cause the LED die to offset/skew in position during the reflow process, as illustrated in FIG. 31. When flux is used, a multi-stage die attach temperature profile may be performed including a preheating zone, a soaking (flux activation) zone, a eutectic gold/tin reflow zone and a cooling zone. The flux residue may then be cleaned using a conventional flux cleaning solution. Accordingly, various embodiments provided herein can provide flux eutectic bonding, wherein the flux does not extend on the mounting substrate substantially beyond the anode and cathode contacts. If too much flux extends on the mounting substrate substantially beyond the anode and cathode contacts, as illustrated in FIG. 31, the LED die can offset or skew its position during the reflow process.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. A light emitting device comprising:
a mounting substrate;
a spaced apart reflective anode pad and reflective cathode pad disposed on the mounting substrate and having a gap therebetween, wherein the gap comprises a first portion, a second portion and a third portion, wherein the first portion and the third portion are parallel to each other and the second portion connects the first portion and the third portion, the second portion not being parallel to the first portion and the third portion; and
wherein the reflective anode pad and the reflective cathode pad make at least 76% of the total package area of the mounting substrate;
a light emitting diode die including spaced apart anode contact and cathode contact that extend along a face thereof, the light emitting diode die being flip-chip mounted on the mounting substrate such that the anode contact is adjacent and conductively bonded to the reflective anode pad and the cathode contact is adjacent and conductively bonded to the reflective cathode pad; and
a lens disposed on the mounting substrate that extends from the mounting substrate to surround the light emitting diode die;
wherein the reflective anode pad and the reflective cathode pad each extends continuously on the mounting substrate from the gap to at least an edge of the lens to together cover substantially all of the mounting substrate that lies beneath the lens, excluding the gap.

2. A light emitting device according to claim 1 further comprising a reflective filler material in the gap.

3. A light emitting device according to claim 1 wherein the reflective anode pad and the reflective cathode pad each extends continuously on the mounting substrate beyond the lens.

4. A light emitting device according to claim 3 wherein the reflective anode pad and the reflective cathode pad each extends continuously to together cover substantially all of the mounting substrate, excluding the gap.

5. A light emitting device according to claim 1 further comprising a phosphor layer that extends on the reflective anode pad and the reflective cathode pad to cover substantially all of the reflective anode pad and the reflective cathode pad that extends beyond the light emitting diode die and that lies beneath the lens.

6. A light emitting device according to claim 5 wherein the phosphor layer also covers the light emitting diode die.

7. A light emitting device according to claim 4 further comprising a phosphor layer that extends on the reflective anode pad and the reflective cathode pad to cover substantially all of the reflective anode pad and the reflective cathode pad.

8. A light emitting device according to claim 7 wherein the phosphor layer also covers the light emitting diode die.

9. A light emitting device according to claim 1 wherein the light emitting diode die is flip-chip mounted on the mounting substrate such that the anode contact is adjacent and eutectically bonded to the reflective anode pad and the cathode contact is adjacent and eutectically bonded to the reflective cathode pad.

10. A light emitting device according to claim 1 wherein the light emitting diode die is flip-chip mounted on the mounting substrate such that the anode contact is adjacent and flux eutectically bonded to the reflective anode pad and the cathode contact is adjacent and flux eutectically bonded to the reflective cathode pad.

11. A light emitting device according to claim 10 wherein the flux does not extend on the mounting substrate substantially beyond the anode contact and the cathode contact.

12. A light emitting device according to claim 1 wherein the mounting substrate also includes a fiducial thereon that is configured to facilitate the light emitting diode die being flip-chip mounted on the mounting substrate such that the anode contact is adjacent and conductively bonded to the reflective anode pad and the cathode contact is adjacent and conductively bonded to the reflective cathode pad.

13. A light emitting diode die according to claim 12 wherein the fiducial comprises a feature in the reflective anode pad and/or the reflective cathode pad.

14. A light emitting device according to claim 1 wherein the reflective anode pad and the reflective cathode pad each extends continuously on the mounting substrate to together cover at least about 85 percent of the mounting substrate, excluding the gap.

15. A light emitting device according to claim 1 wherein the reflective anode pad and the reflective cathode pad comprise a same material.

16. A light emitting device according to claim 15 wherein the same material is silver.

17. A light emitting device according to claim 1 wherein the reflective anode pad and the reflective cathode pad reflect at least 90% of the angle averaged radiation that impinges on the reflective anode pad and the reflective cathode pad from the light emitting diode die.

18. A package for a light emitting device comprising:
a mounting substrate;
a spaced apart reflective anode pad and reflective cathode pad disposed on the mounting substrate and having a gap therebetween, wherein the gap comprises a first portion, a second portion and a third portion wherein the first portion and the third portion are parallel to each other and the second portion connects the first portion and the third portion, the second portion not being parallel to the first portion and the third portion; and wherein the reflective anode pad and the reflective cathode pad make at least 76% of the total package area of the mounting substrate;
the mounting substrate being configured to flip-chip mount thereon a light emitting diode die including spaced apart anode contact and cathode contact that extend along a face thereof, such that the anode contact is adjacent and conductively bonded to the reflective anode pad and the cathode contact is adjacent and conductively bonded to the reflective cathode pad;
the mounting substrate being further configured to mount thereon a lens that extends from the mounting substrate to surround the light emitting diode die;
wherein the reflective anode pad and the reflective cathode pad each extends continuously on the mounting substrate from the gap to at least an edge of the lens to together cover substantially all of the mounting substrate that lies beneath the lens, excluding the gap.

19. A package for a light emitting device according to claim 18 further comprising a reflective filler material in the gap.

20. A package for a light emitting device according to claim 18 wherein the reflective anode pad and the reflective cathode pad each extends continuously on the mounting substrate beyond the lens.

21. A package for a light emitting device according to claim 18 wherein the reflective anode pad and the reflective cathode pad reflect at least 90% of the angle averaged radiation that impinges on the reflective anode pad and the reflective cathode pad from the light emitting diode die.

22. A package for a light emitting device according to claim 18 wherein the reflective anode pad and the reflective cathode pad comprise a same material.

23. A package for a light emitting device according to claim 22 wherein the same material is silver.

* * * * *

UNITED STATES PATENT AND TRADEMARK OFFICE
CERTIFICATE OF CORRECTION

PATENT NO. : 9,673,363 B2
APPLICATION NO. : 13/178791
DATED : June 6, 2017
INVENTOR(S) : Donofrio et al.

It is certified that error appears in the above-identified patent and that said Letters Patent is hereby corrected as shown below:

On the Title Page

(56) References Cited, Other Publications, Page 2, 5$^{th}$ entry, "Cree XLamp®":
Column 2, Line 53: Please correct "/XLamp/Date/%20" to read -- /XLamp/Date%20 --

In the Specification

Column 12, Line 17: Please correct "(751,275 m$^2$+70,875" to read -- (751,275 μm$^2$+70,875 --
    Line 19: Please correct "751,275 m$^2$/" to read -- 751,275 μm$^2$/ --

Column 13, Line 10: Please correct "116,964 μm$^{=2}$" to read -- 116,964 μm$^2$ --

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*